(12) United States Patent
Yamazaki et al.

(10) Patent No.: US 6,380,558 B1
(45) Date of Patent: Apr. 30, 2002

(54) SEMICONDUCTOR DEVICE AND METHOD OF FABRICATING THE SAME

(75) Inventors: Shunpei Yamazaki, Tokyo; Taketomi Asami, Kanagawa; Toru Takayama, Kanagawa; Ritsuko Kawasaki, Kanagawa; Hiroki Adachi, Kanagawa; Naoya Sakamoto, Kanagawa; Masahiko Hayakawa, Kanagawa; Hiroshi Shibata, Kanagawa; Yasuyuki Arai, Kanagawa, all of (JP)

(73) Assignee: Semiconductor Energy Laboratory Co., Ltd. (JP)

( * ) Notice: Subject to any disclaimer, the term of this patent is extended or adjusted under 35 U.S.C. 154(b) by 0 days.

(21) Appl. No.: 09/472,137

(22) Filed: Dec. 23, 1999

(30) Foreign Application Priority Data

Dec. 29, 1998 (JP) .............................. 10-377418
Jan. 14, 1999 (JP) ............................ 11-008494

(51) Int. Cl.⁷ .............................................. H01L 29/04
(52) U.S. Cl. ........................................ 257/57; 257/59
(58) Field of Search .................................... 257/57, 59

(56) References Cited

U.S. PATENT DOCUMENTS

| | | | |
|---|---|---|---|
| 5,247,190 A | 9/1993 | Friend et al. ................. | 257/40 |
| 5,399,502 A | 3/1995 | Friend et al. ................. | 437/1 |
| 5,594,569 A | 1/1997 | Konuma et al. ............ | 349/122 |
| 5,643,826 A | 7/1997 | Ohtani et al. ................. | 437/88 |
| 5,707,746 A * | 1/1998 | Yaoi et al. | |
| 5,747,830 A * | 5/1998 | Okita | |
| 5,923,962 A | 7/1999 | Ohtani et al. ............... | 438/150 |
| 6,271,897 B1 * | 8/2001 | Ichikawa et al. | |

FOREIGN PATENT DOCUMENTS

| | | |
|---|---|---|
| JP | 07-130652 | 5/1995 |
| JP | 7-335900 | 12/1995 |
| JP | 08-078329 | 3/1996 |
| JP | 10-092576 | 4/1998 |
| JP | 10-135468 | 5/1998 |
| JP | 10-135469 | 5/1998 |
| JP | 10-247735 | 9/1998 |
| WO | WO 90/13148 | 11/1990 |

OTHER PUBLICATIONS

Yeh, J.L., et al, "Structural and Optical Properties of Amorphous Silicon Oxynitride," *J. Appl. Phys.*, vol. 79, No. 2, pp. 656–663, Jan. 15, 1996. English abstract re Japanese patent application No. 7–335900, published Dec. 22, 1995.

Inui, S. et al, "Thresholdless Antiferroelectricity in Liquid Crystals and its Application to Displays," *J. Mater. Chem.*, vol. 6, No. 4, pp. 671–673, 1996.

Yoshida, T. et al, "A Full–Color Thresholdless Antiferroelectric LCD Exhibiting Wide Viewing Angle with Fast Response Time," *SID 97 Digest*, pp. 841–844, 1997.

Furue, H. et al, "Characteristics and Driving Scheme of Polymer–Stabilized Monostable FLCD Exhibiting Fast Response Time and High Contrast Ratio with Gray–Scale Capability," *SID 98 Digest*, pp. 782–785, 1998.

(List continued on next page.)

*Primary Examiner*—Stephen D. Meier
(74) *Attorney, Agent, or Firm*—Cook, Alex, McFarron, Manzo, Cummings & Mehler, Ltd.

(57) ABSTRACT

In a semiconductor device including a laminate of a first insulating layer, a crystalline semiconductor layer, and a second insulating layer, characteristics of the device are improved by determining its structure in view of stress balance. In the semiconductor device including an active layer of the crystalline semiconductor layer having tensile stress on a substrate, tensile stress is given to the first insulating layer formed to be in close contact with a surface of the semiconductor layer at a substrate side, and compressive stress is given to the second insulating layer formed to be in close contact with a surface of the semiconductor layer at a side opposite to the substrate side.

35 Claims, 32 Drawing Sheets

OTHER PUBLICATIONS

Terada et al, "Half–V Switching Mode FLCD," *Proceedings of the 46th Applied Physics Association Lectures*, 28p–V–8, p. 1316, Mar., 1999.

Schenk, H. et al, "Polymers for Light Emitting Diodes," *EURODISPLAY '99, Proceedings of the 19th International Display Research Conference*, Berlin, Germany, Sep. 6–9, 1999, pp. 33–37.

Yoshihara, T. et al, "Time Division Full Color LCD by Ferroelectric Liquid Crystal," *EKISHO*, vol. 3, No. 3, pp. 190–194, 1999.

English Abstract re JP 7–130652, published May 19, 1995.

English Abstract re JP 8–078329, published Mar. 22, 1996.

English Abstract re JP 10–092576, published Apr. 10, 1998.

English Abstract re JP 10–135468, published May 22, 1998.

English Abstract re JP 10–135469, published May 22, 1998.

English Abstract re JP 10–247735, published Sep. 14, 1998.

* cited by examiner

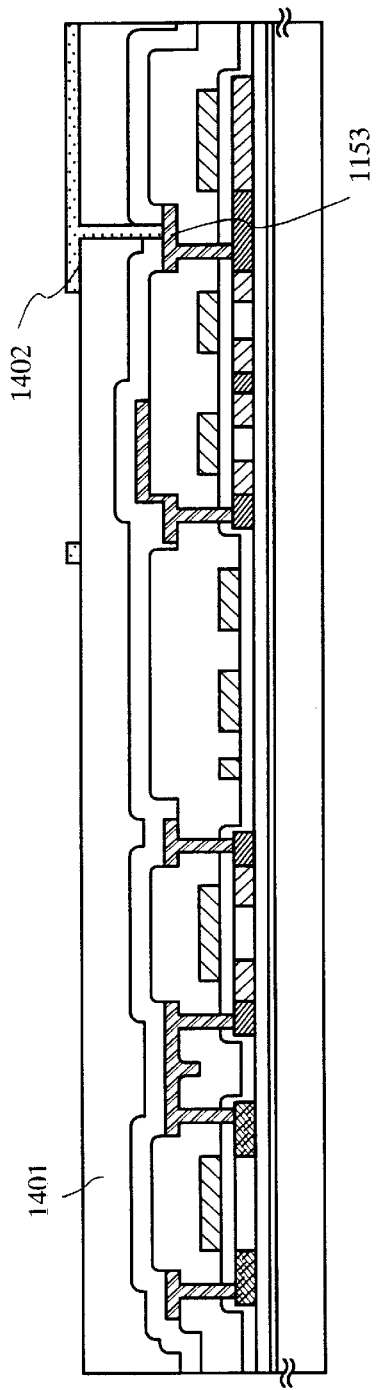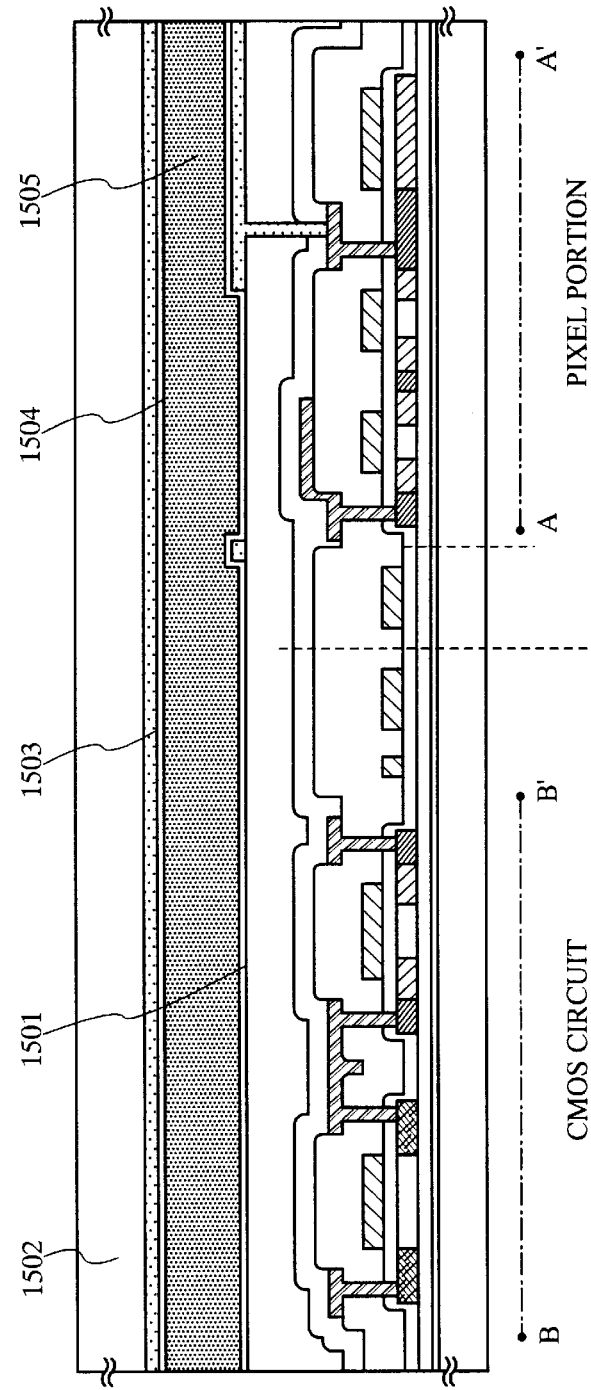
FIG. 14A
FIG. 14B

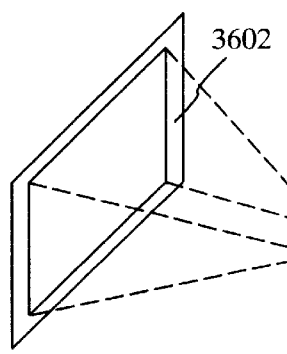
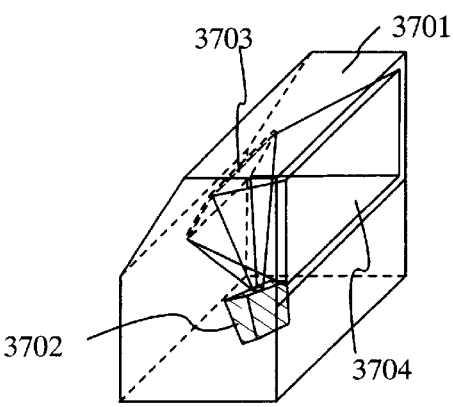
FIG. 33A
FIG. 33B
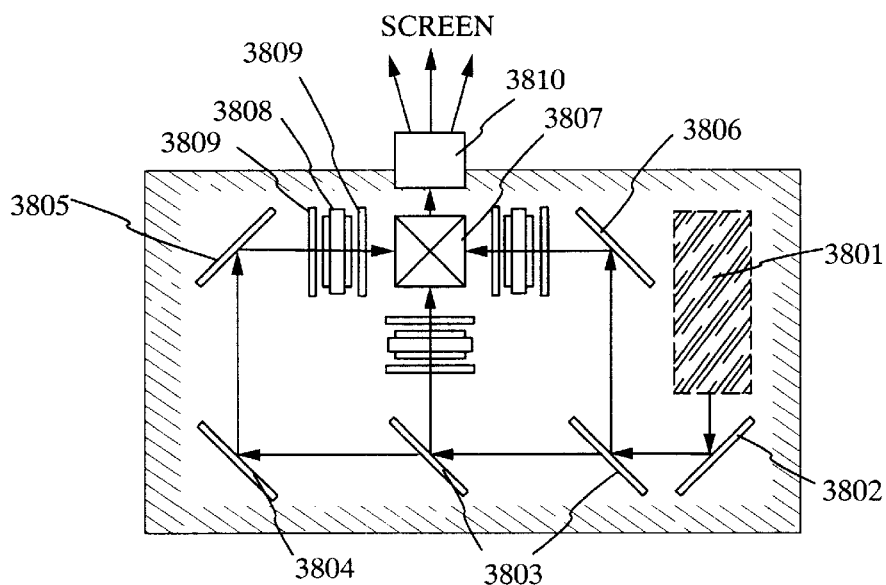
FIG. 33C
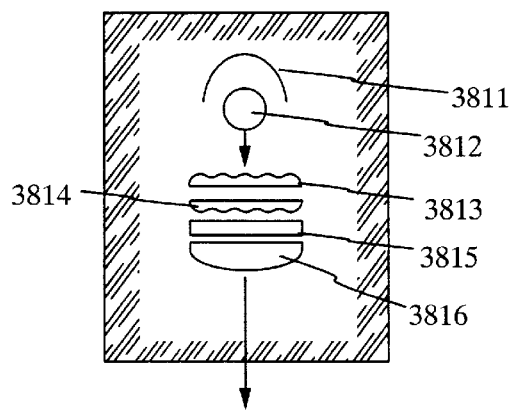
FIG. 33D

SEMICONDUCTOR DEVICE AND METHOD OF FABRICATING THE SAME

BACKGROUND OF THE INVENTION

1. Field of the Invention

The present invention relates to a semiconductor device including an integrated circuit using thin film transistors on a substrate and a method of fabricating the same. Particularly the invention relates to a structure of, for example, an electro-optical device typified by a liquid crystal display device and an electronic equipment incorporating the electro-optical device.

2. Description of the Related Art

Development has been made on a semiconductor device typified by an active matrix type liquid crystal display device in which a number of TFTs (thin film transistors) are arranged on a substrate. The TFT has a laminate structure including at least an active layer made of an island-like semiconductor film, a first insulating layer provided at a substrate side of the active layer, and a second insulating layer provided at a side opposite to the substrate side of the active layer. Alternatively, the TFT has a laminate structure including an active layer and a second insulating layer provided to be in close contact with a surface of the active layer at a side opposite to a substrate side thereof, in which the first insulating layer is omitted.

The structure in which a gate electrode is provided so as to apply a predetermined voltage to the active layer through the first insulating layer is called an inverted stagger type or a bottom gate type. On the other hand, the structure in which a gate electrode is provided so as to apply a predetermined voltage to the active layer through the second insulating layer is called a forward stagger type or top gate type.

It has been considered that a crystalline semiconductor capable of obtaining high mobility in addition to an amorphous semiconductor is suitable for a semiconductor film used for a TFT. Here, the crystalline semiconductor includes a single crystal semiconductor, a polycrystal semiconductor, and a microcrystal semiconductor. The insulating layer is typically formed of a material such as silicon oxide, silicon nitride, or silicon nitride oxide.

It is known, as the semiconductor film above, a semiconductor disclosed in Japanese Patent Application Laid Open No. Hei. 7-130652, No. Hei. 8-78329, No. Hei. 10-135468, or No. Hei. 10-135469.

It has been known that a thin film of the above material fabricated by a well-known film forming technique, such as a CVD (Chemical Vapor Deposition), a sputtering method, and a vacuum evaporation method, includes internal stress. The internal stress has been classified into intrinsic stress which the thin film intrinsically has, and thermal stress due to a difference in thermal expansion coefficient between the thin film and the substrate. It has been possible to neglect the thermal stress by controlling the thermal expansion coefficient of the substrate and process temperature of fabricating steps of the TFT. However, the generation mechanism of the intrinsic stress has not been necessarily clarified, and it has been considered that the intrinsic stress is generated by a complicated combination of a phase change and composition change of the thin film during a growth process thereof, by heat treatment thereafter, and the like.

In general, as shown in FIG. 3A, when a thin film is contracted with respect to a substrate, the substrate is deformed by the influence while the thin film is located inside. Thus, the internal stress is called tensile stress. On the other hand, as shown in FIG. 3B, when the thin film is expanded, the substrate is compressed and is deformed while the thin film is located outside. Thus, the internal stress is called compressive stress. Like this, the definition of the internal stress has been considered while the substrate is made the center. Also in this specification, the internal stress is set forth in accordance with this definition.

It has been known that volume contraction occurs during a process of crystallization in a crystalline semiconductor film fabricated from an amorphous semiconductor film by a thermal annealing method or a laser annealing method. Although depending on the state of the amorphous semiconductor film, it has been considered that the rate is about 0.1 to 10%. As a result, there has been a case where the tensile stress is generated in the crystalline semiconductor film and its intensity becomes about $1 \times 10^9$ Pa. Besides, it has been known that the internal stress of an insulating film, such as a silicon oxide film, a silicon nitride film, or a silicon nitride oxide film, is variously changed from the compressive stress to the tensile stress by fabricating conditions and subsequent heat treatment conditions.

In the technical field of a VLSI, a problem of stress has been pointed out as one of causes of a poor device. With the improvement in integration, it has inevitably become impossible to neglect an influence of local stress. For example, it has been considered that a heavy metal impurity is captured in a region where the stress is concentrated so that various poor modes are caused, or dislocation generated to relieve the stress is also a factor to deteriorate the characteristics of a device.

However, with respect to a TFT formed by laminating a plurality of thin films, such as a semiconductor film and an insulating film, an influence caused by the interaction between the respective internal stresses of the thin films has not been sufficiently clarified.

Although there are some characteristic parameters expressing TFT characteristics, an electric field mobility is regarded as one standard indicating the level of performance. In order to realize a high field effect mobility, the structure of a TFT and its fabricating process have been carefully studied in view of theoretical analysis and empirical side. As especially important factors, it has been considered that it is necessary to decrease a bulk defect density in a semiconductor layer and an interface level density at an interface between a semiconductor layer and an insulating layer to the utmost degree.

In order to decrease the bulk defect density and interface defect density formed in a crystalline semiconductor layer, the present inventor has considered it to be a problem that the defect density is decreased while internal stresses of respective thin films are taken into consideration and a stress balance is taken, in addition to optimization of fabricating conditions of a TFT.

SUMMARY OF THE INVENTION

An object of the present invention is to solve the foregoing problem and to realize a TFT in which bulk defect density and interface defect density are decreased while distortion is not generated in a crystalline semiconductor layer.

As described in the Background of the Invention section, tensile stress is inherent in a crystalline semiconductor film fabricated from an amorphous semiconductor film. In a TFT including an active layer of such a crystalline semiconductor film, it has been necessary to consider a stress balance in order to laminate a gate insulating film, other insulating films and conductive films without generating distortion to the crystalline semiconductor film.

The stress balance to be considered here is not such that composed stress is made zero by compensating the internal stresses of the laminated thin films, but such that the thin films having inherent internal stresses are laminated, with the crystalline semiconductor film including tensile stress as the center, in such a direction that distortion does not occur in the crystalline semiconductor film.

FIGS. 4A and 4B are views for explaining the concept of the present invention. With respect to a crystalline semiconductor film having tensile stress, the present inventor has considered to be desirable that a thin film provided at a substrate side of the crystalline semiconductor film has tensile stress (FIG. 4B). On the other hand, the present inventor has considered to be desirable that a thin film provided on a surface of the crystalline semiconductor film at a side opposite to the substrate side has compressive stress (FIG. 4A). In all events, when the crystalline semiconductor film is contracted, if a stress acts in a direction to expand this, it is expected that distortion occurs in crystal grain boundaries and micro cracks are formed. In such a case, dislocations and crystal defects are produced in the region, and a number of unpaired bonds are formed. Thus, when the thin film provided at the substrate side of the crystalline semiconductor film is made to have the tensile stress, the stress can be given in the same direction as the direction in which the crystalline semiconductor layer is contracted. On the contrary, when the thin film provided at the side opposite to the substrate side with respect to the crystalline semiconductor film is made to have the compressive stress, the stress can be given in the same direction as the direction in which the crystalline semiconductor layer is contracted. That is, when such a structure is adopted that stress is given from other thin films in the direction to contract the crystalline semiconductor film, the defect density can be effectively decreased.

For the purpose of controlling the internal stress of the thin film, it was sufficient if fabricating conditions and subsequent heat treatment conditions were considered. For example, in a silicon nitride oxide film fabricated by a plasma CVD method, it was possible to change the stress from the compressive stress to the tensile stress by changing the composition ratio of nitrogen and oxygen or the hydrogen content. In a silicon nitride film fabricated by a plasma CVD method, it was possible to change the intensity of the internal stress by changing a film deposition rate.

Further, the important point in consideration of the stress balance was temperature control in all fabricating steps of a TFT. In a thin film fabricated by a plasma CVD method or a sputtering method, even if the film had a predetermined internal stress in the initial state, there was a case where the stress was changed to quite the opposite direction internal stress by a substrate heating temperature in a subsequent step. On the contrary, it was also possible to change the internal stress by using this property. For example, when a heat treatment at a temperature of 300° C. or more was applied to a silicon nitride film having compressive stress, it was also possible to change the stress to tensile stress.

When a gate electrode was provided to apply a predetermined voltage through a first insulating layer provided at a substrate side of an active layer made of an island-like semiconductor film formed on a substrate, it was possible to form an inverted stagger type or bottom gate type TFT. When a gate electrode is provided to apply a predetermined voltage to an active layer through a second insulating layer provided at a side opposite to a substrate side of the active layer, it was possible to form a forward stagger type or top gate type TFT.

Although a material of an insulating film used for the first insulating layer or the second insulating layer was not particularly limited, it was necessary to be able to control the internal stress in some way. For that purpose, a silicon nitride film, a silicon nitride oxide film, a silicon oxide film, a tantalum oxide film, and the like were suitable. Although a method of fabricating the silicon nitride film is not limited, for example, in the case where the film is formed by a plasma CVD method, the film can be formed from a mixture gas of $SiH_4$, $NH_3$, $N_2$, and $H_2$. By changing a mixture ratio of the gas and discharge power density, it was possible to fabricate the silicon nitride film under conditions of different film formation rates. As a measuring device of the internal stress, Model-30114 made by Ionic System Inc. was used. A sample fabricated on a silicon wafer was used for measurement.

With respect to values of the internal stress, it is assume that the tensile stress is indicated by a positive value and the compressive stress is indicated by a negative value so that distinction can be made. According to data of FIG. 17, although any of silicon nitride films fabricated at a substrate temperature of 400° C. and at different film deposition rates had compressive stress, when a heat treatment at 500° C. for 1 hour was applied, it was possible to change the compressive stress to the tensile stress. Such change was realized when a heat treatment at a temperature higher than a substrate temperature at film formation was carried out, and it was considered that densification of the silicon nitride film was the cause. Thus, it was possible to fabricate both of a film having the compressive stress and a film having the tensile stress for the silicon nitride film.

A silicon nitride oxide film was fabricated from a mixture gas of $SiH_4$ and $N_2O$ using a plasma CVD method. Also in this case, it was possible to fabricate the silicon nitride oxide film by changing the mixture ratio of gas or discharge power density to make film deposition rate different. FIG. 18 shows values of the internal stress of the silicon nitride oxide films fabricated at a substrate temperature of 400° C. Any of respective samples with different film deposition rates had compressive stress. Even if a heat treatment at 450° C. for 4 hours was further applied, the state was unchanged though the absolute value of the compressive stress became small.

Although FIG. 19 similarly shows data of internal stress of silicon nitride oxide films, this drawing shows data of silicon nitride oxide films fabricated by further mixing $NH_3$ to $SiH_4$ and $N_2O$. When the $NH_3$ gas was added at film formation, the characteristic was changed from the compressive stress to the side of the tensile stress. Further, when a heat treatment at 550° C. for 4 hours was applied to the samples, it was possible to increase the tensile stress. The change like this corresponded to the change of composition ratio of a nitrogen content and an oxygen content in the silicon nitride oxide film. Table 1 shows the result of measurement of the content of each element in the silicon nitride oxide film measured by Rutherford backscattering method (RBS).

TABLE 1

| | CONDITIONS | CONTENTS (atomic %) | | | |
| --- | --- | --- | --- | --- | --- |
| | | H | N | O | Si |
| SAMPLE 1 | $NH_3$ = 0 SCCM | 1.5 | 7.0 | 59.5 | 32.0 |
| SAMPLE 2 | $NH_3$ = 30 SCCM | 16.5 | 24.0 | 26.5 | 33.0 |
| SAMPLE 3 | $NH_3$ = 100 SCCM | 15.5 | 44.1 | 6.0 | 34.4 |

When the nitrogen content and the oxygen content in a silicon nitride oxide film were 7 atomic % and 59.5 atomic %, respectively, it was possible to make the nitrogen content and the oxygen content 24.0 atomic % and 26.5 atomic %, respectively, by adding the $NH_3$ gas of 30 SCCM at film formation. Besides, it was possible to make the nitrogen content and the oxygen content 44.1 atomic % and 6.0 atomic %, respectively, by adding the $NH_3$ gas of 100 SCCM. That is, by adding the $NH_3$ gas, it was possible to increase the nitrogen content in the silicon nitride oxide film and to decrease the oxygen content. At this time, it was possible to change the compressive stress to the tensile stress. When the composition of various silicon nitride oxide films obtained by adding the $NH_3$ gas were investigated, in any film, the composition was such that the silicon content was about 34 atomic %, the hydrogen content was about 16 atomic %, and the sum of nitrogen and oxygen content was about 50 atomic %. The films having the nitrogen content of not less than 25 atomic % and less than 50 atomic % obviously exhibited the tensile stress, and the films having the nitrogen content of not less than 5 atomic % and less than 25 atomic % exhibited the compressive stress. It was possible to consider the change of the internal stress by heat treatment while relating it to the change of the hydrogen content in the film as shown in FIG. 20. The data of FIG. 20 show the result of measurement by FT-IR to the hydrogen content in the silicon nitride oxide films fabricated by adding the $NH_3$ gas. By a heat treatment at 500° C. for 1 hour, hydrogen bonded with silicon is first released. This tendency becomes remarkable as the substrate temperature (see Tsub expressed at the upper right of each graph of FIG. 20) at film formation becomes low. It is expected that when hydrogen bonded with silicon is released, unpaired bonds are produced, and the tensile stress is strengthened by the interaction (attractive force) of the unpaired bonds. Like this, it was also possible to change the internal stress by decreasing the hydrogen content in the film.

Like this, by controlling the film formation rate, by applying the heat treatment at a temperature higher than a substrate temperature of film formation, or by controlling film formation conditions, it was possible to control the internal stress. As is well known, a TFT is completed by repeating thin film formation and an etching process, and the important point here was the control of process temperature over all the fabricating steps. It was sufficient if the highest temperature of the process was determined in view of the internal stresses of thin films to be laminated.

A semiconductor device of the present invention comprises an active layer of an island-like semiconductor film formed over a substrate; a first insulating layer provided at a substrate side of the active layer and including a first silicon nitride oxide film having a nitrogen content higher than an oxygen content and a second silicon nitride oxide film having a nitrogen content lower than an oxygen content; and a second insulating layer provided to be in contact with a surface of the active layer at a side opposite to the substrate side and including a plurality of third silicon nitride oxide films each having a nitrogen content lower than an oxygen content.

In the semiconductor device of the present invention, the active layer has tensile stress, the first silicon nitride oxide film of the first insulating layer in which the nitrogen content is higher than the oxygen content has tensile stress, and each of the plurality of third silicon nitride oxide films of the second insulating layer in which the nitrogen content is lower than the oxygen content has compressive stress. It is desirable that a difference in absolute values of the tensile stresses between the first insulating layer and the semiconductor layer, or a difference in absolute values between the compressive stress of the second insulating layer and the tensile stress of the semiconductor layer is within $5 \times 10^8$ Pa.

Besides, in the semiconductor device of the present invention, the nitrogen content of the first silicon nitride oxide film in which the nitrogen content is higher than the oxygen content is not less than 25 atomic % and less than 50 atomic %, and the nitrogen content of each of the plurality of third silicon nitride oxide films in which the nitrogen content is lower than the oxygen content is not less than 5 atomic % and less than 25 atomic %.

BRIEF DESCRIPTION OF THE DRAWINGS

FIGS. 14A and 14B are sectional views of an active matrix type liquid crystal display device of Embodiment 5.

FIGS. 33A to 33D are views showing examples of semiconductor devices of Embodiment 7.

DETAILED DESCRIPTION OF THE INVENTION

Embodiment Mode 1

Figure 1A:
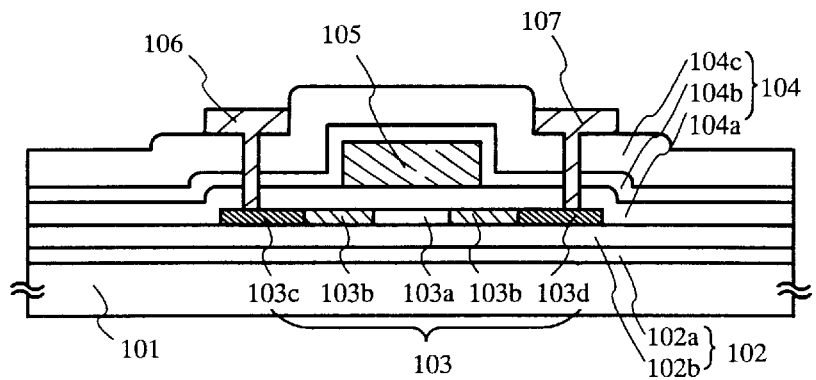
FIGS. 1A to 1C are sectional views of TFTs of Embodiment Mode 1.
Figure 1B:
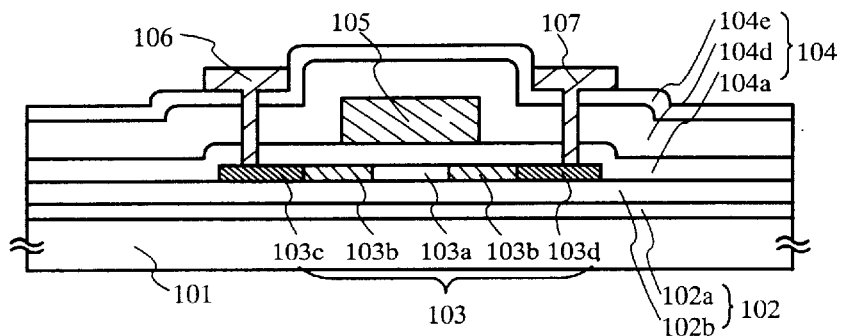
Figure 1C:
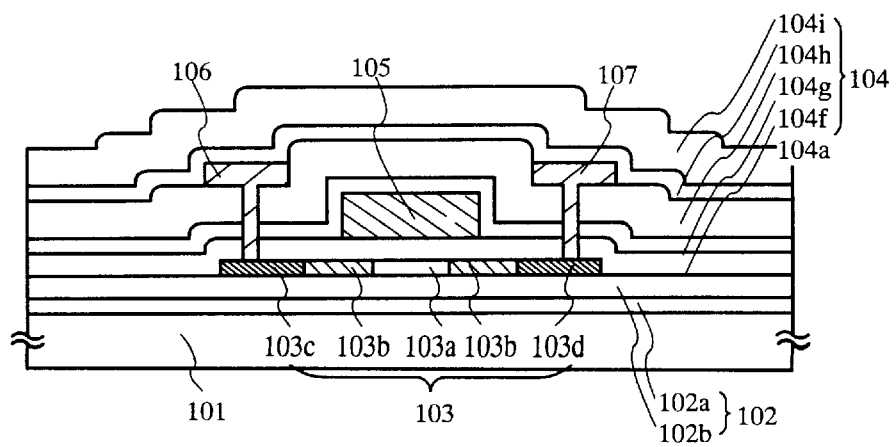

A first embodiment mode for carrying out the invention will be described with reference to FIGS. 1A to 1C. In FIGS. 1A to 1C, a first insulating layer 102 is formed on a substrate 101 having an insulating surface. The first insulating layer 102 is formed of a nitrogen-rich silicon nitride oxide film 102a having a nitrogen content of not less than 25 atomic % and less than 50 atomic % and a silicon nitride oxide film 102b having a nitrogen content of not less than 5 atomic % and less than 25 atomic % in this order from the substrate. The nitrogen-rich silicon nitride oxide film 102a has a tensile stress of $5\times10^8$ Pa to $2\times10^9$ Pa. The silicon nitride oxide film 102b is a film having a compressive stress of not higher than $-5\times10^8$ Pa, and is provided between the nitrogen-rich silicon nitride oxide film 102a and an active layer 103 so as to slightly relieve the action of stress.

The active layer 103 is a crystalline semiconductor film fabricated from an amorphous semiconductor film by a method such as a laser annealing method or a thermal annealing method, and has inevitably tensile stress without limitations to a particular fabricating method. As the need arises, a channel formation region 103a, LDD regions 103b, a source region 103c, and a drain region 103d are provided. Contact holes are provided in part of a second insulating layer 104 so that a source electrode 106 and a drain electrode 107 are provided.

Although a second insulating layer 104 is laminated on the active layer 103, in the case of top gate type TFTs as shown in FIGS. 1A to 1C, a gate insulating film 104a is first provided, which is formed of a silicon nitride oxide film having a nitrogen content of not less than 5 atomic % and less than 25 atomic %. A gate electrode is provided thereon at a predetermined position.

In FIG. 1A, a silicon nitride film 104b and a silicon oxide film 104c are formed thereon. The silicon nitride film 104b was formed while controlling the film formation rate, so that the compressive stress was given. The compressive stress of this film 104b was within the range of $-2\times10^8$ to $1\times10^9$ Pa.

FIG. 1B shows a structure in which a silicon oxide film 104d and a silicon nitride film 104e are formed on the gate insulating film 104a. The silicon oxide film 104d has a stress of $5\times10^9$ Pa or less, and compressive stress may be applied by the silicon nitride film 104e formed thereon.

FIG. 1C shows a structure in which a silicon nitride film 104f, a silicon oxide film 104g, a silicon nitride film 104h, and a silicon nitride oxide film 104i are formed on the gate insulating film 104a. The silicon nitride films 104f and 104h, and the silicon nitride oxide film 104i having a nitrogen content of not less than 5 atomic % and less than 25 atomic % have compressive stress. By providing the films having the compressive stress on the source electrode 106 and the drain electrode 107, it was possible to more effectively give the stress to the active layer 103.

Embodiment Mode 2

A second embodiment mode for carrying out the invention will be described with reference to FIGS. 2A to 2D. In FIGS. 2A to 2D, a first insulating layer 202 is formed on a substrate 201 having an insulating surface. Similarly to Embodiment Mode 1, a nitrogen-rich silicon nitride oxide film 202a having a nitrogen content of not less than 25 atomic % and less than 50 atomic %, and a silicon nitride oxide film 202b having a nitrogen content of not less than 5 atomic % and less than 25 atomic % are provided. The nitrogen-rich silicon nitride oxide film 202a has tensile stress. An active layer 203 is a crystalline semiconductor film fabricated from an amorphous semiconductor film by a method such as a laser annealing method or a thermal annealing method, and as the need arises, a channel formation region 203a, LDD regions 203b, a source region 203c, and a drain region 203d are provided. Contact holes are provided in part of a second insulating layer 204 so that a source electrode 206 and a drain electrode 207 are provided. Although the second insulating layer 204 is laminated on the active layer 203, in the case of top gate type TFTs as shown in FIGS. 2A to 2D, a gate insulating film 204a is first provided, which is formed of a silicon nitride oxide film having a nitrogen content of not less than 5 atomic % and less than 25 atomic %. A gate electrode is provided thereon at a predetermined position.

Figure 2A:
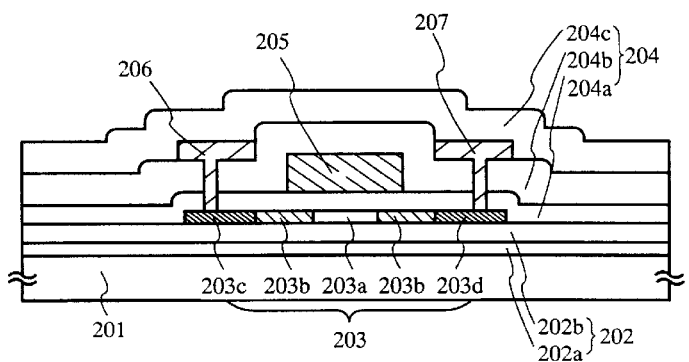
FIGS. 2A to 2D are sectional views of TFTs of Embodiment Mode 2.

FIG. 2A shows a structure in which a silicon oxide film 204b and a silicon nitride oxide film 204c are formed on the gate insulating film 204a. The nitrogen content of the silicon nitride oxide film 204c was made not less than 5 atomic % and less than 25 atomic %, so that compressive stress was generated. Thus, such a structure is made that the stress is applied to the active layer 203 from the nitrogen-rich silicon nitride oxide film 202a and the silicon nitride oxide film 204c. Here, the film having the compressive stress was provided on the source electrode 206 and the drain electrode 207, so that it was possible to more effectively give the stress to the active layer 203.

Figure 2B:
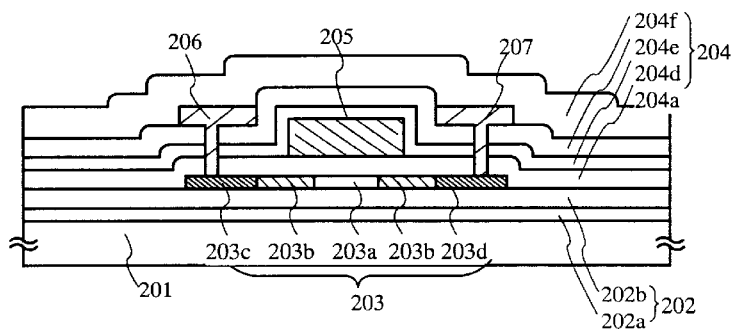

FIG. 2B shows a structure in which a silicon nitride oxide film 204d, a silicon oxide film 204e, and a silicon nitride oxide film 204f are provided on the gate insulating film 204a. Then, such a structure is made that stress is applied to the active layer 203 from the nitrogen-rich silicon nitride oxide film 202a and the silicon nitride oxide films 204d and 204f.

Figure 2C:
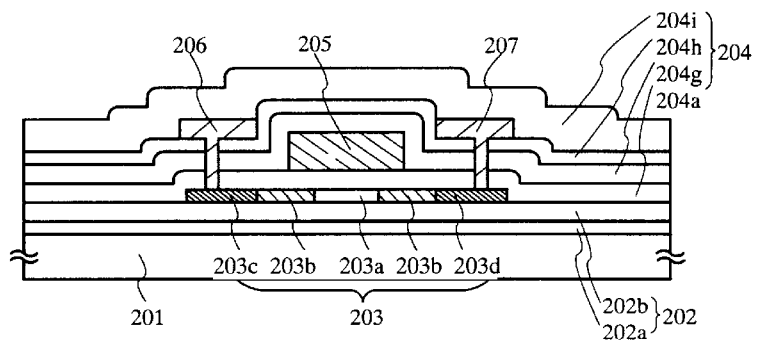
Figure 2D:
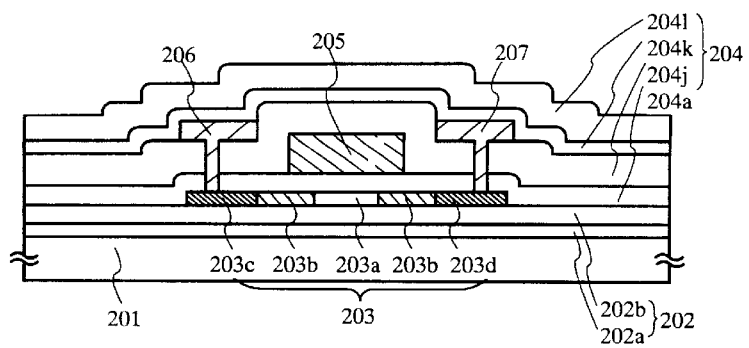
Figure 3A:
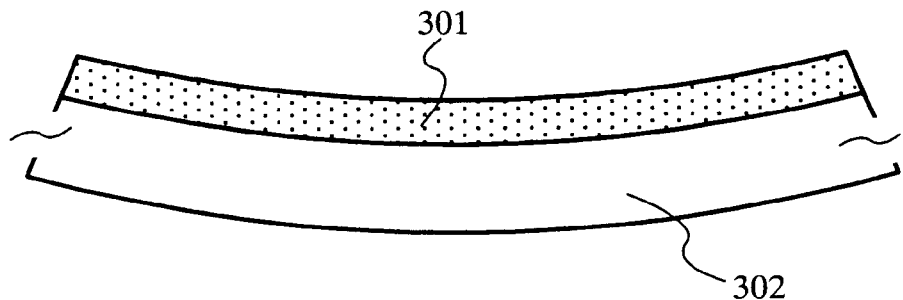
FIGS. 3A and 3B are views for explaining the definition of internal stress of a conventional thin film.
Figure 3B:
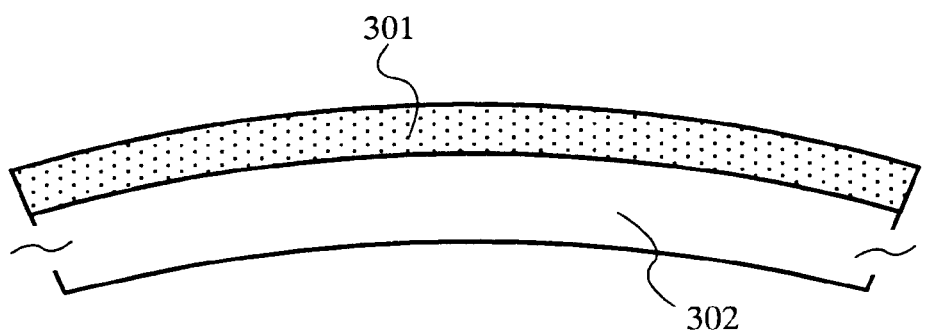
Figure 4A:
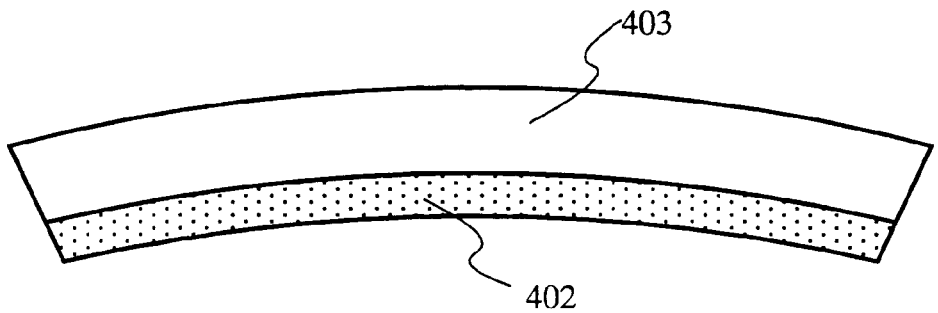
FIGS. 4A and 4B are views for explaining the concept of a stress balance of the present invention.
Figure 4B:
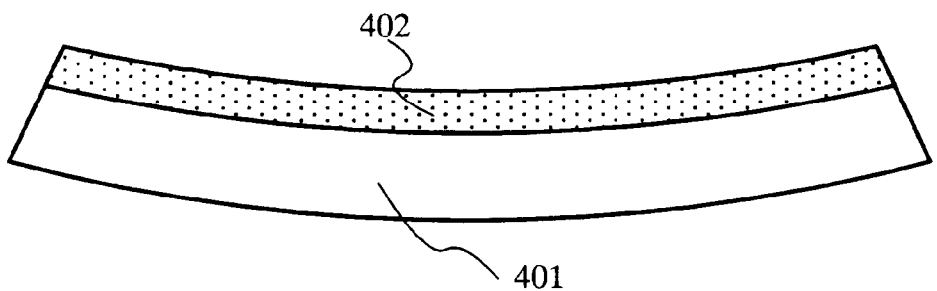

FIG. 2C shows a structure in which a silicon oxide film 204g, a silicon nitride oxide film 204h having compressive stress, and a silicon nitride oxide film 204i are provided on the gate insulating film 204a. FIG. 2D shows a structure in which a silicon oxide film 204j, a silicon nitride oxide film 204k, and a silicon nitride oxide film 204l are provided.

In order to change the internal stress from the tensile stress to the compressive stress by controlling the composition ratio of the nitrogen content and the oxygen content of the silicon nitride oxide film, it was sufficient if the mixture ratio of gases of $SiH_4$, $N_2O$, and $NH_3$ used for film formation was changed, which was easily performed. In the case where the silicon nitride oxide film having an internal stress of $5 \times 10^8$ Pa or more in absolute value was provided, it was appropriate that the film was not formed to be in contact with the active layer 203, but was provided through a film having a low stress, such as a silicon oxide film.

Embodiment 1

Figure 5A:
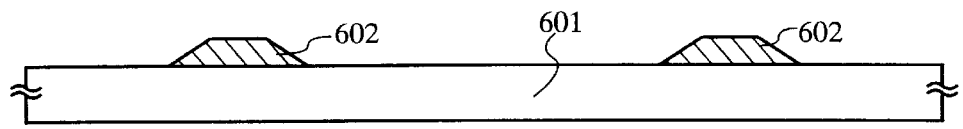
FIGS. 5A to 5E are sectional views showing fabricating steps of a TFT of Embodiment 1.

This embodiment will be described with reference to FIGS. 5A to 7D as an example of a bottom gate type TFT. First, a glass substrate, for example, a #1737 substrate of Corning Inc. was prepared as a substrate 601. A gate electrode 602 was formed on the substrate 601. Here, a tantalum (Ta) film was formed to a thickness of 200 nm by using a sputtering method. The gate electrode 602 may be a two-layer structure of a tantalum nitride film (film thickness of 50 nm) and a Ta film (film thickness of 250 nm). The Ta film was formed by a sputtering method using an Ar gas while Ta was used as a target, and when sputtering was made with a mixture gas of the Ar gas added with a Xe gas, it was possible to make an absolute value of an internal stress $2 \times 10^8$ Pa or less (FIG. 5A).

Figure 5B:
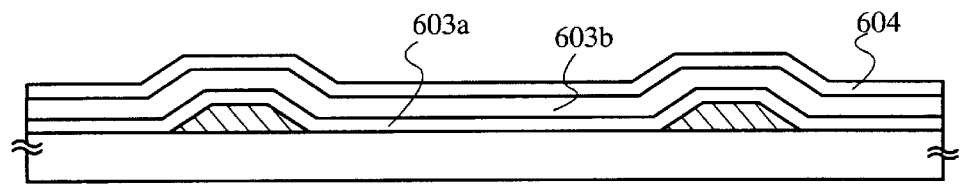

Then, a first insulating layer 603 and an amorphous semiconductor layer 604 were continuously formed without opening to the air. The first insulating layer 603 was formed of a nitrogen-rich silicon nitride oxide film 603a (film thickness of 50 nm) and a silicon nitride oxide film 603b (film thickness of 125 nm). The nitrogen-rich silicon nitride oxide film 603a was formed by plasma CVD method from a mixture gas of $SiH_4$, $N_2O$ and $NH_3$. The amorphous semiconductor layer 604 was also formed to a thickness of 20 to 100 nm, preferably 40 to 75 nm by using the plasma CVD method (FIG. 5B).

Figure 5C:
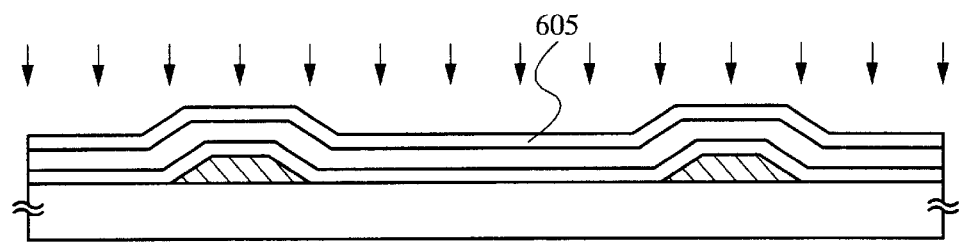

Then, a heat treatment at 450 to 550° C. for 1 hour was carried out. By this heat treatment, hydrogen was released from the first insulating layer 603 and the amorphous semiconductor layer 604, so that it was possible to give tensile stress. Thereafter, a crystallizing step was carried out for the amorphous semiconductor layer 604, so that a crystalline semiconductor layer 605 was formed. In the crystallizing step here, a laser annealing method or a thermal annealing method may be used. In the laser annealing method, for example, KrF excimer laser light (wavelength 248 nm) was used, a linear beam was formed, and crystallization of the amorphous semiconductor layer was carried out under the conditions that an oscillation pulse frequency was 30 Hz, a laser energy density was 100 to 500 mJ/cm$^2$, and an overlap rate of the linear beam was 96%. Here, as the amorphous semiconductor layer was crystallized, volume shrinkage occurred, and the tensile stress of the formed crystalline semiconductor layer was increased (FIG. 5C).

Figure 5D:
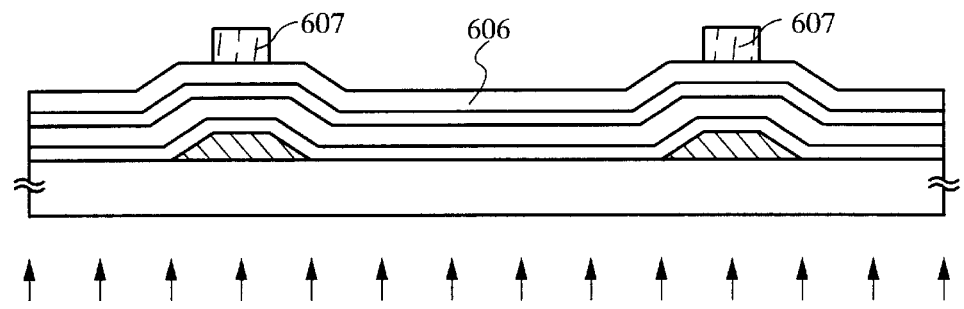

Next, an insulating film 606 was formed to be in contact with the thus formed crystalline semiconductor layer 605. Here, a silicon nitride oxide film was formed to a thickness of 200 nm. Thereafter, by a patterning method using exposure from a rear surface, a resist mask 607 was formed to be in contact with the insulating film 606. Here, the gate electrode 602 became a mask, so that the resist mask 607 was formed in a self-aligning manner. As shown in the drawing, the size of the resist mask became slightly smaller than the width of the gate electrode since light went around (FIG. 5D).

Figure 5E:
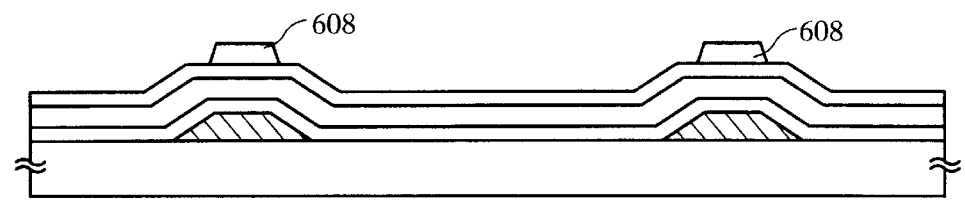

The insulating film 606 was etched by using the resist mask 607, and after a channel protecting film 608 was formed, the resist mask 607 was removed. By this step, the surface of the crystalline semiconductor layer 605 except a region being in contact with the channel protecting film 608 was exposed. This channel protecting film 608 functioned to prevent addition of an impurity into a channel region in a subsequent impurity addition step (FIG. 5E).

Figure 6A:
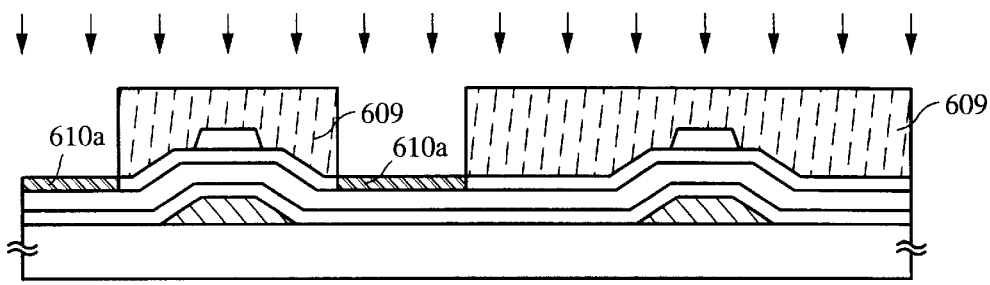
FIGS. 6A to 6D are sectional views showing fabricating steps of the TFT of Embodiment 1.

Next, a resist mask 609 covering a part of an n-channel TFT and a p-channel TFT was formed by patterning using a photomask, and a step of adding an impurity element to give an n-type was carried out to the region where the surface of the crystalline semiconductor layer 605 was exposed. Then, a first impurity region (n$^+$-type region) 610a was formed. In this embodiment, since phosphorus was used as the impurity element to give the n-type, phosphine ($PH_3$) was used in an ion doping method, and the dose amount was made $5 \times 10^{14}$ atoms/cm$^2$ and the acceleration voltage was made 10 keV. The pattern of the resist mask 609 was suitably set by an operator, so that the width of the n$^+$-type region was determined, and it was possible to easily obtain an n$^-$-type region having a desired width and a channel formation region (FIG. 6A).

Figure 6B:
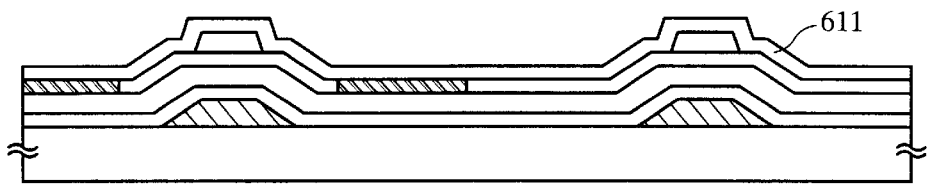

After the resist mask 609 was removed, a second insulating film 611 was formed. Here, a silicon nitride oxide film (film thickness of 50 nm) having a nitrogen content of not less than 5 atomic % and less than 25 atomic % and having compressive stress, which was shown in the embodiment 1, was formed by a plasma CVD method. The silicon nitride oxide film had the compressive stress (FIG. 6B).

Figure 6C:
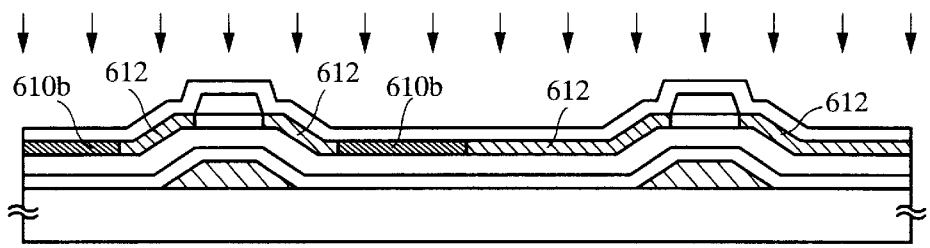

Next, a step of adding an impurity element to give the n-type was carried out to the crystalline semiconductor layer having the surface on which the masking insulating film 611 was provided, so that a second impurity region (n$^-$-type region) 612 was formed. However, in order to add the impurity through the masking insulating film 611 to the crystalline semiconductor layer thereunder, it was necessary to suitably set the condition in view of the thickness of the masking insulating film 611. Here, the dose amount was $3 \times 10^{13}$ atoms/cm$^2$, and the acceleration voltage was made 60 keV. The second impurity regions 612 formed in this way functioned as LDD regions (FIG. 6C).

Figure 6D:
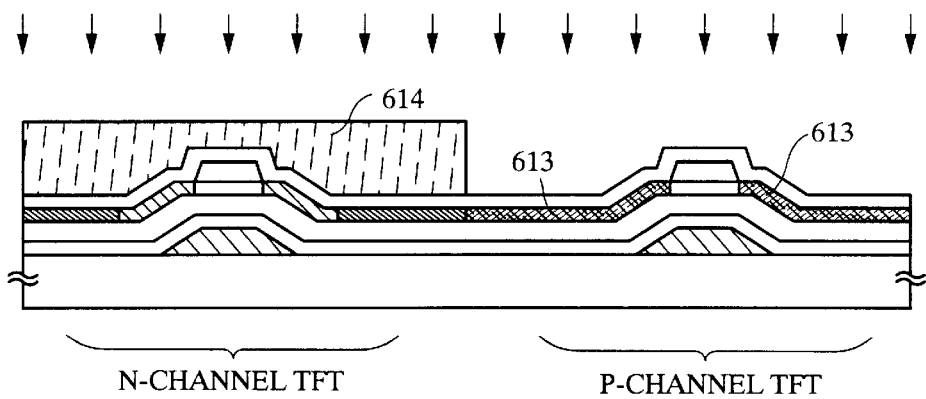

Next, a resist mask 614 covering the n-channel TFT was formed, and a step of adding an impurity element to give a p-type was carried out to a region where the p-channel TFT was to be formed. Here, boron (B) was added by an ion doping method using diborane ($B_2H_6$). The dose amount was $4 \times 10^{15}$ atoms/cm$^2$, and the acceleration voltage was made 30 keV (FIG. 6D).

Figure 7A:
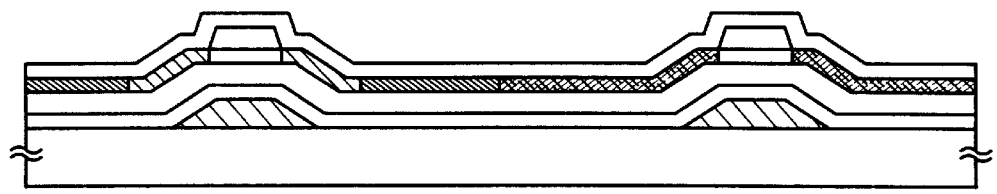
FIGS. 7A to 7D are sectional views showing fabricating steps of the TFT of Embodiment 1.

Thereafter, after a step of activating the impurity elements by a laser annealing method or a thermal annealing method was carried out, a heat treatment (300 to 500° C., 1 hour) was carried out in a hydrogen atmosphere, so that the whole was hydrogenated (FIG. 7A).

Figure 7B:
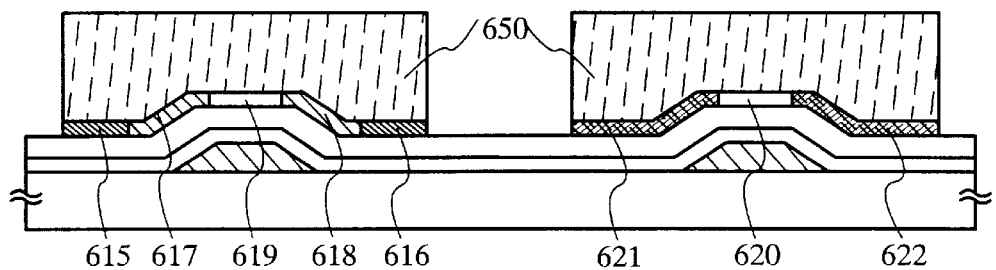

Hydrogenating may be carried out by hydrogen produced by making plasma. Thereafter, the channel protecting film 608 and the masking insulating film 611 were selectively removed by a fluoric acid based etching solution, and the crystalline semiconductor layer was etched into a desired shape by a well-known patterning technique (FIG. 7B).

Figure 7C:
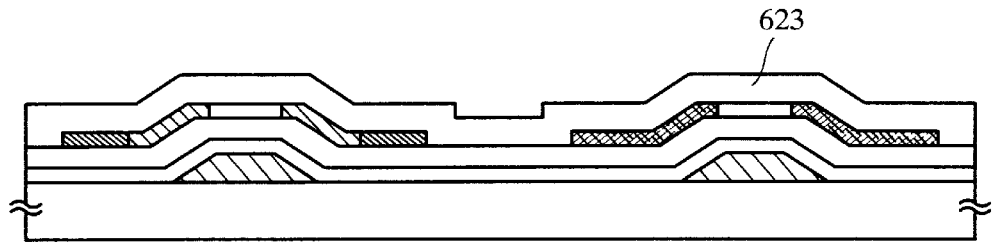
Figure 7D:
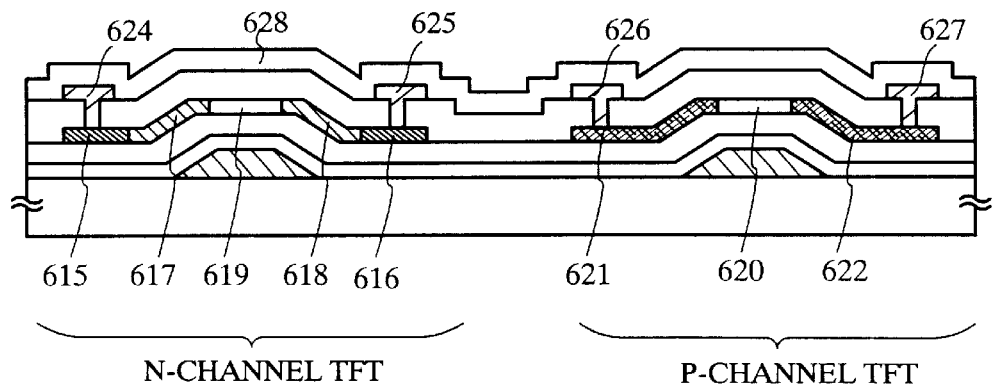

Through the foregoing steps, a source region 615, a drain region 616, LDD regions 617 and 618, and a channel formation region 619 of the n-channel TFT were formed. Besides, a source region 621, a drain region 622, and a channel formation region 620 of the p-channel TFT were formed. Next, a second insulating layer was formed to cover the n-channel TFT and the p-channel TFT. In the second insulating layer, an insulating film 623 made of a silicon oxide film was first formed to a thickness of 1000 nm (FIG. 7C).

Then, contact holes were formed, and source electrodes 624 and 626, and drain electrodes 625 and 627 were formed. Further, as a second insulating layer, a silicon nitride oxide film 628 was formed on the insulating film 623 made of the silicon oxide film to cover the source electrodes 624 and 626, and the drain electrodes 625 and 627. The silicon nitride oxide film 628 was made to have a nitrogen content of not less than 5 atomic % and less than 25 atomic %, and was made to have the compressive stress. After the state shown in FIG. 7D was obtained, a heat treatment was finally carried out in a hydrogen atmosphere, and the whole was hydrogenated, so that the n-channel TFT and the p-channel TFT were completed. It was also possible to realize the hydrogenating step by exposing the whole to a hydrogen atmosphere of plasma.

Embodiment 2

Figure 8A:
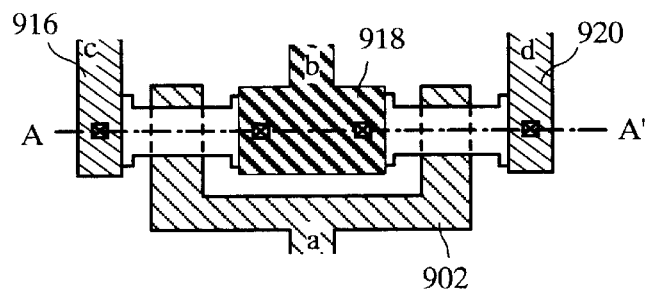
FIGS. 8A to 8C are a top view, a sectional view, and a circuit diagram of a CMOS circuit, respectively, of Embodiment 2.
Figure 8B:
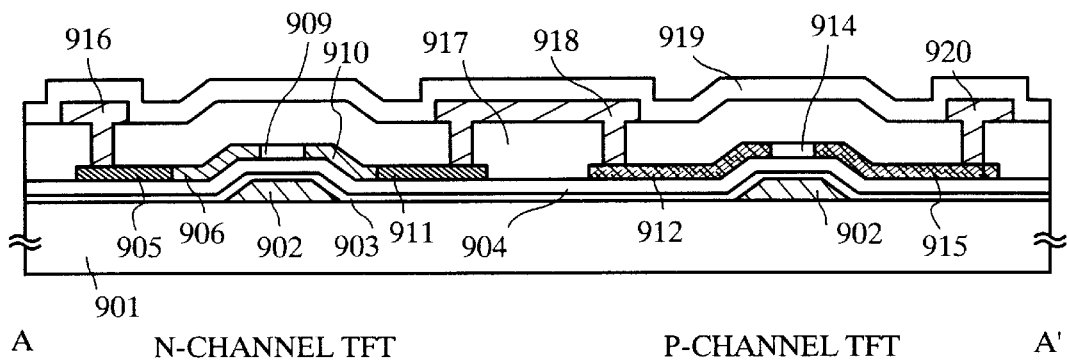
Figure 8C:
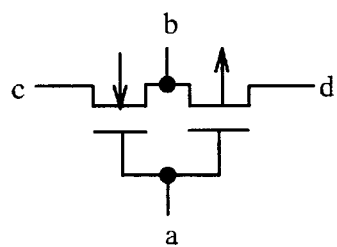

An example of a semiconductor device including an n-channel TFT and a p-channel TFT using the fabricating steps of Embodiment 1 will be described with reference to FIGS. 8A to 8C. FIGS. 8A to 8C show an inverter circuit as a basic structure of a CMOS circuit. By combining such an inverter circuit, it is possible to construct a basic circuit such as a NAND circuit and a NOR circuit, or to construct a further complicated shift register circuit, buffer circuit, and the like. FIG. 8A is a view corresponding to a top view of a CMOS circuit, and FIG. 8B is a sectional structural view taken along dotted line A–A' in FIG. 8A.

In FIG. 8B, both the n-channel TFT and the p-channel TFT are formed on the same substrate. In the p-channel TFT, a gate electrode 902 is formed, and a nitrogen-rich silicon nitride oxide film 903 having tensile stress and a silicon nitride oxide film 904 are provided as a first insulating layer thereon. An active layer made of a crystalline semiconductor film is formed to be in contact with the first insulating layer, and a p$^+$-region 912 (drain region), a p$^+$-region 915 (source region), and a channel formation region 914 are provided. A second insulating layer is provided to be in contact with this semiconductor layer, and here, a silicon oxide film 917 and a silicon nitride oxide film 919 are formed. A source electrode 920 and a drain electrode 918 are formed through contact holes provided in the silicon oxide film. On the other hand, in an active layer of the n-channel TFT, an n$^+$-type region 905 (source region), an n$^+$-type region 911 (drain region), a channel formation region 909, and an n$^-$-type region between the n$^+$-type region and the channel formation region are provided. Similarly, contact holes are formed in the silicon oxide film 917 as an interlayer insulating film, and a source electrode 916 and a drain electrode 918 are provided.

Such a CMOS circuit can be applied to a peripheral driver circuit of an active matrix type liquid crystal display device, a driver circuit for an EL (Electro luminescence) type display device, a reading circuit of a contact-type image sensor, and the like.

Embodiment 3

Figure 9A:
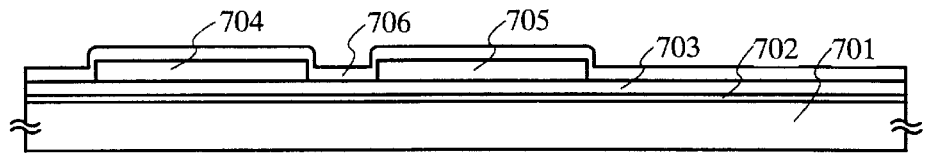
FIGS. 9A to 9E are sectional views showing fabricating steps of a TFT of Embodiment 3.

This embodiment will be described with reference to FIGS. 9A to 9E and FIGS. 10A to 10C. Here, a description will be made on an example in which an n-channel TFT and a p-channel TFT are fabricated on the same substrate, and an inverter circuit as a basic structure of a CMOS circuit is formed. In FIG. 9A, a first insulating layer is formed on a substrate 701 having an insulating surface. Here, a nitrogen-rich silicon nitride oxide film 702 having a nitrogen content of not less than 25 atomic % and less than 50 atomic % was formed to a thickness of 20 to 100 nm, typically a thickness of 50 nm, and a silicon nitride oxide film 703 having a nitrogen content of not less than 5 atomic % and less than 25 atomic % was formed to a thickness of 50 to 500 nm, typically 150 to 200 nm. The nitrogen-rich silicon nitride oxide film 702 has tensile stress. A second island-like semiconductor film 704, a first island-like semiconductor film 705, and a gate insulating film 706 were formed. The gate insulating 706 was formed of a silicon nitride oxide film. The island-like semiconductor films were formed by separating a crystalline semiconductor film, which was formed from an amorphous semiconductor film by a method such as a laser annealing method or a thermal annealing method, by a well-known technique (FIG. 9A).

As a semiconductor material which can be applied here, silicon (Si), germanium (Ge), silicon germanium alloy, and silicon carbide can be enumerated. In addition, a compound semiconductor material such as gallium arsenide may be used. The semiconductor film is formed to a thickness of 10 to 100 nm, typically 50 nm. Hydrogen is contained in an amorphous semiconductor film formed by a plasma CVD method at a rate of 10 to 40 atomic %. Although the amorphous semiconductor film has arbitrary internal stress from compressive stress to tensile stress by fabricating conditions, when a step of heat treatment at 400 to 500° C. was carried out prior to a step of crystallization to remove hydrogen from the film, the internal stress was almost changed to the tensile stress.

Figure 9B:
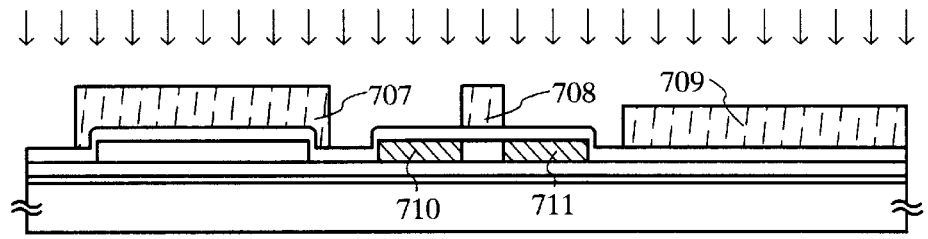

Then, resist masks 707 and 708 covering the second island-like semiconductor film 704 and the channel formation region of the first island-like semiconductor film 705 were formed. At this time, a resist mask 709 may also be formed on a region where a wiring is formed. Then, a step of forming a second impurity region was carried out by adding an impurity element to give an n-type. Here, phosphorus (P) was added by an ion doping method using phosphine (PH$_3$). In this step, for the purpose of adding phosphorus through the gate insulating film 706 to the island-like semiconductor layer thereunder, the acceleration voltage was set as high as 80 keV. It is preferable that the concentration of phosphorus added to the island-like semiconductor layer is within the range of $1\times10^{16}$ to $1\times10^{19}$ atoms/cm$^3$, and here, it was made $1\times10^{18}$ atoms/cm$^3$. Then, regions 710 and 711 where phosphorus was added into the semiconductor layer were formed. Part of the regions functioned as LDD regions (FIG. 9B).

Figure 9C:
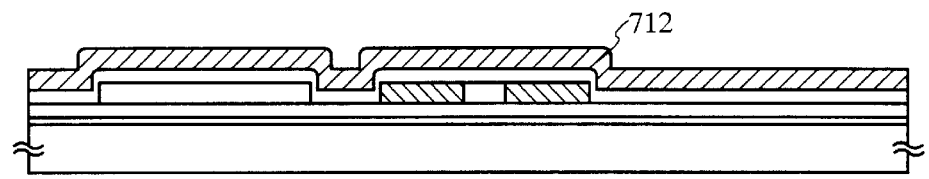

Then, a conductive layer 712 was formed on the surface of the gate insulating film 706. The conductive layer 712 is formed using a conductive material containing an element selected from Ta, Ti, Mo, and W as its main ingredient. It is appropriate that the thickness of the conductive layer 712 is 100 to 500 nm, preferably 150 to 400 nm. The thin film of Ta, Ti, W, Mo, or the like fabricated by a sputtering method had a high compressive stress. However, it was possible to effectively decrease the stress by adding an Xe gas in addition to an Ar gas at the time of film formation by sputtering (FIG. 9C).

Figure 9D:
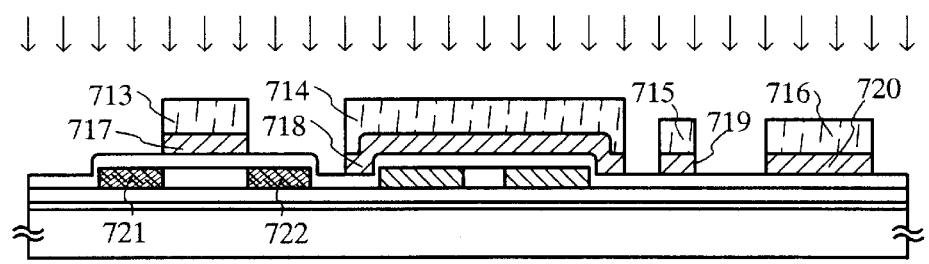

Next, resist masks 713 to 716 were formed. The resist mask 713 is for forming a gate electrode of the p-channel TFT, and the resist masks 715 and 716 are for forming a gate wiring and a gate bus line. The resist mask 714 was formed to cover the whole surface of the first island-like semiconductor film 705, and was provided to be made a mask to prevent addition of an impurity in a next step. An unnecessary portion of the conductive layer 712 was removed by a dry etching method, so that a second gate electrode 717, a gate wiring 719, a gate bus line 720 were formed. Here, in the case where a residual after etching remained, it was appropriate that an ashing process was carried out. While the resist masks 713 to 716 were made to remain as they were, an impurity element to give a p-type was added to a part of the second island-like semiconductor film 704 where the p-channel TFT was formed, so that a third impurity region was formed. Here, boron was used as the impurity element and was added by an ion doping method using diborane ($B_2H_6$). Also in this step, the acceleration voltage was made 80 keV, and boron was added at a concentration of $2\times10^{20}$ atoms/cm$^3$. As shown in FIG. 9D, third impurity regions 721 and 722 where boron was added at a high concentration were formed.

Figure 9E:
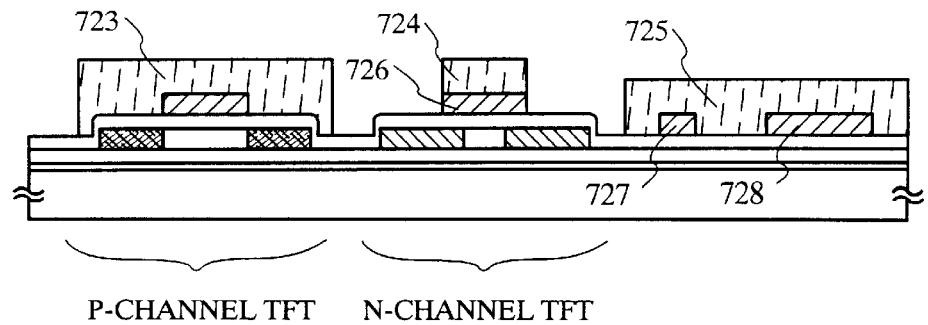

After the resist masks provided in FIG. 9D were removed, resist masks 723 to 725 were again formed. These are for forming a gate electrode of the n-channel TFT, and a first gate electrode 726 was formed by a dry etching method. At this time, the first gate electrode 726 was formed to overlap with part of the second impurity regions 710 and 711 through the gate insulating film (FIG. 9E).

Figure 10A:
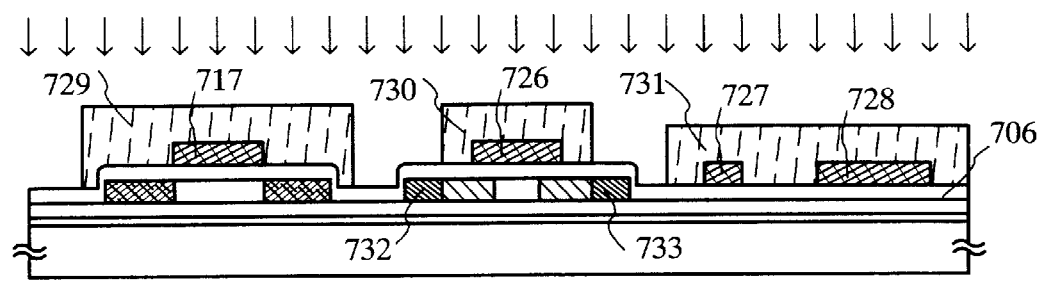
FIGS. 10A to 10C are sectional views showing fabricating steps of the TFT and a top view of a CMOS circuit of Embodiment 3.

Next, resist masks 729 to 731 were formed. The resist mask 730 was formed to cover the first gate electrode 726 and into such a shape that it overlapped with part of the second impurity regions 710 and 711. This is for determining an offset amount of LDD regions. Then, a step of forming a first impurity region was carried out by adding an impurity element to give an n-type, so that a first impurity region 732 which became a source region and a first impurity region 733 which became a drain region were formed. Also in this step, for the purpose of adding phosphorus through the second insulating layer 706 to the semiconductor layer thereunder, the acceleration voltage was set as high as 80 keV. The concentration of phosphorus in this region is high as compared with the step of adding the first impurity element to give the n-type, and it is preferable that the concentration is made $1\times10^{19}$ to $1\times10^{21}$ atoms/cm$^3$, and here, it was made $1\times10^{20}$ atoms/cm$^3$ (FIG. 10A).

Then, a silicon oxide film 734 with a thickness of 1000 nm was formed on the surfaces of the gate insulating film 706, the first and second gate electrodes 726 and 717, a gate wiring 727, and a gate bus line 728. Thereafter, a heat treatment was carried out. It was necessary to carry out this treatment in order to activate the impurity elements added at each concentration and to give the n-type or p-type. This step may be carried out by a thermal annealing method using an electric heating furnace, the foregoing laser annealing method using an excimer laser, or a rapid thermal annealing method (RTA method) using a halogen lamp. However, in the laser annealing method, although activation can be made at a low substrate heating temperature, it is difficult to make activation to a region concealed under the gate electrode. Here, the activation was made by the thermal annealing method. The heat treatment was carried out in a nitrogen atmosphere at 300 to 600° C., preferably 350 to 550° C., here, 450° C. for 2 hours. In this heat treatment, hydrogen of 3 to 90% may be added in the nitrogen atmosphere. Further, it is appropriate that after the heat treatment, a step of hydrogenating process is carried out in a hydrogen atmosphere of 3 to 100% at 150 to 500° C., preferably 300 to 450° C. for 2 to 12 hours. The hydrogenating process may be carried out by hydrogen produced by making plasma at a substrate temperature of 150 to 500° C., preferably 200 to 450° C. In all events, hydrogen compensated defects remaining in the semiconductor layer or its interface, so that it was possible to improve the characteristics of the TFT.

After a predetermined resist mask was formed, the silicon oxide film 734 was subjected to an etching process so that contact holes reaching a source region and a drain region of each TFT were formed. Then, source electrodes 736 and 737 and a drain electrode 738 were formed. Although not shown, in this embodiment, the respective electrodes were used as a three-layer electrode in which a Ti film having a thickness of 100 nm, an Al film containing Ti and having a thickness of 300 nm, and a Ti film having a thickness of 150 nm were continuously formed by a sputtering method. Further, a silicon nitride oxide film 735 having a nitrogen content of from 5 atomic % to 25 atomic % was formed on all surfaces thereof. This film had compressive stress. When a second hydrogenating process was carried out in this state, it was possible to further improve the characteristics of the TFT. Also in this step, it was appropriate that a heat treatment at 300 to 450° C., preferably 300 to 350° C. for 1 to 6 hours was carried out in a hydrogen atmosphere of 1 to 5%. Alternatively, it was possible to make hydrogenating by exposing the whole to hydrogen produced by making plasma.

Through the steps described above, the first insulating layer was composed of the nitrogen-rich silicon nitride oxide film 702 having the tensile stress and the silicon nitride oxide film 703, and the second insulating layer was composed of the gate insulating film 706 made of the silicon nitride oxide film, the silicon oxide film 734, and the silicon nitride oxide film 735. The p-channel TFT was formed in a self-aligning manner, and the n-channel TFT was formed in a nonself-aligning manner.

Figure 10B:
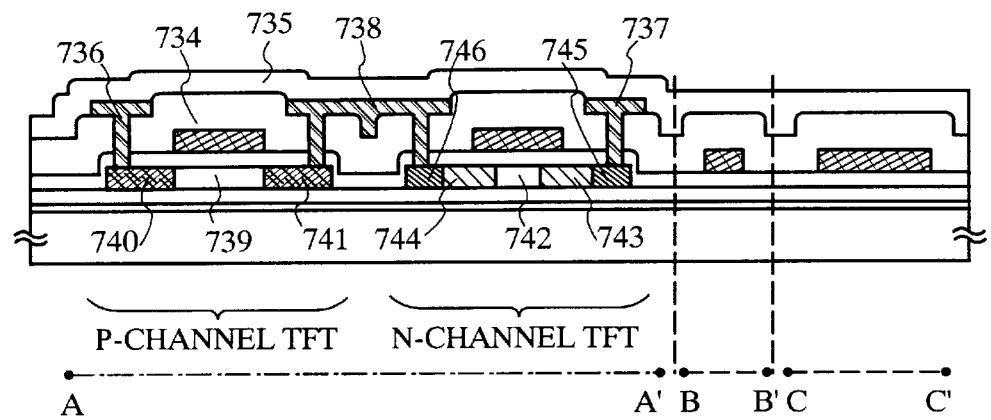

A channel formation region 742, first impurity regions 745 and 746, and second impurity regions 743 and 744 were formed in the n-channel TFT of the CMOS circuit. Here, in the second impurity regions, regions (GOLD (gate overlapped drain) regions) 743a and 744a overlapping with the gate electrode, and regions (LDD regions) 743b and 744b not overlapping with the gate electrode were formed, respectively. The first impurity region 745 became a source region, and the first impurity region 746 became a drain region. On the other hand, in the p-channel TFT, a channel formation region 739, and third impurity regions 740 and 741 were formed. The third impurity region 740 became a source region, and the third impurity region 741 became a drain region (FIG. 10B).

Figure 10C:
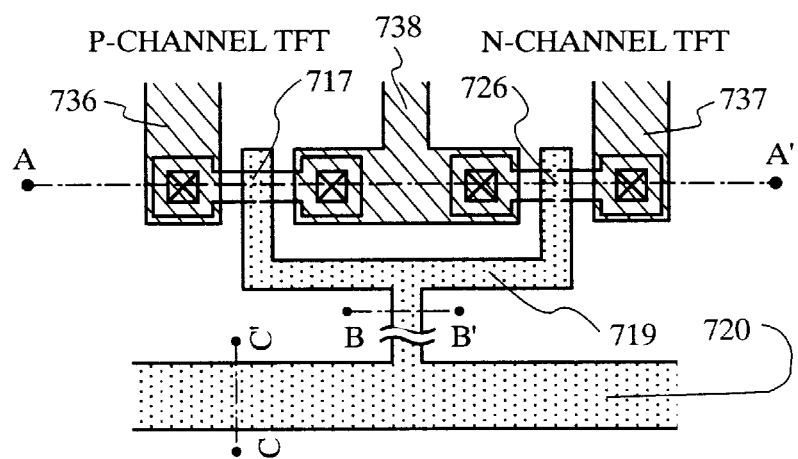

FIG. 10C is a top view showing an inverter circuit. An A–A' sectional structure of a TFT portion, a B–B' sectional structure of a gate wiring portion, and a C–C' sectional structure of a gate bus line portion correspond to FIG. 10B. In the present invention, the gate electrode, the gate wiring, and the gate bus line are formed of the first conductive layer. In FIGS. 9A to 9E and FIGS. 10A to 10C, although the CMOS circuit formed by complementarily combining the n-channel TFT and the p-channel TFT is shown as an example, the present invention can also be applied to an NMOS circuit using an n-channel TFT, a pixel portion of a liquid crystal display device, an EL display device, a reading circuit of an image sensor, and the like.

Embodiment 4

In this embodiment, a method of fabricating an active matrix substrate in which a pixel portion (pixel matrix circuit) and a CMOS circuit as a base of a driver circuit provided at its periphery are formed at the same time will be described with reference to FIGS. 11A to 13B.

Figure 11A:
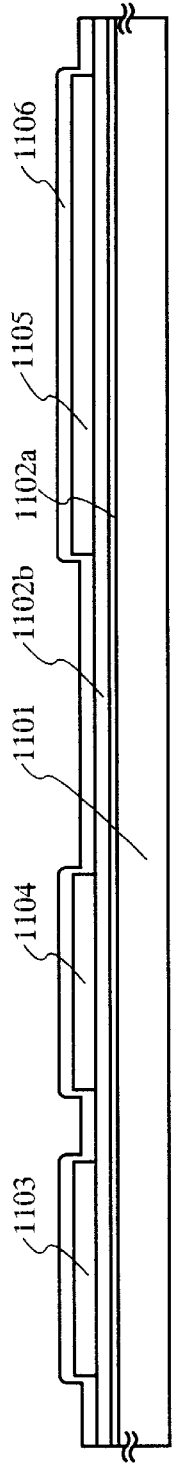
FIGS. 11A to 11C are sectional views showing fabricating steps of an active matrix substrate of Embodiment 4.
Figure 19:
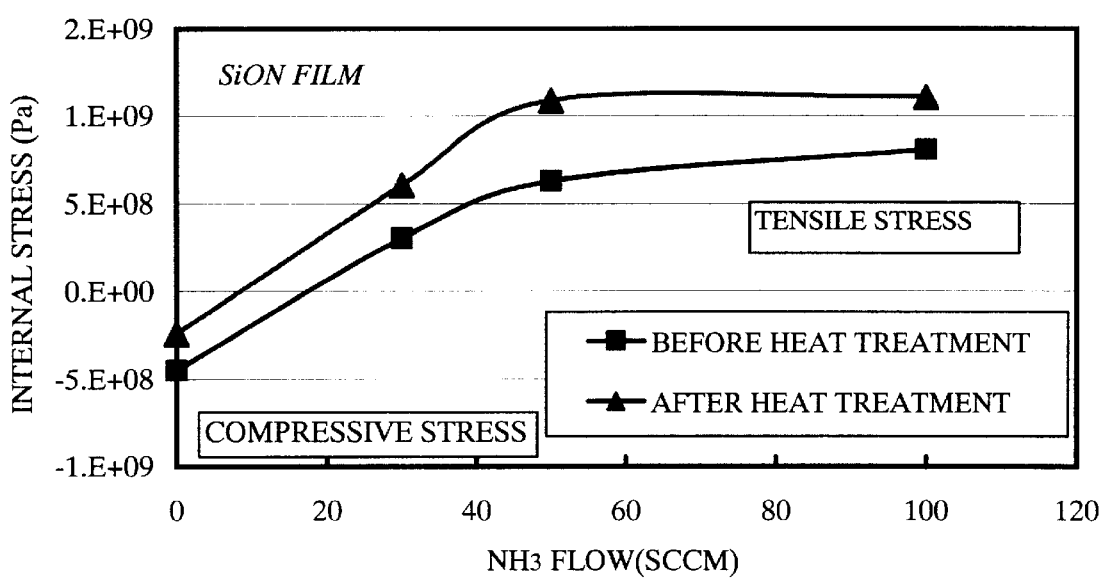
FIG. 19 is a characteristic view of internal stress of a silicon nitride oxide film of the present invention.
Figure 20A:
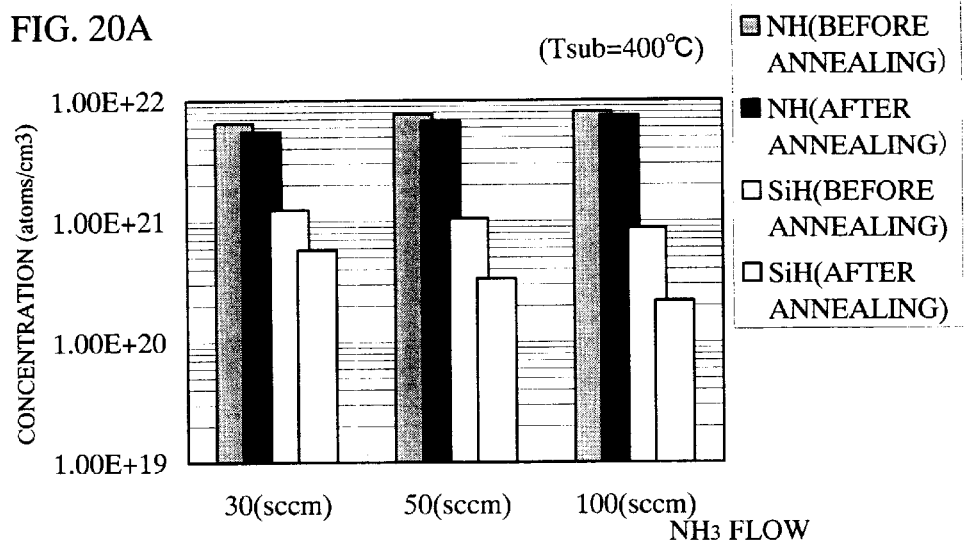
FIG. 20 is a characteristic view for explaining the change of hydrogen content in silicon nitride oxide films by heat treatment of the present invention.
Figure 20B:
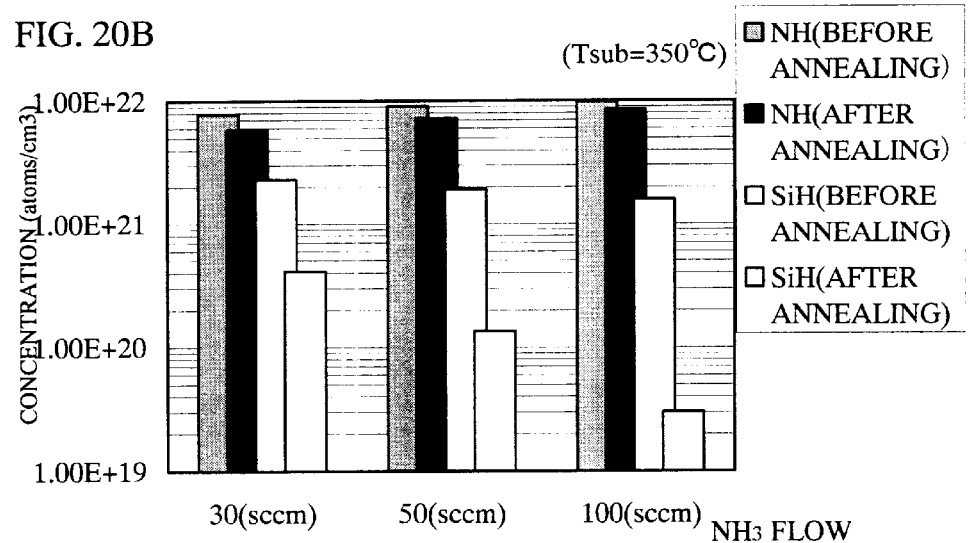
Figure 20C:
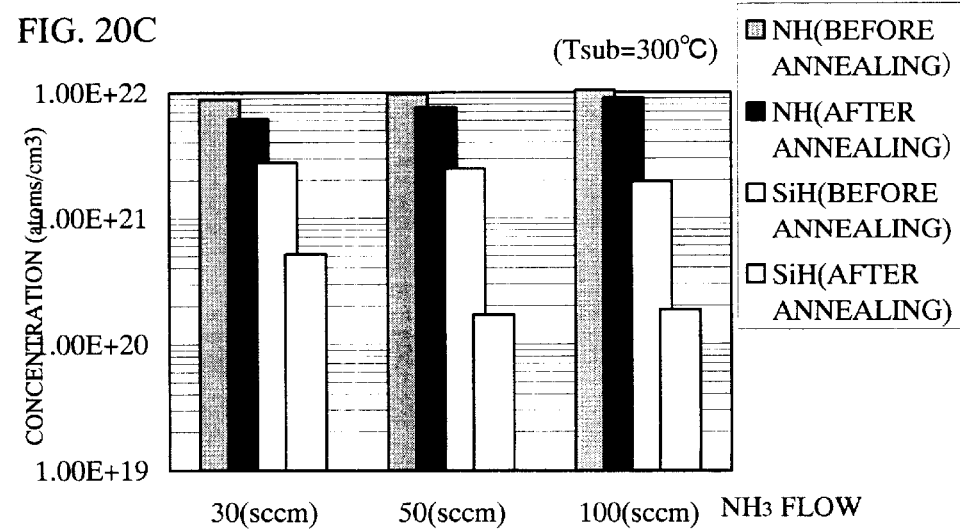

First, as a first insulating layer, a nitrogen-rich first silicon nitride oxide film 1102a was formed to a thickness of 50 to 500 nm, typically 100 nm on a substrate 1101, and further, a second silicon nitride oxide film 1102b was formed to a thickness of 100 to 500 nm, typically 200 nm. The nitrogen content of the nitrogen-rich first silicon nitride oxide film 1102a was made not less than 25 atomic % and less than 50 atomic %. The nitrogen-rich first silicon nitride oxide film 1102a was formed of $SiH_4$, $N_2O$ and $NH_3$, and as shown in FIG. 19, the film had tensile stress. The internal stress was kept even to a heating treatment attendant on a crystallizing step or a gettering step. Further, island-like crystalline semiconductor films 1103, 1104 and 1105, and a gate insulating film 1106 were formed. The island-like crystalline semiconductor films were formed in such a manner that a crystalline semiconductor film was formed from an amorphous semiconductor film by a crystallizing method using a catalytic element, and this film was processed and separated into island-like regions. The gate insulating film 1106 was a silicon nitride oxide film formed from $SiH_4$ and $N_2O$, and had compressive stress. Here, the film was formed to a thickness of 10 to 200 nm, preferably 50 to 150 nm (FIG. 11A).

Figure 11B:
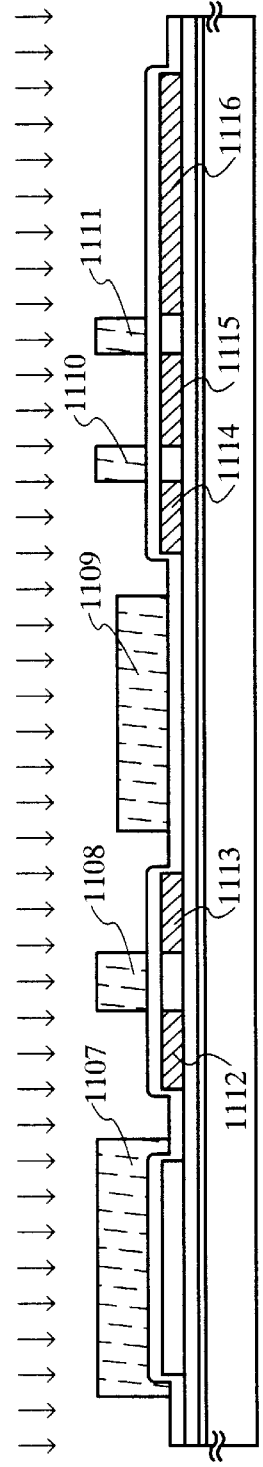

Next, resist masks 1107 to 1111 were formed to cover the island-like semiconductor film 1103, and channel formation regions of the island-like semiconductor films 1104 and 1105. At this time, the resist mask 1109 may be formed in a region where a wiring is formed. Then, an impurity element to give an n-type was added so that second impurity regions were formed. Here, phosphorus (P) was added by an ion doping method using phosphine ($PH_3$). In this step, for the purpose of adding phosphorus through the gate insulating film 1106 to the island-like semiconductor film thereunder, the acceleration voltage was set 65 keV. It is preferable that the concentration of phosphorus added to the island-like semiconductor is within the range of $1\times10^{16}$ to $1\times10^{19}$ atoms/cm³, and here, it was made $1\times10^{18}$ atoms/cm³. Then, regions 1112 to 1116 where phosphorus was added were formed. Part of the regions are made the second impurity regions functioning as LDD regions (FIG. 11B).

Figure 11C:
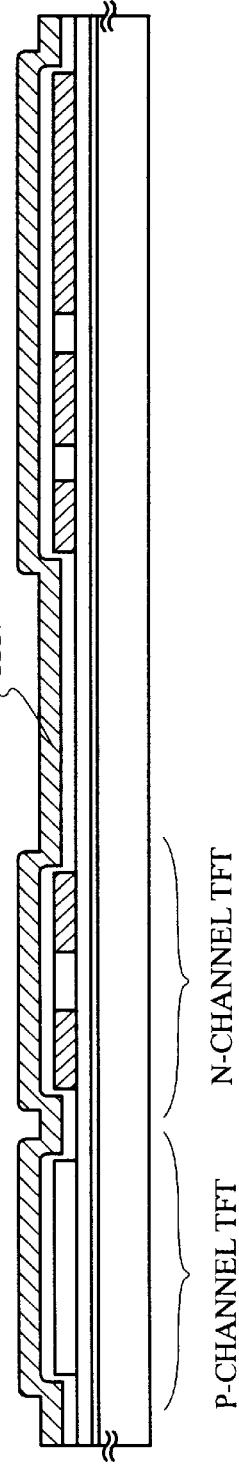

Thereafter, the resist masks were removed and a conductive layer 1117 was formed on the whole surface. The conductive layer 1117 is formed by using a conductive material containing an element selected from Ta, Ti, Mo, and W as its main ingredient. It is appropriate that the thickness of the conductive layer 1117 is 100 to 1000 nm, preferably 150 to 400 nm. Here, the film was formed of Ta by a sputtering method using a mixture gas of Ar and Xe (FIG. 11C).

Figure 12A:
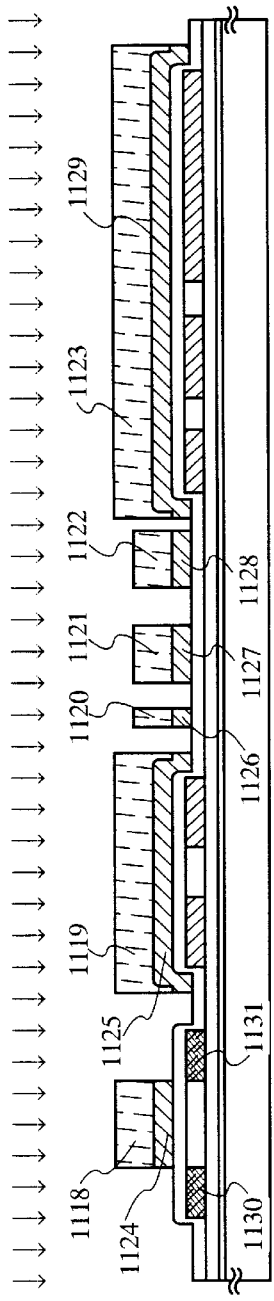
FIGS. 12A to 12C are sectional views showing fabricating steps of the active matrix substrate of Embodiment 4.

Next, a gate electrode of a p-channel TFT, gate wirings of a CMOS circuit and a pixel portion, and gate bus lines were formed. Since a gate electrode of an n-channel TFT was formed in a subsequent step, resist masks 1119 and 1123 were formed so that the conductive layer 1117 remained on the whole surface over the island-like semiconductor film 1104. Unnecessary portions of the conductive layer 1117 were removed by a dry etching method. Etching of Ta was carried out by a mixture gas of $CF_4$ and $O_2$. Then, a gate electrode 1124, gate wirings 1126 and 1128, and a gate bus line 1127 were formed. Then, a step of adding a third impurity element to give a p-type was carried out to part of the island-like semiconductor film 1103 where the p-channel TFT was to be formed, while the resist masks 1118 to 1123 were made to remain as they were. Here, boron was used as the impurity element and was added by an ion doping method using diborane ($B_2H_6$). Also in this step, the acceleration voltage was made 80 keV, and boron was added at a concentration of $2\times10^{20}$ atoms/cm³. As shown in FIG. 12A, third impurity regions 1130 and 1131 where boron was added at the high concentration were formed.

Figure 12B:
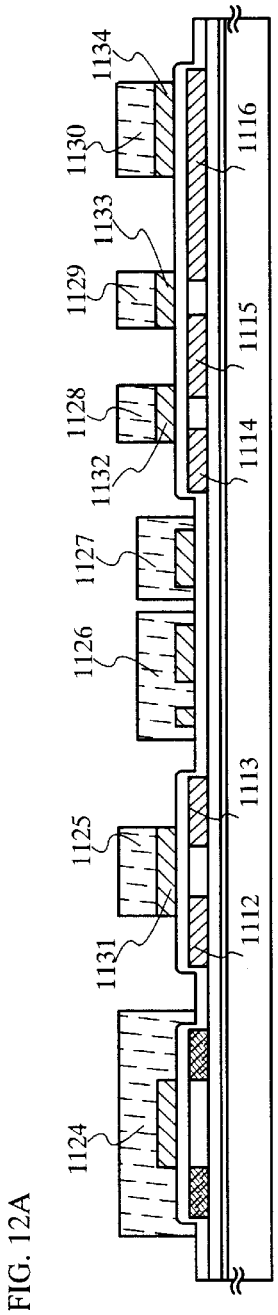

After the resist masks provided in FIG. 12A were removed, resist masks 1124 to 1130 were newly formed. These were for forming gate electrodes of n-channel TFTs, and gate electrodes 1131 to 1133 were formed by a dry etching method. At this time, the gate electrodes 1131 to 1133 were formed to overlap with part of the second impurity regions 1112 to 1116 (FIG. 12B).

Then, new resist masks 1135 to 1141 were formed. The resist masks 1136, 1139, and 1140 were formed into such a shape as to cover the gate electrodes 1131 to 1133 of the n-channel TFTs and part of the second impurity regions. Here, the resist masks 1136, 1139 and 1140 are respectively for determining an offset amount of LDD regions. Then, a step of forming first impurity regions was carried out by adding an impurity element to give an n-type. Then, first impurity regions 1143 and 1144 which became source regions and first impurity regions 1142, 1145 and 1146 which became drain regions were formed. Also in this step, phosphorus was added through the gate insulating film 1106 to the island-like semiconductor film thereunder. The concentration of phosphorus in this region is high as compared with the step of adding the first impurity element to give the n-type, and it is preferable that the concentration is made $1\times10^{20}$ to $1\times10^{21}$ atoms/cm³, and here, it was made $1\times10^{20}$ atoms/cm³. At this time, also in part of the source and drain regions of the p-channel TFT, regions 1180 and 1181 where phosphorus was added were formed. However, the concentration of phosphorus in this region is about half of the concentration of boron, and the conductivity remains the p-type (FIG. 12C).

Figure 12C:
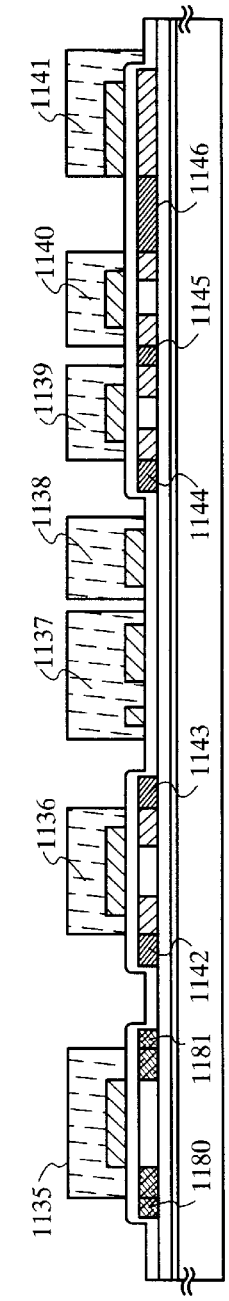
Figure 13A:
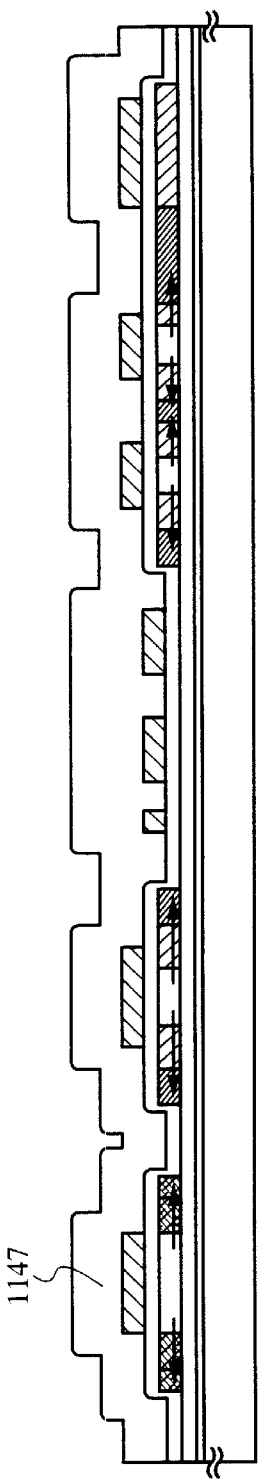
FIGS. 13A and 13B are sectional views of the active matrix substrate of Embodiment 4.

After the steps to FIG. 12C were completed, a silicon oxide film 1147 was formed. Here, TEOS (Tetraethyl Orthosilicate) was used as a raw material, and the film was formed to a thickness of 1000 nm by a plasma CVD method. In this state, a heat treatment at 400 to 800° C. for a 1 to 24 hours, for example, at 525° C. for 8 hours was carried out. By this step, it was possible to activate the added impurity elements to give the n-type and the p-type. Further, the regions 1142 to 1146, 1180 and 1181 where phosphorus was added became gettering sites, so that it was possible to segregate the catalytic element remaining in the step of crystallization into these regions. As a result, it was possible to remove the catalytic element from at least channel formation regions. It is appropriate that after this heat treatment, a step of hydrogenating process is carried out in a hydrogen atmosphere of 3 to 100% at 150 to 500° C., preferably 300 to 450° C. for 2 to 12 hours. Alternatively, the hydrogenating process may be carried out with hydrogen produced by making plasma at a substrate temperature of 150 to 500° C., preferably 200 to 450° C. In all events, hydrogen compensated defects remaining in the semiconductor layer or its interface, so that it was possible to improve the characteristics of the TFT (FIG. 13A).

Thereafter, the silicon oxide film 1147 was patterned so that contact holes reaching a source region and a drain region of each TFT were formed. Then, source electrodes 1149, 1150 and 1151, and drain electrodes 1152 and 1153 were formed. Although not shown, in this embodiment, each of the electrodes was used as a three-layer electrode in which a Ti film having a thickness of 100 nm, an Al film containing Ti and having a thickness of 300 nm, and a Ti film having a thickness of 150 nm were continuously formed by a sputtering method. When a second hydrogenating process was carried out in this state, it was possible to further improve the characteristics of the TFT. Also in this step, it was appropriate that a heat treatment at 300 to 450° C., preferably 300 to 350° C. for 1 to 6 hours was carried out in a hydrogen atmosphere of 1 to 5%. Alternatively, it was possible to carry out hydrogenating by exposing the whole to hydrogen produced by making plasma. Then, a silicon nitride oxide film 1148 was formed to a thickness of 100 to 500 nm, for example, 300 nm. The silicon nitride oxide film 1148 was formed by a plasma CVD method, and was formed from a mixture gas of $SiH_4$, $N_2O$ and $NH_3$ based on the data of FIG. 19, so that the nitrogen content in the film became less than 25 atomic %, and the film had compressive stress (FIG. 13B).

Through the steps as described above, the first insulating layer was composed of the nitrogen-rich first silicon nitride oxide film 1102a having the tensile stress and the second silicon nitride oxide film 1102b, and the second insulating layer was composed of the gate insulating film 1106 made of the silicon nitride oxide film, the silicon oxide film 1147, and the silicon nitride oxide film 1148. The p-channel TFT was formed in a self-aligning manner, and the n-channel TFT was formed in a nonself-aligning manner.

Through the foregoing steps, a channel formation region 1157, first impurity regions 1160 and 1161, second impurity regions 1158 and 1159 were formed in the n-channel TFT of the CMOS circuit. Here, in the second impurity regions, regions (GOLD (gate overlapped drain) regions) 1158a and 1159a overlapping with the gate electrode and regions (LDD regions) 1158b and 1159b not overlapping with the gate electrode were formed, respectively. The first impurity region 1160 became a source region, and the first impurity region 1161 became a drain region. In the p-channel TFT, a channel formation region 1154, and third impurity regions 1155 and 1156 were formed. The third impurity region 1155 became a source region, and the third impurity region 1156 became a drain region. The n-channel TFT (pixel TFT) of the pixel portion had a multi-gate structure, and channel formation regions 1162 and 1163, first impurity regions 1168, 1169, and 1145, and second impurity regions 1164 to 1167 were formed. Here, in the second impurity regions, regions 1164a, 1165a, 1166a and 1167a overlapping with the gate electrodes, and regions 1164b, 1165b, 1166b, and 1167b not overlapping with the gate electrodes were formed.

Figure 13B:
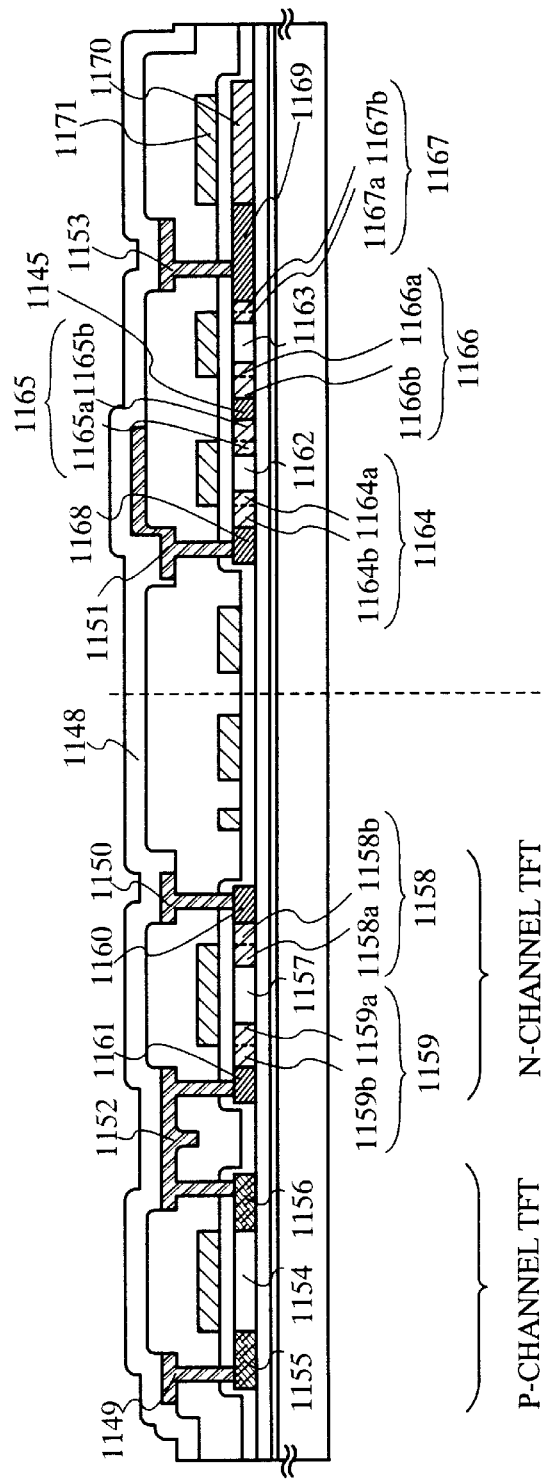

In this way, as shown in FIG. 13B, the active matrix substrate in which the CMOS circuit and the pixel portion were formed on the substrate 1101 was fabricated. At a drain side of the pixel TFT, a low concentration impurity region 1170 in which an impurity element to give an n-type was added at the same concentration as the second impurity region, the gate insulating film 1106, and a holding capacitance electrode 1171 were formed, and holding capacitance provided at the pixel portion was formed at the same time.

Embodiment 5

In this embodiment, steps of fabricating an active matrix type liquid crystal display device from an active matrix substrate fabricated in Embodiment 4 will be described with reference to FIGS. 14A and 14B. To the active matrix substrate in the state of FIG. 13B, an interlayer insulating film 1401 made of an organic resin was formed to a thickness of about 1000 nm. As the organic resin, polyimide, acryl, polyimidoamide, etc. may be used. As advantages obtained by using the organic resin film, it is possible to enumerate such points that a film formation method is simple, parasitic capacitance can be reduced since its relative dielectric constant is low, and flatness is superior. An organic resin film other than the above may be used. Here, polyimide of such a type that thermal polymerization was made after coating to the substrate was used, and was fired at 300° C. to form the film. The internal stress of this organic resin film was about $1 \times 10^8$ Pa, and it did not become a serious problem in considering the stress balance as was expected from its absolute value. A contact hole reaching the drain electrode 1153 was formed in the interlayer insulating film 1401, and a pixel electrode 1402 was formed. As the pixel electrode 1402, it is appropriate that a transparent conductive film is used in the case where a transmission type liquid crystal display device is formed, and a metal film is used in the case where a reflection type liquid crystal display device is formed. Here, for the purpose of making the transmission type liquid crystal display device, an indium-tin oxide (ITO) film having a thickness of 100 nm was formed by a sputtering method (FIG. 14A)

Next, as shown in FIG. 14B, an orientation film 1501 was formed on the surfaces of the interlayer insulating film 1401 and the pixel electrode 1402. In general, polyimide resin is often used for an orientation film of a liquid crystal display device. A transparent electrode 1503 and an orientation film 1504 were formed on an opposite substrate 1502. The orientation film was subjected to a rubbing process after formation so that liquid crystal molecules were made to be oriented in parallel and with a certain constant pretilt angle. After the foregoing steps, the active matrix substrate on which the pixel portion and the CMOS circuit were formed and the opposite substrate were bonded to each other by a well-known cell assembling step through a sealing material, a spacer (both are not shown), and the like. Thereafter, a liquid crystal material 1505 was injected between both the substrates, and complete sealing was made by a sealing agent (not shown). Thus, the active matrix type liquid crystal display device shown in FIG. 14B was completed.

Figure 15:
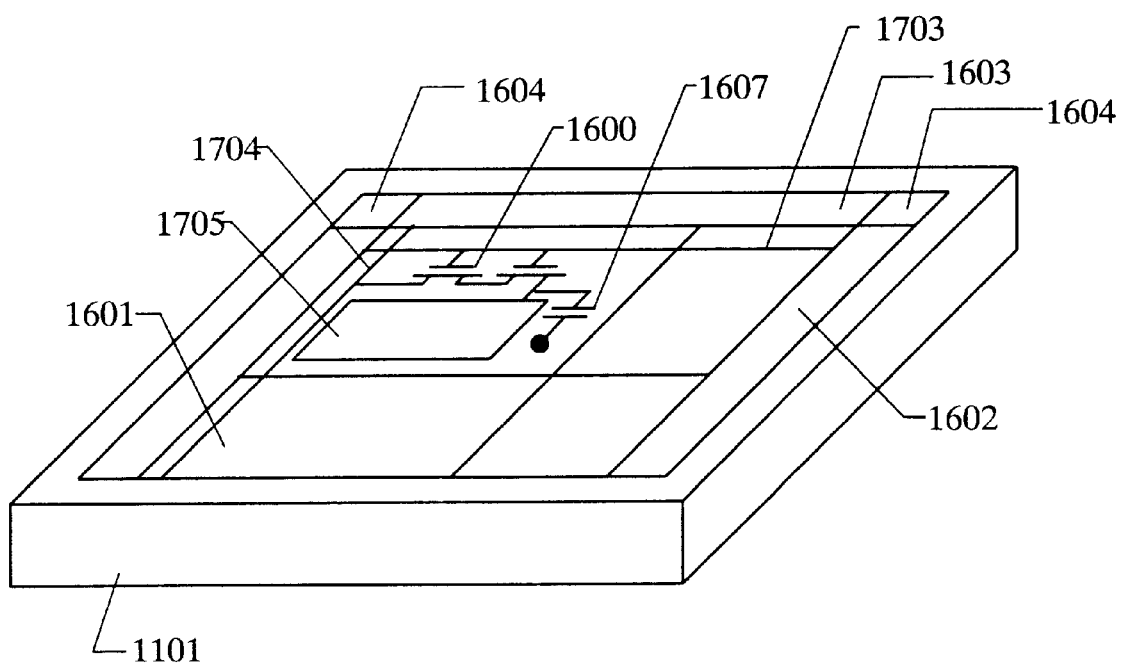
FIG. 15 is a perspective view of an active matrix substrate of Embodiment 5.

Next, a structure of an active matrix type liquid crystal display device of this embodiment will be described with reference to FIGS. 15, 16A, and 16B. FIG. 15 is a perspective view of an active matrix substrate of this embodiment. The active matrix substrate is composed of a pixel portion 1601, a scanning (gate) line driver circuit 1602, and a signal (source) line driver circuit 1603, which are formed on a glass substrate 1101. A pixel TFT 1600 of the pixel portion is an n-channel TFT, and the driver circuits provided at the periphery are constituted by a CMOS circuit as a base. The scanning (gate) line driver circuit 1602 and the signal (source) line driver circuit 1603 are connected to the pixel portion 1601 through a gate wiring 1703 and a source wiring 1704, respectively.

Figure 16A:
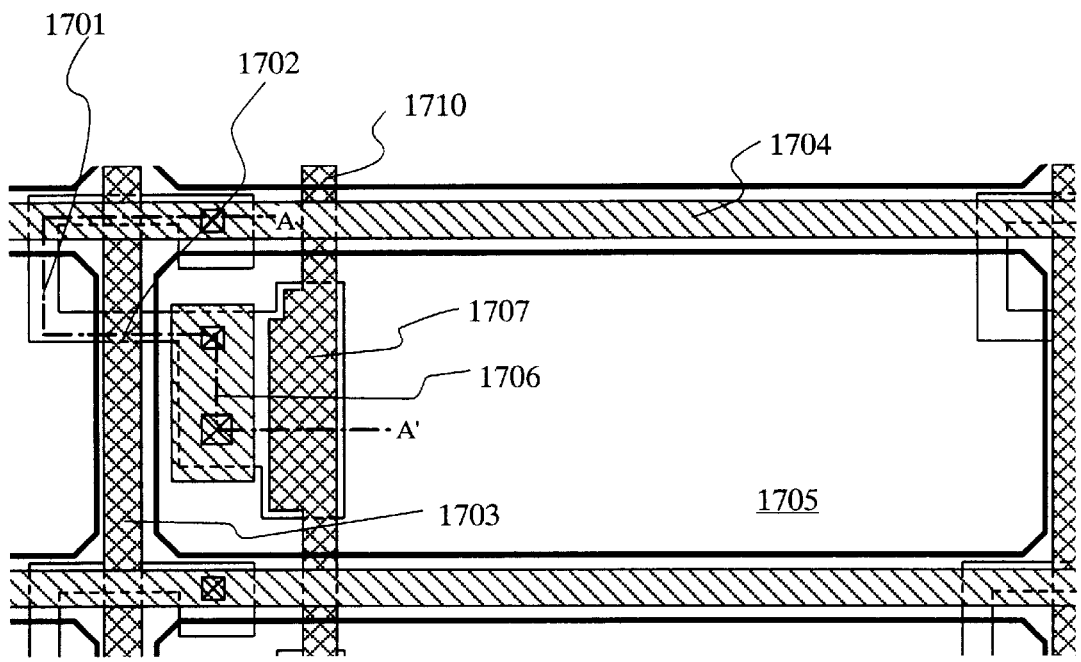
FIGS. 16A and 16B are a top view of a pixel portion and a top view of a CMOS circuit, respectively, of Embodiment 5.
Figure 16B:
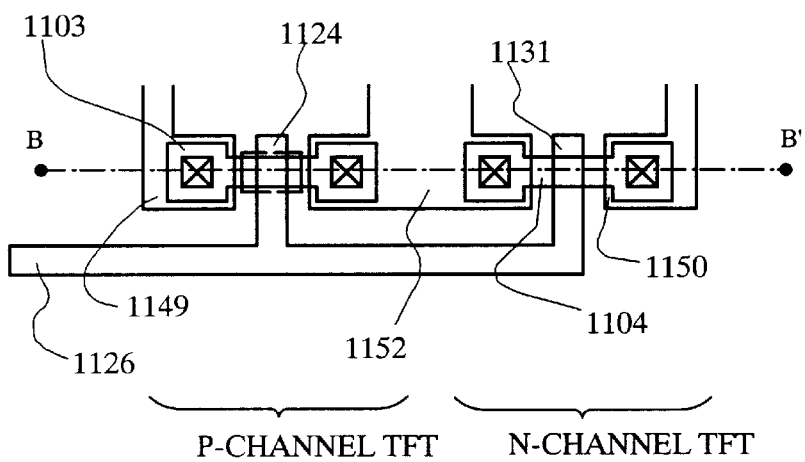
Figure 17:
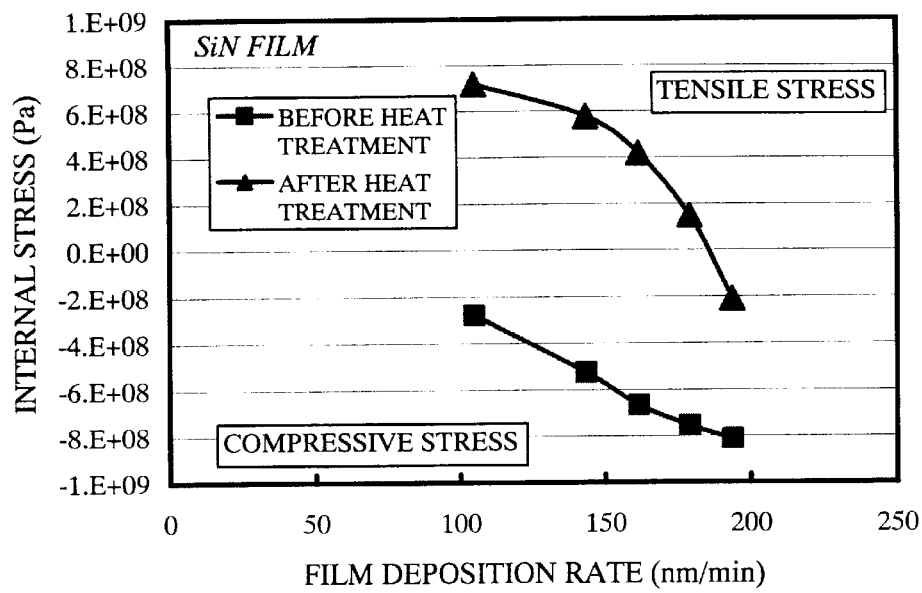
FIG. 17 is a characteristic view of internal stress of a silicon nitride film of the present invention.
Figure 18:
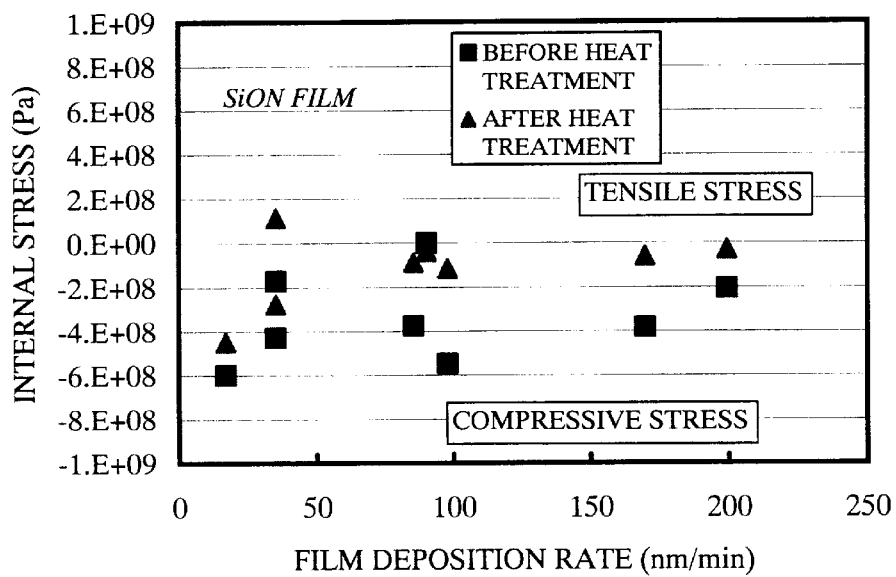
FIG. 18 is a characteristic view of internal stress of a silicon nitride oxide film of the present invention.

FIG. 16A is a top view of the pixel portion 1601 and is a top view of about one pixel. An n-channel pixel TFT is provided in the pixel portion. A gate electrode 1702 formed to be connected with a gate wiring 1703 intersects through a not-shown gate insulating film with a semiconductor layer 1701 under the film. Although not shown, a source region, a drain region, and a first impurity region are formed in the semiconductor layer. At a drain side of the pixel TFT, a holding capacitance 1707 is formed of the semiconductor layer, the gate insulating film, and an electrode made of the same material as the gate electrode. A sectional structure along line A–A' shown in FIG. 16A corresponds to the sectional view of the pixel portion shown in FIG. 14B. On the other hand, in the CMOS circuit shown in FIG. 16B, the gate electrodes 1124 and 1131 extending from the gate wiring 1126 intersect through a not-shown gate insulating film with the semiconductor layers 1103 and 1104 under the film. Although not shown, similarly, a source region, a drain region, and LDD regions are formed in the semiconductor layer of the n-channel TFT. Besides, a source region and a drain region are formed in the semiconductor layer of the p-channel TFT. Concerning the positional relation, the sectional structure along line B–B' corresponds to the sectional view of the CMOS portion shown in FIG. 14B.

In this embodiment, although the pixel TFT 1600 has a double gate structure, a single gate structure may be adopted, or a multi-gate structure of a triple gate may be adopted. The structure of the active matrix substrate of the present invention is not limited to the structure of this embodiment. Since the present invention is characterized by the structure of a gate electrode and the structure of a source region, a drain region and other impurity regions of a semiconductor layer provided through a gate insulating film, other structures may be suitably determined by an operator.

Embodiment 6

Figure 21A:
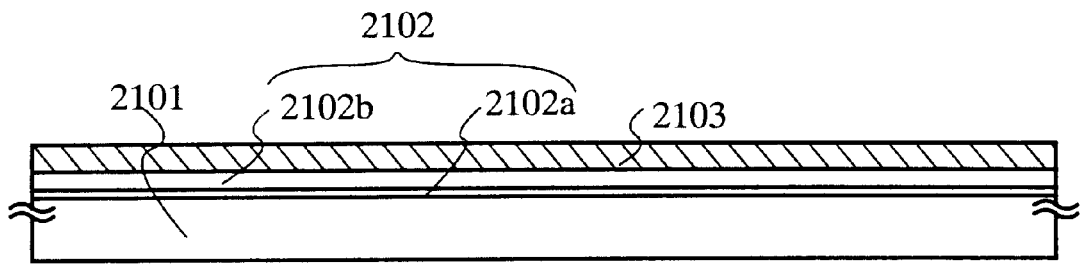
FIGS. 21A to 21C are views for explaining Embodiment 6 of the present invention.
Figure 21B:
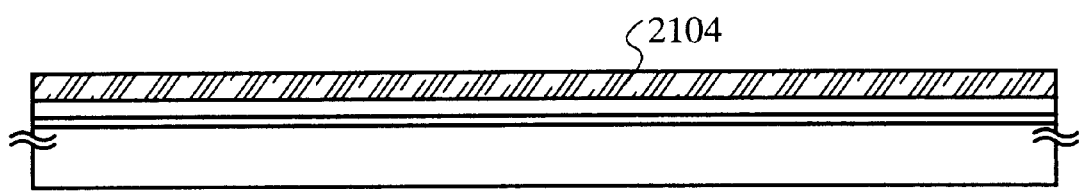
Figure 21C:
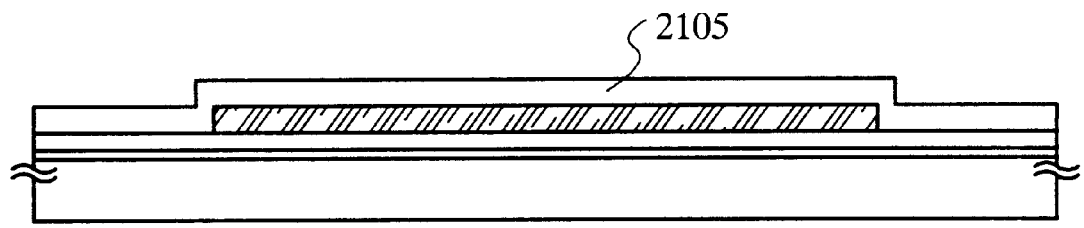

In this embodiment, a basic method of fabricating a first insulating layer and a semiconductor film as an active layer will be described. In FIGS. 21A to 21C, as a substrate 2101, a glass substrate, a ceramic substrate, a quartz substrate, etc. may be used. Besides, a silicon substrate or a metal substrate typified by stainless steel, each having a surface on which an insulating film such as a silicon oxide film or a silicon nitride film is formed, may be used. In the case of using a glass substrate, it is desirable to previously carry out a heat treatment at a temperature below a distortion point. For example, in a case of using a #1737 substrate of Corning Inc., it is appropriate that a heat treatment at 500 to 650° C., preferably 595 to 645° C. for 1 to 24 hours is carried out in advance.

A first insulating layer 2102 was formed on the main surface of the substrate 2101. Here, a silicon nitride oxide film 2102a having tensile stress and a silicon nitride oxide film 2102b were formed. Any film may be used for the first insulating layer as long as the film has tensile stress, and the first insulating layer may be formed of a layer or plural layers selected from a silicon nitride film, a silicon oxide film, a silicon nitride oxide film, and a tantalum oxide film other than the former film. These films may be formed by a well-known plasma CVD method or a sputtering method. In the case of using the silicon nitride oxide film, it is appropriate that the film is formed to a thickness of 20 to 100 nm, typically 50 nm. A silicon nitride oxide film may be formed to a thickness of 50 to 500 nm, typically 50 to 200 nm on this silicon nitride film. An amorphous semiconductor layer 2103 was formed on the first insulating layer. This may be an amorphous semiconductor formed by a film growth method such as a plasma CVD method, a low pressure CVD method or a sputtering method. As the semiconductor, silicon (Si), germanium (Ge), silicon germanium alloy, and silicon carbide can be enumerated, and in addition, a compound semiconductor material such as gallium arsenide may be used. The semiconductor film was formed to a thickness of 10 to 100 nm, typically 50 nm. The first insulating layer and the amorphous semiconductor layer 2103 can also be formed continuously by a plasma CVD method or a sputtering method. After the respective layers are formed, the surfaces do not come to contact with the air, so that the pollution of the surfaces can be prevented (FIG. 21A).

Next, a crystallizing step was carried out. The step of crystallizing the amorphous semiconductor layer may use a technique of a well-known laser annealing method or a thermal annealing method. In all events, as the phase of the semiconductor layer was changed from an amorphous state to a crystalline state, densification and volume contraction occurred, so that tensile stress was generated in the crystalline semiconductor layer 2104. Hydrogen at a rate of 10 to 40 atomic % was contained in an amorphous semiconductor film fabricated by a plasma CVD method, and it was desirable that a heat treatment at 400 to 500° C. was carried out prior to the crystallizing step to remove hydrogen from the film so that the hydrogen content was made 5 atomic % or less. When hydrogen was released, tensile stress was generated consequently (FIG. 21B).

A second insulating layer 2105 having compressive stress was formed to be in contact with the crystalline semiconductor layer 2104. The second insulating layer 2105 may be formed of a layer or plural layers selected from a silicon nitride film, a silicon oxide film, a silicon nitride oxide film, and a tantalum oxide film. It is appropriate that the thickness of the second insulating layer 2105 is 10 to 1000 nm, preferably 50 to 400 nm (FIG. 21C).

It was possible to cause a silicon nitride film, a silicon oxide film, a silicon nitride oxide film, and a tantalum oxide film applied to the first insulating layer 2102 and the second insulating layer 2105 to have stresses of both states of tensile stress and compressive stress according to the fabricating condition. For that purpose, it was sufficient if a mixture ratio of used gases, a substrate temperature at film formation, a film formation rate, and the like were suitably determined. Such fabricating conditions were different among individual apparatuses to be used. It was also possible to change a film having compressive stress to a film having tensile stress by applying a step of heat treatment. The crystalline semiconductor layer formed from the amorphous semiconductor layer with volume contraction had a tensile stress of $1\times10^8$ to $1\times10^9$ Pa. To such a crystalline semiconductor layer, it was desirable that a difference in absolute values of internal stresses of the first insulating layer and the second insulating layer was made $5\times10^9$ Pa or less. As described above, when such a structure was formed that the crystalline semiconductor layer 2104 having tensile stress was provided to be in close contact with the first insulating layer 2102 having tensile stress and the second insulating layer 2105 having compressive stress, and further, the TFT was fabricated by using a well-known technique so that the crystalline semiconductor layer 2104 became the active layer, it was possible to obtain excellent characteristics. At this time, it was preferable that the sum of the internal stresses of the laminated crystalline semiconductor layer and the insulating layer was made $1\times10^9$ Pa or less in absolute value. For example, it was also possible to make the field effect mobility of an n-channel TFT 100 cm$^2$/V·sec or more. It was also possible to improve the resistance against stress due to heat or voltage application.

Figure 22A:
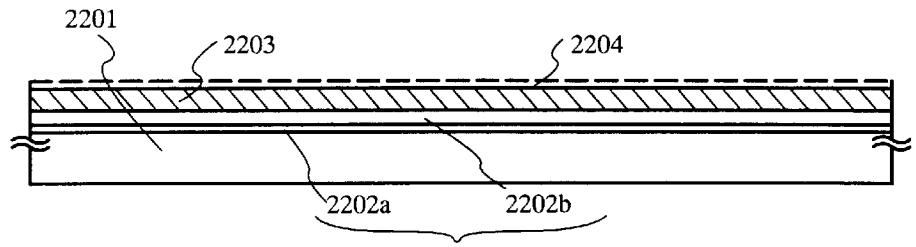
FIGS. 22A to 22E are views for explaining Embodiment 6 of the present invention.

FIGS. 22A to 22E show another example, in which a nitrogen-rich silicon nitride oxide film 2202a having tensile stress and a silicon nitride oxide film 2202b were formed as a first insulating layer 2202 on the main surface of a substrate 2201. Similarly to FIGS. 21A to 21C, an amorphous semiconductor layer 2203 was formed on the surface of the first insulating layer. The thickness of the amorphous semiconductor layer may be 10 to 200 nm, preferably 30 to 100 nm. Further, a solution containing a catalytic element of 10 ppm in terms of weight was applied by a spin coating method, so that a catalytic element containing layer 2204 was formed on the whole surface of the amorphous semiconductor layer 2203. As the catalytic element usable here, in addition to nickel (Ni), an element such as germanium (Ge), iron (Fe), palladium (Pd), tin (Sn), lead (Pb), cobalt (Co), platinum (Pt), copper (Cu), or gold (Au) may be used. The internal stress of the amorphous semiconductor layer was not determined uniquely by fabricating conditions. However, when a step of heat treatment at 400 to 600°0 C. was carried out prior to a step of crystallization to remove hydrogen from the film, tensile stress was generated. At the same time, since hydrogen was removed also from the first insulating layer, the tensile stress was strengthened as well (FIG. 22A).

Figure 22B:
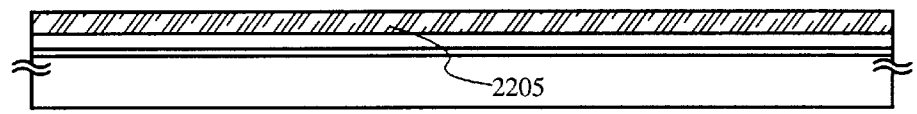

Then, a crystallizing step of carrying out a heat treatment at 500 to 600° C. for 4 to 12 hours, for example, at 550° C. for 8 hours was carried out, so that a crystalline semiconductor layer 2205 was formed (FIG. 22B).

Figure 22C:
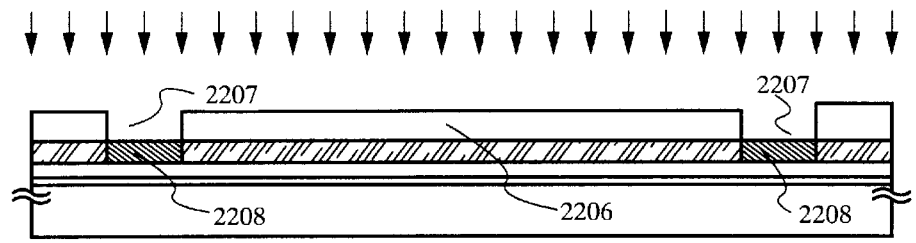

Next, a step of removing the catalytic element used in the crystallizing step from the crystalline semiconductor film was carried out. As a method thereof, this embodiment used a technique disclosed in Japanese Patent Laid-Open No. Hei. 10-247735, No. Hei. 10-135468, or No. Hei. 10-135469. The technique disclosed in the publications is such that a catalytic element is removed by using a gettering function of phosphorus. By this gettering step, it was possible to reduce the concentration of the catalytic element in the crystalline semiconductor film to $1 \times 10^{17}$ atoms/cm$^3$ or less, preferably $1 \times 10^{16}$ atoms/cm$^3$ or less. First, a mask insulating film 2206 was formed to a thickness of 150 nm on the surface of the crystalline semiconductor layer 2205, and an opening portion 2207 was provided by patterning, so that a region where the crystalline semiconductor layer was exposed was provided. Then, a step of adding phosphorus was carried out, so that a phosphorus containing region 2208 was provided in the crystalline semiconductor layer (FIG. 22C).

Figure 22D:
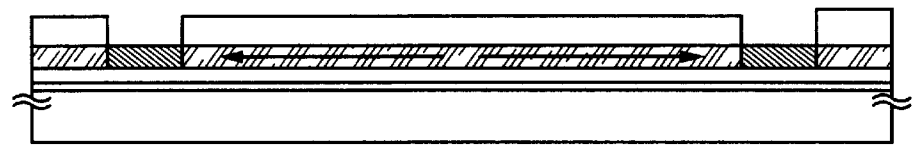

In this state, when a heat treatment at 550 to 800° C. for 5 to 24 hours, for example, at 600° C. for 12 hours was carried out in a nitrogen atmosphere, the phosphorus containing region 2208 functioned as a gettering site, so that it was possible to segregate the catalytic element remaining in the crystalline silicon layer 2205 into the phosphorus containing region 2208 (FIG. 22D).

Figure 22E:
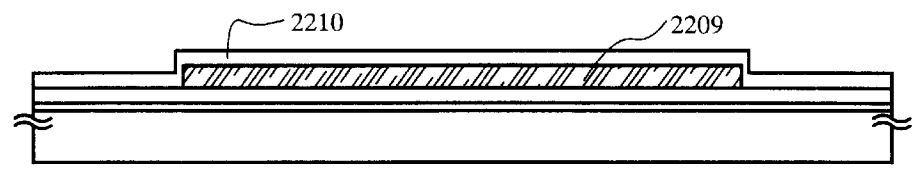

Then, by carrying out etching to remove the mask insulating film 2206 and the phosphorus containing region 2208, it was possible to obtain a crystalline semiconductor film in which the concentration of the catalytic element used in the step of crystallization was reduced to $1 \times 10^{17}$ atoms/cm$^3$ or less. Then, a second insulating layer 2210 having compressive stress was formed to be in close contact with the crystalline semiconductor layer 2209. The second insulating layer 2210 may be formed of a layer or plural layers selected from a silicon nitride film, a silicon oxide film, a silicon nitride oxide film, and a tantalum oxide film. It is appropriate that the thickness of the second insulating layer 2210 is 10 to 1000 nm, preferably 50 to 400 nm (FIG. 22E).

As described above, when such a structure was formed that the crystalline semiconductor layer 2209 having the tensile stress was provided to be in close contact with the first insulating layer 2202 having the tensile stress and the second insulating layer 2210 having the compressive stress, and then, a TFT including the crystalline semiconductor layer 2209 as an active layer was fabricated by using a well-known technique, it was possible to obtain excellent characteristics. At this time, it was preferable that the sum of the internal stresses of the laminated crystalline semiconductor layer and the insulating layer was made $1 \times 10^{19}$ Pa or less in absolute value. For example, it was also possible to make the field effect mobility of an n-channel TFT 200 cm$^2$/V·sec or more.

Figure 23A:
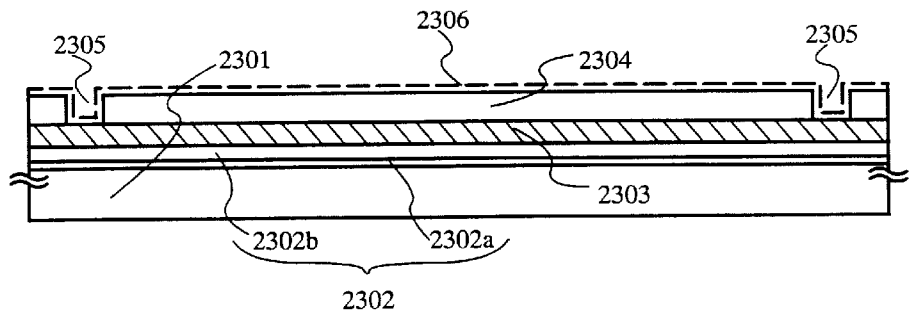
FIGS. 23A to 23E are views for explaining Embodiment 6 of the present invention.

In FIGS. 23A to 23E, a first insulating layer 2302 having tensile stress, which comprises two films 2302a and 2302b, and an amorphous semiconductor layer 2303 were formed on the main surface of a substrate 2301. Then, a mask insulating film 2304 was formed on the surface of the amorphous semiconductor layer 2303. At this time, the thickness of the mask insulating film 2304 was set to 150 nm. Further, the mask insulating film 2304 was patterned to selectively form an opening portion 2305, and then, a solution containing a catalytic element of 10 ppm in terms of weight was applied. By this, a catalytic element containing layer 2306 was formed. The catalytic element containing layer 2306 was in contact with the amorphous semiconductor layer 2303 at only the opening portion 2305 (FIG. 23A).

Figure 23B:
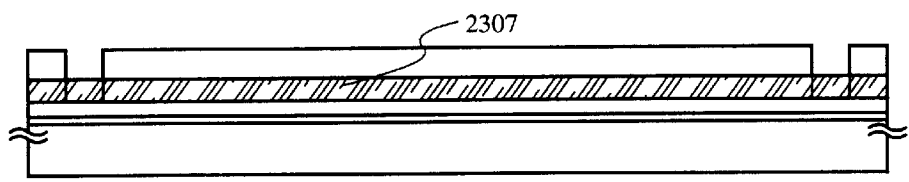

Next, a heat treatment at 500 to 650° C. for 4 to 24 hours, for example, at 570° C. for 14 hours was carried out, so that a crystalline semiconductor layer 2307 was formed. In the process of this crystallization, a region of the amorphous semiconductor layer with which the catalytic element was in contact was first crystallized, and crystal growth progressed in the lateral direction therefrom. The thus formed crystalline semiconductor film 2307 was made of a collective of rod-like or needle-like crystals, and the respective crystals macroscopically grew with certain directionality. Thus, there was an advantage that crystallinity was uniform (FIG. 23B).

Figure 23C:
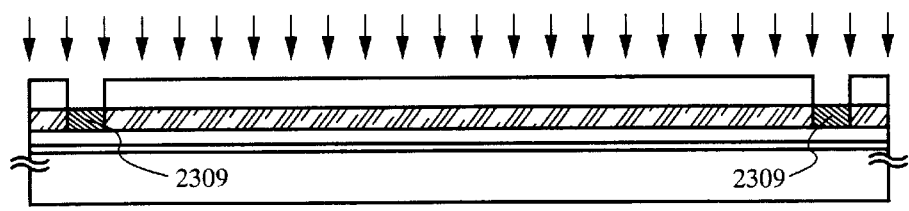
Figure 23D:
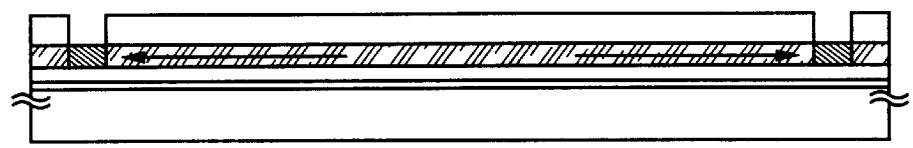

Next, similarly to FIGS. 22A to 22E, a step of removing the catalytic element used in the step of crystallization from the crystalline semiconductor film was carried out. A step of adding phosphorus to the substrate in the same state as FIG. 23B was carried out, so that a phosphorus containing region 2309 was provided in the crystalline semiconductor layer. The concentration of phosphorus in this region was set to $1 \times 10^{19}$ to $1 \times 10^{21}$/cm$^3$ (FIG. 23C). In this state, when a heat treatment at 550 to 800° C. for 5 to 24 hours, for example, at 600° C. for 12 hours was carried out in a nitrogen atmosphere, the phosphorus containing region 2309 functioned as a gettering site, so that it was possible to segregate the catalytic element remaining in the crystalline semiconductor film 2307 into the phosphorus containing region 2309 (FIG. 23D).

Figure 23E:
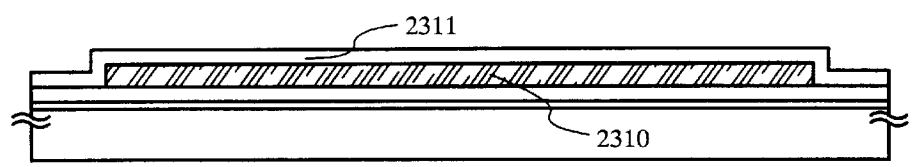
Figure 24A:
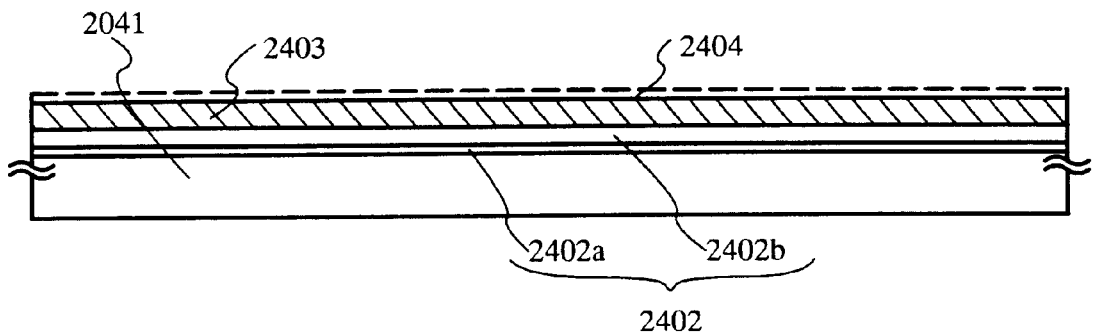
FIGS. 24A to 24D are views for explaining Embodiment 6 of the present invention.
Figure 24B:
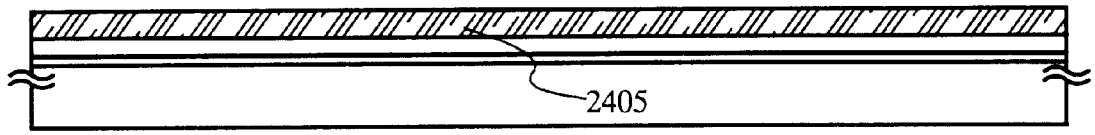
Figure 24C:
Figure 24D:
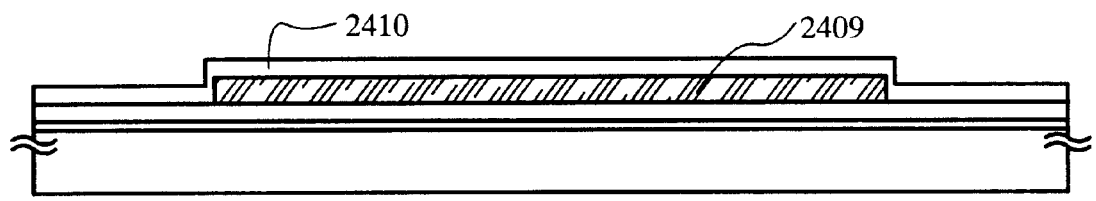

Then, the mask insulating film and the phosphorus containing region 2309 were removed by etching, so that an island-like crystalline semiconductor layer 2310 was formed. A second insulating layer 2311 having compressive stress was formed to be in close contact with the crystalline semiconductor layer 2310. The second insulating layer 2311 was formed of one layer or plural layers selected from a silicon oxide film and a silicon nitride oxide film. It is appropriate that the thickness of the second insulating layer 2311 is 10 to 100 nm, preferably 50 to 80 nm. Then, a heat treatment was carried out in an atmosphere containing halogen (typically chlorine) and oxygen. For example, the heat treatment was carried out at 950° C. for 30 minutes. Incidentally, it was appropriate that the processing temperature was selected within the range of 700 to 1100° C., and the processing time was selected within the range of 10 minutes to 8 hours. As a result, a thermal oxidation film was formed at the interface between the crystalline semiconductor layer 2310 and the second insulating layer 2311, so that the volume of the second insulating layer 2311 was further increased, and the compressive stress to the crystalline semiconductor layer was also further increased (FIG. 23E).

As described above, when such a structure was formed that the crystalline semiconductor layer 2310 having the tensile stress was provided to be in close contact with the first insulating layer 2302 having the tensile stress and the second insulating layer 2311 having the compressive stress, and then, a TFT including the crystalline semiconductor layer 2310 as an active layer was fabricated by using a well-known technique, it was possible to obtain excellent characteristics. For example, it was also possible to make the field effect mobility of an n-channel TFT 200 $cm^2/V \cdot sec$ or more.

In FIGS. 24A to 24D, similarly to FIGS. 22A to 22E, after a first insulating layer 2402 and a crystalline semiconductor layer 2405 are formed, a catalytic element remaining in the crystalline semiconductor layer 2405 can also be gettered in a liquid phase. For example, gettering can be made by using sulfuric acid as a solution and by dipping the substrate of the state of FIG. 24B into the sulfuric acid solution heated at 300 to 500° C. By this method, it was possible to remove the catalytic element remaining in the crystalline semiconductor layer 2405. In addition, a nitric acid solution, an aqua regia solution, or a tin solution may be used. Thereafter, an island-like semiconductor layer 2409 and a second insulating layer 2410 were formed.

Embodiment 7

In this embodiment, semiconductor devices each incorporating an active matrix type liquid crystal display device with a TFT circuit of the present invention will be described with reference to FIGS. 25A to 25F, FIGS. 32A to 32C, and FIGS. 33A to 33D.

As such semiconductor devices, a portable information terminal (an electronic notebook, a mobile computer, a portable telephone, etc.), a video camera, a still camera, a personal computer, a television, and the like can be enumerated. Examples of those are shown in FIGS. 25A to 25F and FIGS. 32A to 32C.

Figure 25A:
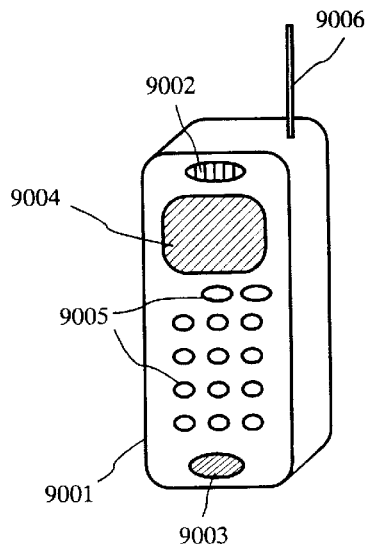
FIGS. 25A to 25F are views showing examples of semiconductor devices of Embodiment 7.

FIG. 25A shows a portable telephone which is constituted by a main body 9001, an audio output portion 9002, an audio input portion 9003, a display device 9004, an operation switch 9005, and an antenna 9006. The present invention can be applied to the audio output portion 9002, the audio input portion 9003, and the display device 9004 provided with an active matrix substrate.

Figure 25B:
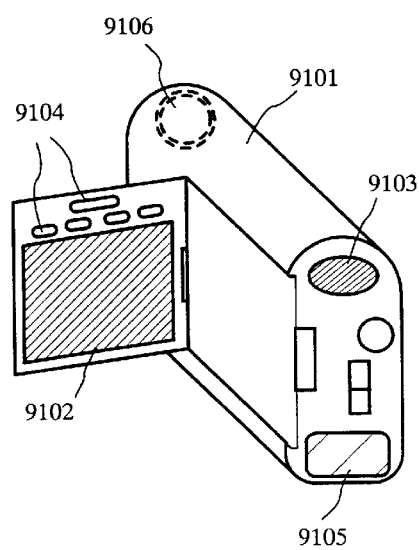

FIG. 25B shows a video camera which is constituted by a main body 9101, a display device 9102, an audio input portion 9103, an operation switch 9104, a battery 9105, and an image receiving portion 9106. The present invention can be applied to the audio input portion 9103, the display device 9102 provided with an active matrix substrate, and the image receiving portion 9106.

Figure 25C:
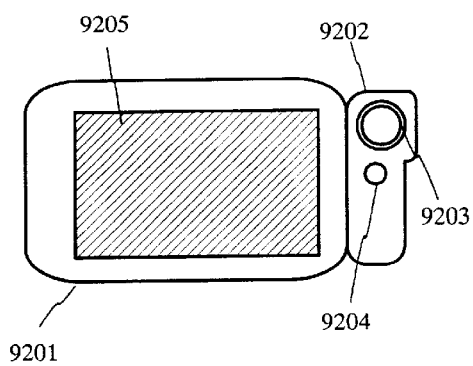

FIG. 25C shows a mobile computer or a portable information terminal which is constituted by a main body 9201, a camera portion 9202, an image receiving portion 9203, an operation switch 9204, and a display device 9205. The present invention can be applied to the image receiving portion 9203, and the display device 2205 provided with an active matrix substrate.

Figure 25D:
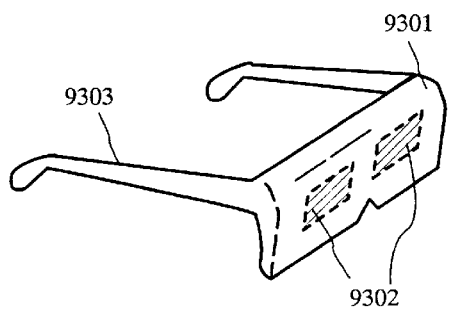

FIG. 25D shows a head mount display which is constituted by a main body 9301, a display device 9302, and an arm portion 9303. The present invention can be applied to the display device 9302. Although not shown, the present invention can also be used for other signal controlling circuits.

Figure 25E:
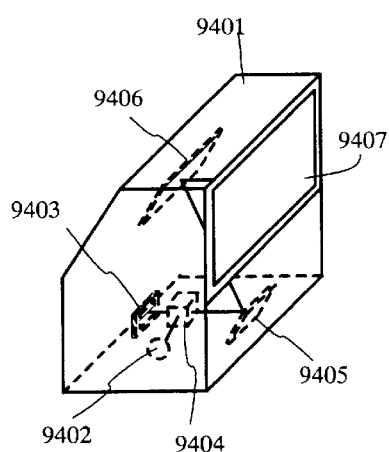

FIG. 25E shows a rear type projector which is constituted by a main body 9401, a light source 9402, a display device 9403, a polarization beam splitter 9404, reflectors 9405 and 9406, and a screen 9407. The present invention can be applied to the display device 9403.

Figure 25F:
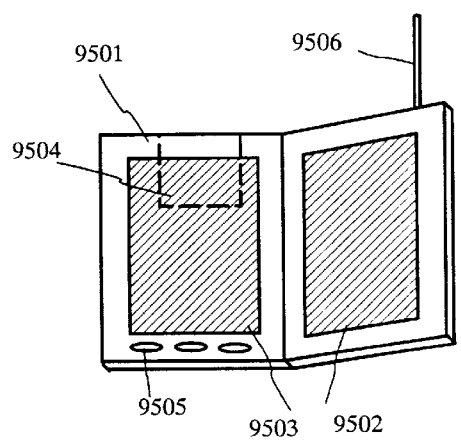

FIG. 25F shows an electronic portable book which is constituted by a main body 9501, display devices 9502 and 9503, a storage medium 9504, an operation switch 9505, and an antenna 9506, and is used to display data stored in a mini disk (MD) or DVD, or data received by the antenna. The display devices 9502 and 9503 are direct-view display devices, and the present invention can be applied to the devices.

Figure 32A:
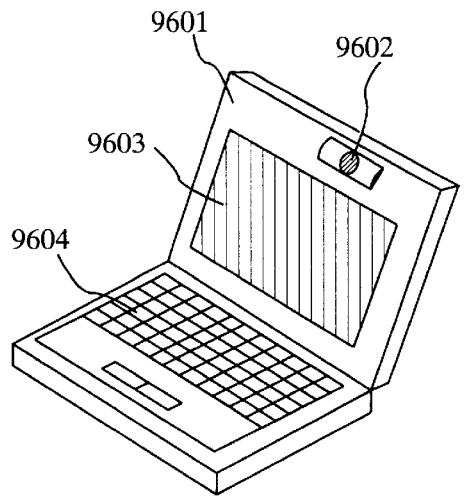
FIGS. 32A to 32C are views showing examples of semiconductor devices of Embodiment 7.

FIG. 32A shows a personal computer which is constituted by a main body 9601, an image input portion 9602, a display device 9603, and a keyboard 9604.

Figure 32B:
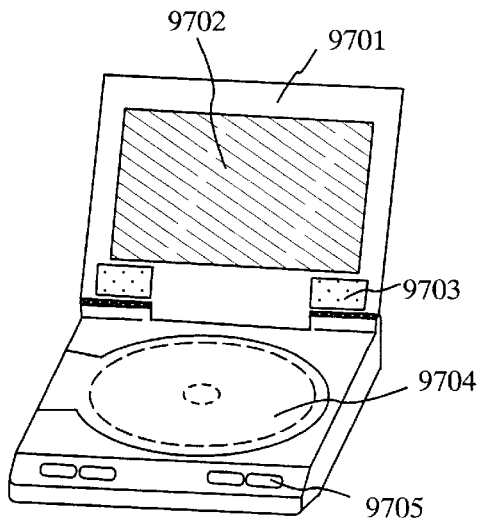

FIG. 32B shows a player using a recording medium recording a program (hereinafter referred to as a "recording medium"), which is constituted by a main body 9701, a display device 9702, a speaker portion 9703, a recording medium 9704, and an operation switch 9705. This apparatus uses a DVD (Digital Versatile Disc), CD, or the like as the recording medium, and appreciation of music, appreciation of movie, a game, or the Internet can be performed.

Figure 32C:
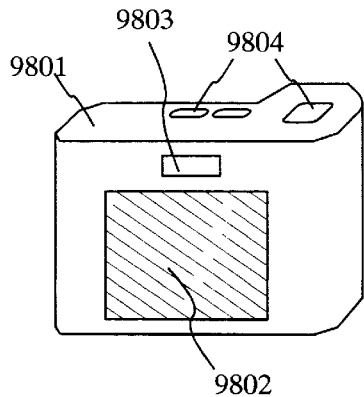

FIG. 32C shows a digital camera which is constituted by a main body 9801, a display device 9802, an eyepiece portion 9803, an operation switch 9804, and an image receiving portion (not shown).

FIG. 33A shows a front type projector which is constituted by a display device 3601 and a screen 3602. The present invention can be applied to the display device and other signal control circuits.

FIG. 33B shows another rear type projector which is constituted by a main body 3701, a display device 3702, a mirror 3703, and a screen 3704. The present invention can be applied to the display device and other signal control circuits.

FIG. 33C is a view showing an example of structures of the display devices 3601 and 3701 in FIG. 33A and FIG. 33B. Each of the display devices 3601 and 3702 is constituted by a light source optical system 3801, mirrors 3802, 3804 to 3806, a dichroic mirror 3803, a prism 3807, a liquid crystal display device 3808, a phase difference plate 3809, and a projection optical system 3810. The projection optical system 3810 is constituted by an optical system including a projection lens. Although this embodiment shows an example of a three-plate system, the invention is not particularly limited to this. For example, a single plate system may be used. Besides, in a light path indicated by an arrow in FIG. 33C, an operator may suitably provide an optical system such as an optical lens, a film having a polarizing function, a film for adjusting a phase difference, and an IR film.

FIG. 33D is a view showing an example of a structure of the light source optical system 3801 in FIG. 33C. In this embodiment, the light source optical system 3801 is constituted by a reflector 3811, a light source 3812, lens arrays 3813 and 3814, a polarization conversion element 3815, and a condensing lens 3816. The light source optical system shown in FIG. 33D is merely an example, and the invention is not particularly limited to this. For example, an operator may suitably provide an optical system such as an optical lens, a film having a polarizing function, a film for adjusting a phase difference, and an IR film.

Besides, in addition to the above, the present invention can also be applied to an image sensor or an EL display device. Like this, the scope of application of the present invention is extremely wide and the present invention can be applied to electronic equipments of any fields.

Embodiment 8

For the foregoing liquid crystal display device shown in the embodiment 5, various liquid crystals other than a nematic liquid crystal can be used. For example, it is possible to use a liquid crystal disclosed in 1998, SID, "Characteristics and Driving Scheme of Polymer-Stabilized Monostable FLCD Exhibiting Fast Response Time and High Contrast Ratio with Gray-Scale Capability" by H. Furue et al.; 1997, SID DIGEST, 841, "A Full-Color Thresholdless Antiferroelectric LCD Exhibiting Wide Viewing Angle with Fast Response Time" by T. Yoshida et al.; 1996, J. Mater. Chem. 6(4), 671–673, "Thresholdless antiferroelectricity in liquid crystals and its application to displays" by S. Inui et al.; or US Pat. No. 5,594,569.

Figure 26:
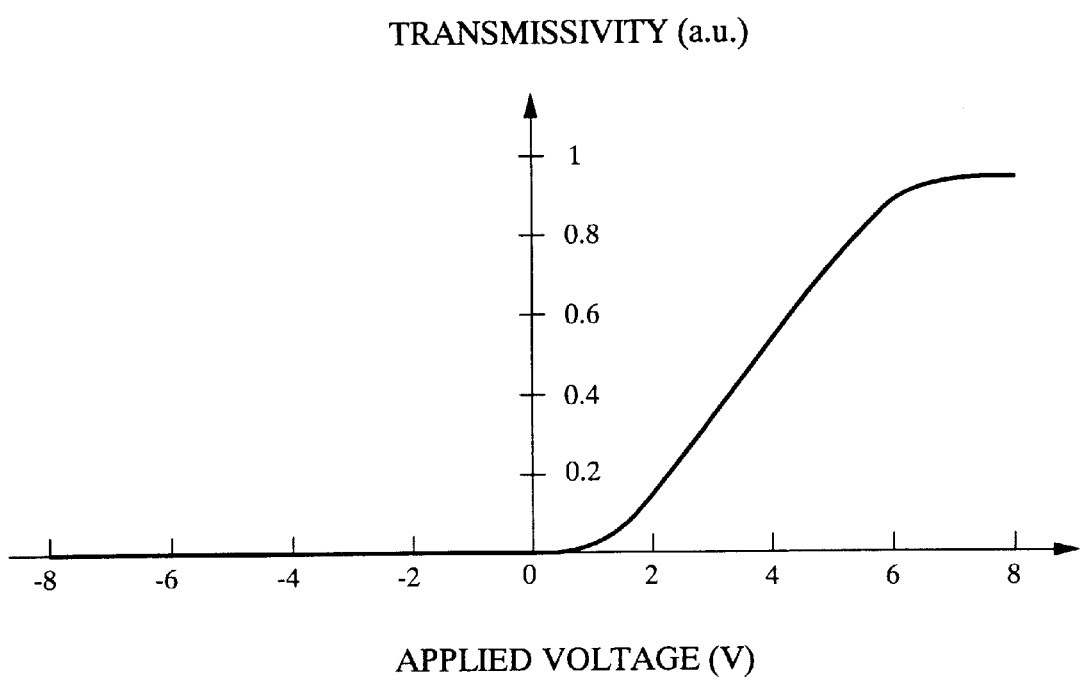
FIG. 26 is a view showing an example of light transmittance characteristics of an antiferroelectric mixed liquid crystal of Embodiment 8.

FIG. 26 shows electro-optical characteristics of single stable ferroelectric liquid crystal (FLC) in which the ferroelectric liquid crystal (FLC) exhibiting a transition series of isometric phase—cholesteric phase—chiral smectic C phase is used, transition of cholesteric phase—chiral smectic C phase is caused while applying a DC voltage, and a cone edge is made to almost coincide with a rubbing direction. A display mode by the ferroelectric liquid crystal as shown in FIG. 26 is called a "Half—V-shaped switching mode". The vertical axis of the graph shown in FIG. 26 indicates transmissivity (in an arbitrary unit) and the horizontal axis indicates applied voltage. The details of the "Half-V-shaped switching mode" are described in "Half-V-shaped switching mode FLCD" by Terada et al., Collection of Preliminary Papers for 46th Applied Physics Concerned Joint Lecture Meeting, March 1993, p. 1316, and "Time-division full-color LCD with ferroelectric liquid crystal" by Yoshihara et al., Liquid Crystal (Ekisho), Vol. 3, No. 3, p. 190.

As shown in FIG. 26, it is understood that when such a ferroelectric mixed liquid crystal is used, low voltage driving and gradation display become possible. For the liquid crystal display device of the present invention, it is also possible to use the ferroelectric liquid crystal exhibiting such electro-optical characteristics.

A liquid crystal exhibiting antiferroelectricity in some temperature range is called an antiferroelectric liquid crystal (AFLC). In mixed liquid crystals including the antiferroelectric liquid crystal, there is one called a thresholdless antiferroelectric mixed liquid crystal exhibiting electro-optical response characteristics in which transmittance is continuously changed with respect to an electric field. Some thresholdless antiferroelectric mixed liquid crystal exhibits the so-called V-shaped electro-optical response characteristics, and a liquid crystal in which its driving voltage is about ±2.5 V (cell thickness is about 1 $\mu$m to 2 $\mu$m) has also been found.

In general, the thresholdless antiferroelectric mixed liquid crystal has large spontaneous polarization, and the dielectric constant of the liquid crystal itself is high. Thus, in the case where the thresholdless antiferroelectric mixed liquid crystal is used for a liquid crystal display device, it becomes necessary to provide relatively large holding capacitance for a pixel. Thus, it is preferable to use the thresholdless antiferroelectric mixed liquid crystal having small spontaneous polarization.

Since low voltage driving can be realized by using such a thresholdless antiferroelectric mixed liquid crystal for the liquid crystal display device of the present invention, low power consumption can be realized.

Embodiment 9

In this embodiment, an example of an active matrix substrate different in structure from the embodiment 4 will be described with reference to FIG. 31. First, in accordance with the embodiment 4, steps from FIG. 11A to FIG. 12C are carried out.

After steps to FIG. 12C were completed, a step of forming first interlayer insulating films 3147 and 3148 was carried out. First, the silicon nitride film 3147 was formed to a thickness of 50 nm. The silicon nitride film 3147 was formed by a plasma CVD method, and the film formation rate was controlled by changing a high frequency electric power so that it was possible to give compressive stress. The silicon nitride oxide film 3148 was formed to a thickness of 950 nm from a mixture gas of $SiH_4$ and $N_2O$.

Then, a step of heat treatment was carried out. The step of heat treatment was necessary for activating impurity elements added at each concentration to give the n-type or p-type. Here, the step of activation was carried out by a thermal annealing method. The heat treatment was carried out in a nitrogen atmosphere at 300 to 700° C., preferably 350 to 550° C., here, 450° C. for 2 hours.

Thereafter, the first interlayer insulating films 3147 and 3148 were patterned so that contact holes reaching a source region and a drain region of each TFT were formed. Then, source electrodes 3149, 3150, and 3151, and drain electrodes 3152 and 3153 were formed. Although not shown, in this embodiment, each of the electrodes was employed as a three-layer electrode in which a Ti film having a thickness of 100 nm, an Al film containing Ti and having a thickness of 300 nm, and a Ti film having a thickness of 150 nm were continuously formed by a sputtering method.

Through the above steps, a channel formation region 3157, first impurity regions 3160 and 3161, and second impurity regions 3158 and 3159 were formed in the n-channel TFT of the CMOS circuit. Here, in the second impurity regions, regions (GOLD regions) 3158a and 3159a overlapping with the gate electrode and regions (LDD regions) 3158b and 3159b not overlapping with the gate electrode were formed, respectively. The first impurity region 3160 became a source region, and the first impurity region 3161 became a drain region.

In the p-channel TFT, a channel formation region 3154, and third impurity regions 3155 and 3156 were formed. The third impurity region 3155 became a source region, and the third impurity region 3156 became a drain region.

The pixel TFT had a multi-gate structure, and channel formation regions 3162 and 3163, first impurity regions 3168, 3169 and 3145, and second impurity regions 3164 to 3167 were formed. In the second impurity regions, regions 3164a, 3165a, 3166a, and 3167a overlapping with the gate electrodes, and regions 3164b, 3165b, 3166b, and 3167b not overlapping with the gate electrodes were formed.

Figure 31:
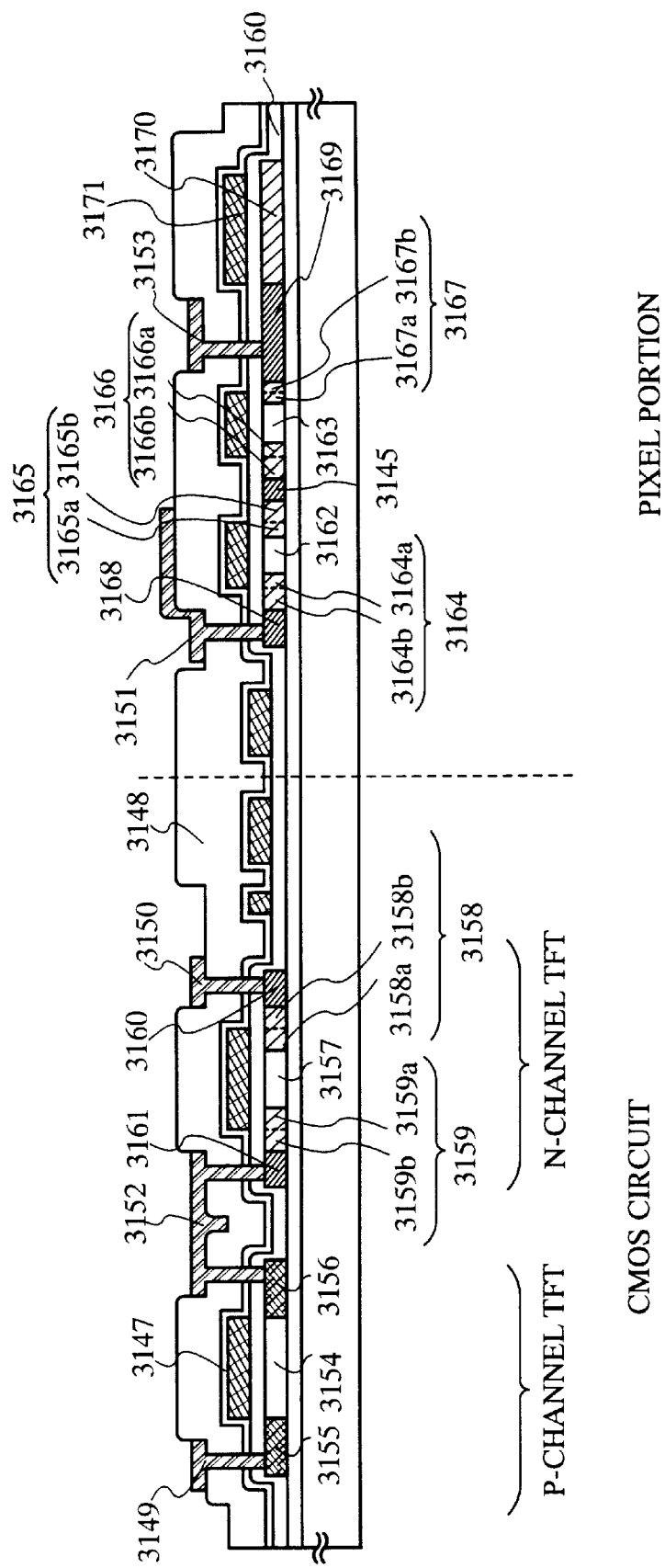
FIG. 31 is a view showing an example of a semiconductor device of Embodiment 9.

In this way, as shown in FIG. 31, the active matrix substrate in which the CMOS circuit and the pixel portion were formed on the substrate 3101 was fabricated. At the drain side of the pixel TFT, a low concentration impurity region 3170 in which an impurity element to give the n-type was added at the same concentration as the second impurity region, a gate insulating film 3106, and a holding capacitance electrode 3171 were formed, and a holding capacitance provided in the pixel portion was formed at the same time.

As in this embodiment, by providing the layer made of the silicon nitride film in the first interlayer insulating films, the compressive stress can be more effectively given. However, since transmittance of short wavelength light not longer than 500 nm is lowered in the silicon nitride film, if the film is formed to be excessively thick, the transmittance is lowered at the pixel portion, which is not preferable. Thus, the silicon nitride film of the first interlayer insulating film is formed to a thickness of 20 to 100 nm, preferably 30 to 60 nm.

Embodiment 10

Figure 27A:
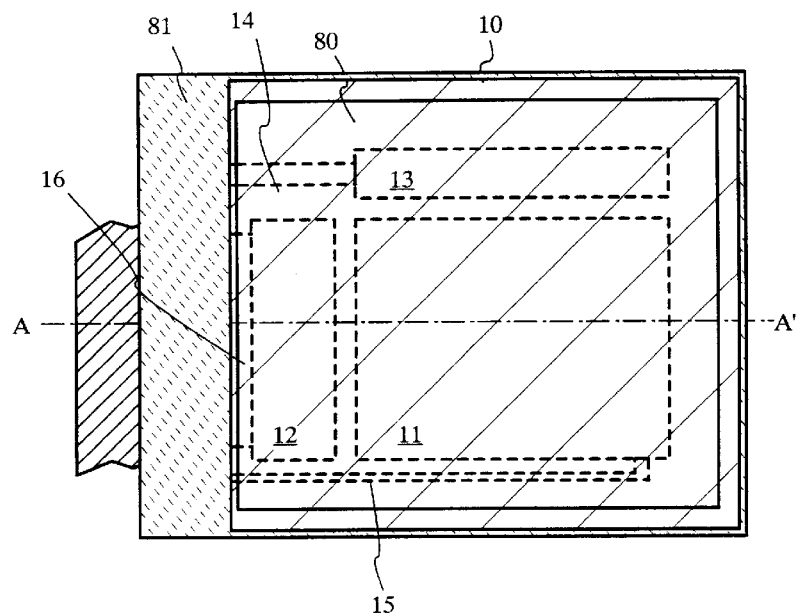
FIGS. 27A and 27B are a top view and a sectional view showing a structure of an EL display device of Embodiment 10.

In this embodiment, a description will be made on an example in which an EL (electroluminescence) display panel (also called an EL display device) is fabricated by using the present invention. FIG. 27A is a top view of an EL display panel using the present invention. In FIG. 27A, reference numeral 10 designates a substrate; 11, a pixel portion; 12, a data line side driver circuit; and 13, a scanning line side driver circuit. The respective driver circuits lead to an FPC 17 through wirings 14 to 16 and are connected to an external equipment.

At this time, a sealing material 19 is provided so as to surround at least the pixel portion, preferably the driver circuits and the pixel portion. Then, sealing is made by an opposite plate 80. As the opposite plate 80, a glass plate or a plastic plate may be used. An adhesive 81 is further provided at the outside of the sealing material 19, so that the substrate 10 and the opposite plate 80 are strongly bonded to each other, and corrosion of an inside device by intrusion of moisture and the like from a bonded end surface is prevented. In this way, a sealed space is formed between the substrate 10 and the opposite plate 80. At this time, an EL device is put in such a state that it is completely enclosed in the sealed space, and it is completely insulated from the outer air. Further, a sealing resin 83 is filled between the substrate 10 and the opposite plate 80. As the sealing resin 83, an organic resin material selected from silicone based material, epoxy based material, acryl based material, phenol based material, and the like is used. This improves the effect to prevent deterioration of the EL device due to moisture or the like.

Figure 27B:
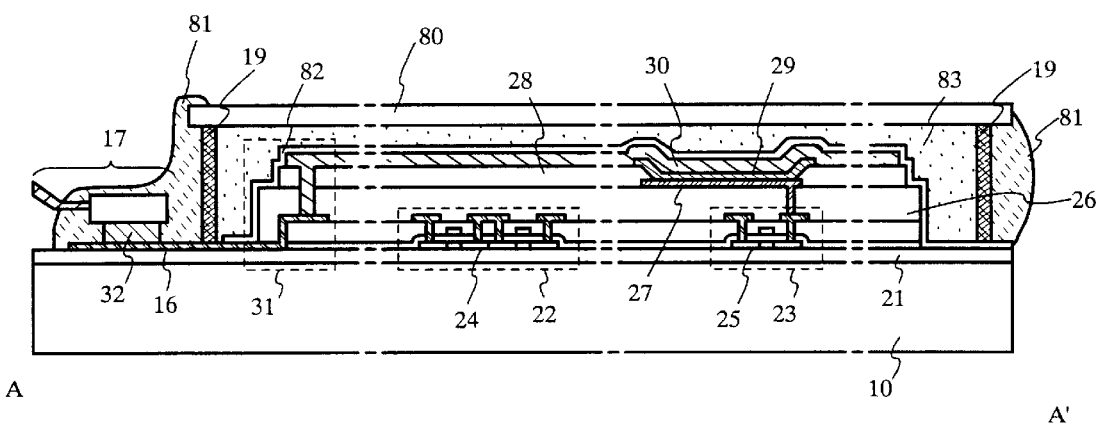

FIG. 27B is a view showing a sectional structure of an EL display panel of this embodiment. A driver circuit TFT 22 (here, a CMOS circuit in which an n-channel TFT and a p-channel TFT are combined is shown) and a pixel portion TFT 23 (here, only a TFT for controlling current to an EL device is shown) are formed on an under film 21 of a substrate 10. As the driver circuit TFT 22, an n-channel TFT or a p-channel TFT for a CMOS circuit shown in FIG. 13B in the embodiment 5 may be used. As the pixel portion TFT 23, a pixel TFT shown in FIG. 13B may be used.

An interlayer insulating film (flattening film) 26 made of a resin material, and a pixel electrode 27 made of a transparent conductive film electrically connected with a drain of the pixel portion TFT 23 are formed on the driver circuit TFT 22 and the pixel portion TFT 23. As the transparent electrode, a compound (called ITO) of indium oxide and tin oxide or a compound of indium oxide and zinc oxide may be used. After the pixel electrode 27 is formed, an insulating film 28 is formed, and an opening portion is formed on the pixel electrode 27.

Next, an EL layer 29 is formed. The EL layer 29 may be made of a laminate structure by freely combining well-known EL materials (a hole injection layer, a hole transport layer, a light emitting layer, an electron transport layer, or an electron injection layer) or a single-layer structure. A well-known technique may be used to determine what structure is formed. The EL material includes a low molecular material and a high molecular (polymer) material. In the case where the low molecular material is used, an evaporation method is used. In the case where the high molecular material is used, it is possible to use a simple method such as a spin coating method, a printing method, or an ink jet method.

In this embodiment, the EL layer is formed by using a shadow mask and by an evaporation method. A light-emitting layer (a red light-emitting layer, a green light-emitting layer, and a blue light-emitting layer) capable of emitting light with different wavelengths is formed for every pixel by using the shadow mask, so that color display becomes possible. In addition to that, there are a system in which a color conversion layer (CCM) and a color filter are combined, and a system in which a white light-emitting layer and a color filter are combined, and any of the methods may be used. Of course, an EL display device of monochromatic emission of light may be made.

After the EL layer 29 is formed, a cathode 30 is formed thereon. It is desirable that moisture and oxygen existing at the interface between the cathode 30 and the EL layer 29 is removed to the utmost degree. Thus, such contrivance is necessary that the EL layer 29 and the cathode 30 are continuously formed in vacuum, or the EL layer 29 is formed in an inert gas atmosphere and the cathode 30 is formed without opening to the air. In this embodiment, a multi-chamber system (cluster tool system) film forming apparatus is used so that the foregoing film formation is made possible.

In this embodiment, a laminate structure of a LiF (lithium fluoride) film and an Al (aluminum) film is used for the cathode 30. Specifically, a LiF (lithium fluoride) film having a thickness of 1 nm is formed on the EL layer 29 by an evaporation method, and an aluminum film having a thickness of 300 nm is formed thereon. Of course, a MgAg electrode of a well-known cathode material may be used. The cathode 30 is connected to the wiring 16 in a region designated by 31. The wiring 16 is a power source supply line for supplying a predetermined voltage to the cathode 30, and is connected to the FPC 17 through a conductive paste material 32.

For the purpose of electrically connecting the cathode 30 to the wiring 16 in the region 31, it is necessary to form a contact hole in the interlayer insulating film 26 and the insulating film 28. This may be formed at the time of etching of the interlayer insulating film 26 (at the time of formation of the contact hole for the pixel electrode) and at the time of etching of the insulating film 28 (at the time of formation of the opening portion prior to the formation of the EL layer). Besides, when the insulating film 28 is etched, the interlayer insulating film 26 may also be etched at the same time. In this case, if the interlayer insulating film 26 and the insulating film 28 are made of the same resin material, the shape of the contact hole can be made excellent.

The wiring 16 is electrically connected to the FPC 17 through the gap (it is filled with the adhesive 81) between the sealing material 19 and the substrate 10. Although the description has been made on the wiring 16, the other wirings 14 and 15 are also electrically connected to the FPC 17 through the portion under the sealing material 19 in the same manner.

Figure 28A:
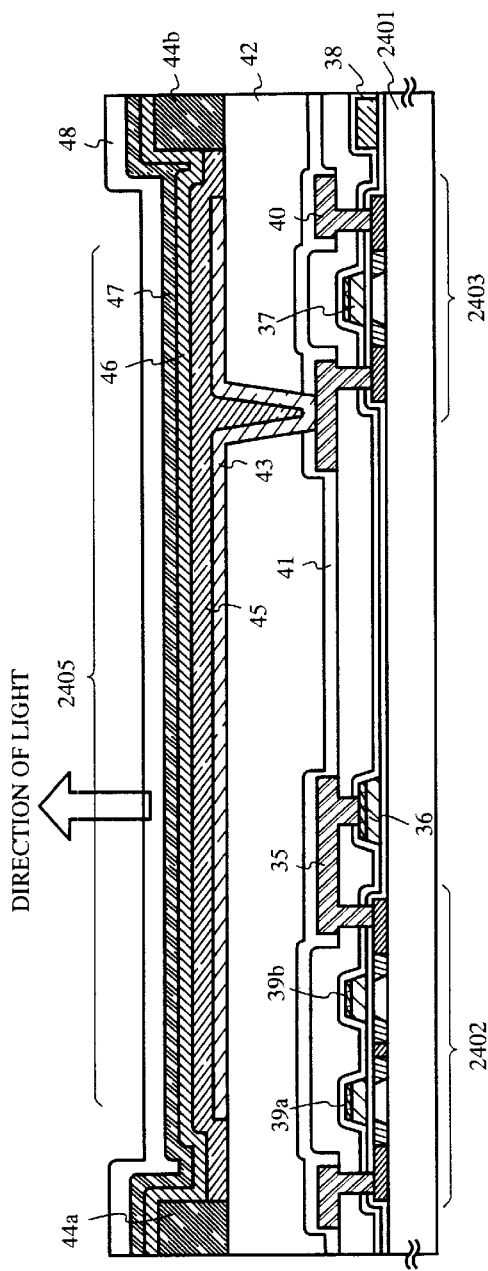
FIGS. 28A and 28B are sectional views of pixel portions of EL display devices of Embodiments 10 and 11, respectively.
Figure 29A:
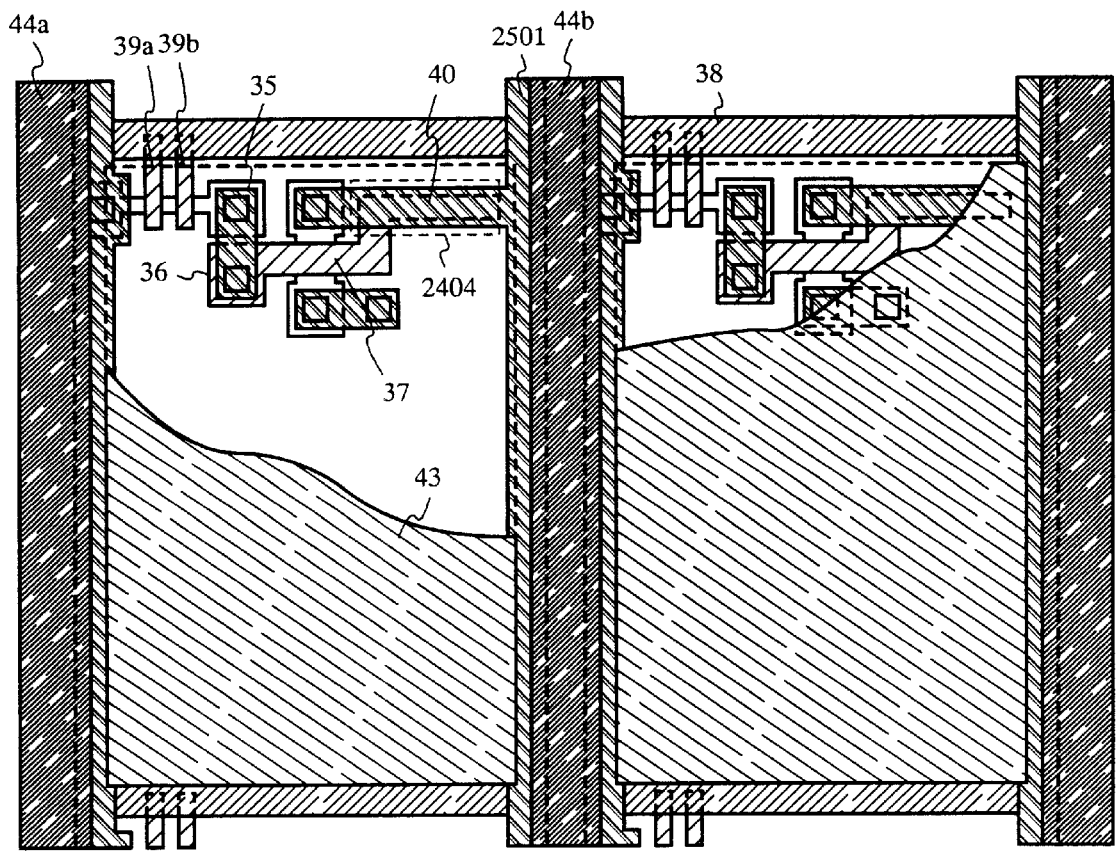
FIGS. 29A and 29B are a top view and a circuit diagram of a pixel portion of an EL display device of Embodiment 10.
Figure 29B:
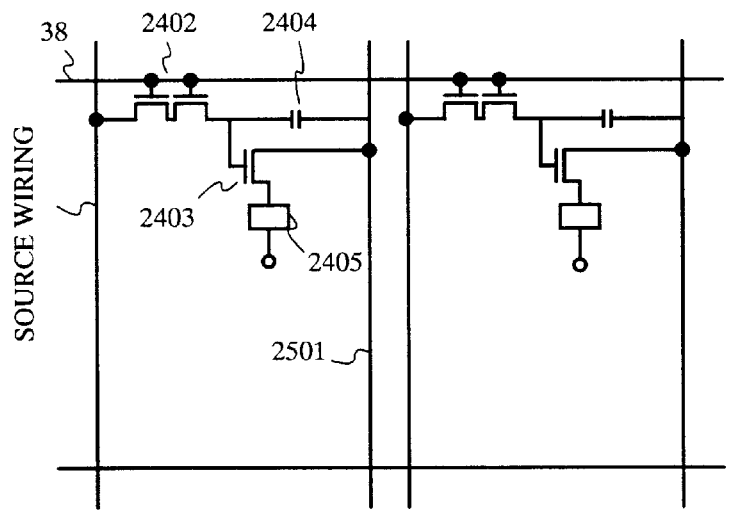

In the EL display panel having the structure as described above, the present invention can be used. Here, an example of a more detailed sectional structure of a pixel portion is shown in FIG. 28A, a top structure is shown in FIG. 29A, and a circuit diagram is shown in FIG. 29B. Since common reference numerals are used in FIGS. 28A, 29A, and 29B, they may be referred to one another. Incidentally, FIGS. 28A, 29A, and 29B merely show an example of a pixel portion, and it is needless to say that the present invention is not limited to the structure.

In FIG. 28A, a switching TFT 2402 provided on a substrate 2401 is formed using an n-channel TFT of the present invention (for example, a TFT of Embodiment Mode 1 shown in FIGS. 1A to 1C). Although this embodiment adopts a double gate structure, since a large difference does not exist in structure and fabricating process, the explanation is omitted. However, by making the double gate structure, such a structure is formed that two TFTs are substantially connected in series to each other. Thus, there is a merit that an off current value can be reduced. Although the double gate structure is adopted in this embodiment, a single gate structure may be adopted, or a triple gate structure or a multi-gate structure having more gates may be adopted. Alternatively, the TFT may be formed of a p-channel TFT of the present invention.

A current controlling TFT 2403 is formed using an n-channel TFT of the present invention. At this time, a drain wiring 35 of the switching TFT 2402 is electrically connected to a gate electrode 37 of the current controlling TFT. A wiring designated by 38 is a gate wiring to electrically connect gate electrodes 39a and 39b of the switching TFT 2402.

If characteristics of the current controlling TFT 2403, such as a threshold voltage, on current, and subthreshold constant (S value), fluctuate for every pixel, the intensity of light emission of the EL device driven by current control fluctuates, and a disturbance occurs in image display. In order to decrease the fluctuation and to cause the threshold voltage and the like to be put within a predetermined range, it becomes necessary to use a TFT structure in which the stress balance is taken into consideration as in the present invention. Since the current controlling TFT is a device to control the amount of current flowing through the EL device, it is also such a device that a large current flows, so that there is a high possibility of occurrence of deterioration due to heat or deterioration due to hot carriers. Thus, it becomes necessary to make such a structure that an LDD region is provided at a drain side of the current controlling TFT so as to overlap with a gate electrode through a gate insulating film.

In this embodiment, although the current controlling TFT 2403 is shown as a single gate structure, a multi-gate structure in which a plurality of TFTs are connected in series with each other may be adopted. Further, such a structure may be adopted that a plurality of TFTs are connected in parallel with each other to substantially divide a channel formation region into plural regions, so that radiation of heat can be made at high efficiency. Such structure is effective as a countermeasure against deterioration due to heat. Like this, in the active matrix type EL display device, when the TFT described in the embodiment 3, embodiment 4, or embodiment 9 is used, excellent characteristics can be obtained. Alternatively, although not shown, the TFT of the inverted stagger type shown in the embodiment 1 or the embodiment 2 may be applied to the active matrix type EL display device of this embodiment.

Besides, as shown in FIG. 29A, a wiring which becomes the gate electrode 37 of the current controlling TFT 2403 is a region designated by 2404, and overlaps with a drain wiring 40 of the current controlling TFT 2403 through an insulating film. At this time, in the region designated by 2404, a capacitor is formed. This capacitor 2404 functions as a capacitor for holding a voltage applied to the gate of the current controlling TFT 2403. Note that a drain wiring is connected to a current supply line (power source line) 2501, and is always applied with a constant voltage.

A first passivation film 41 is provided on the switching TFT 2402 and the current controlling TFT 2403, and a flattening film 42 made of a resin insulating film is formed thereon. It is very important to flatten a step due to the TFT by using the flattening film 42. Since a subsequently formed EL layer is very thin, there is a case where poor light emission occurs due to the existence of the step. Thus, it is desirable to make flattening prior to formation of a pixel electrode so that the EL layer can be formed on the flattest possible surface.

Reference numeral 43 designates a pixel electrode (cathode of the EL device) made of a conductive film having high reflectivity, which is electrically connected to the drain of the current controlling TFT 2403. As the pixel electrode 43, it is preferable to use a low resistance conductive film such as an aluminum alloy film, a copper alloy film, or a silver alloy film, or a laminate film of those. Of course, a laminate structure to other conductive films may be adopted.

A light emitting layer 44 is formed in a groove (corresponding to a pixel) formed of banks 44a and 44b made of insulating films (preferably, resin). Although only one pixel is shown here, light emitting layers corresponding to the respective colors of R (Red), G (Green) and B (Blue) may be separately formed. As an organic EL material that constitutes a light emitting layer, π conjugated polymer material is used. As typical polymer materials, polyparaphenylene vinylene (PPV), polyvinylcarbazole (PVK), polyfluorene, and the like can be enumerated. Although various types exist for the PPV organic EL materials, for example, a material disclosed in "H. Shenk, H. Becker, O. Gelsen, E. Kluge, W. Kreuder, and H. Spreitzer, "Polymers for Light Emitting Diodes", Euro Display, Proceedings, 1999, p.33–37", or Japanese Patent Laid-Open No. Hei. 10-92576 may be used.

As a specific light emitting layer, it is appropriate that cyanopolyphenylene vinylene is used for a light emitting layer emitting a red light, polyphenylene vinylene is used for a light emitting layer emitting a green light, and polyphenylene vinylene or polyalkylphenylene is used for a light emitting layer emitting a blue light. It is appropriate that the film thickness is made 30 to 150 nm (preferably 40 to 100 nm). However, the above examples are only examples of organic EL materials capable of being used for the light emitting layer, and it is not necessary to limit the invention to those. The EL layer (layer in which light emission is made and carrier movement for that is made) may be formed by freely combining a light emitting layer, a charge transport layer, and a charge injection layer.

For example, although this embodiment shows an example in which a polymer material is used for the light emitting layer, a low molecular organic EL material may be used. It is also possible to use an inorganic resin material such as silicon carbide for the charge transport layer or the charge injection layer. As the organic EL material and the inorganic material, well-known materials can be used.

In this embodiment, the EL layer is made to have such a laminate structure that a hole injection layer 46 made of PEDOT (polythiophene) or PAni (polyaniline) is provided on a light emitting layer 45. An anode 47 made of a transparent conductive film is provided on the hole injection layer 46. In the case of this embodiment, since light produced in the light emitting layer 45 is emitted toward the upper surface side (toward a portion above the TFT), the anode must be translucent. As the transparent conductive film, although a compound of indium oxide and tin oxide or a compound of indium oxide and zinc oxide may be used, since it is formed after the light emitting layer and the hole injection layer having low heat resistance are formed, it is preferable that the transparent conductive film can be formed at the lowest possible temperature.

At the point when the anode 47 has been formed, an EL device 2405 is completed. Note that the EL device here indicates the pixel electrode (cathode) 43, the light emitting layer 45, the hole injection layer 46, and the capacitor formed at the anode 47. As shown in FIG. 29A, since the pixel electrode 43 roughly coincides with the area of a pixel, the whole pixel functions as the EL device. Thus, a usage efficiency of light emission is very high, and bright image display becomes possible.

In this embodiment, a second passivation film 48 is further provided on the anode 47. As the second passivation film 48, a silicon nitride film or a silicon nitride oxide film is preferable. This object is to isolate the EL device from the outside, which has both of a meaning to prevent deterioration due to oxidation of the organic EL material and a meaning to prevent degassing from the organic EL material. By this, the reliability of the EL display device can be raised.

As described above, the EL display panel of the present invention includes the pixel portion made of a pixel having the structure as shown in FIG. 28A, and includes the switching TFT which has a sufficiently low off current value and the current controlling TFT which is strong against hot carrier injection. Thus, the EL display panel having high reliability and enabling excellent image display can be obtained. Incidentally, in the structure of this embodiment, it is effective to use the EL display panel of this embodiment as the display portion of the electronic equipment of the embodiment 7.

Embodiment 11

Figure 28B:
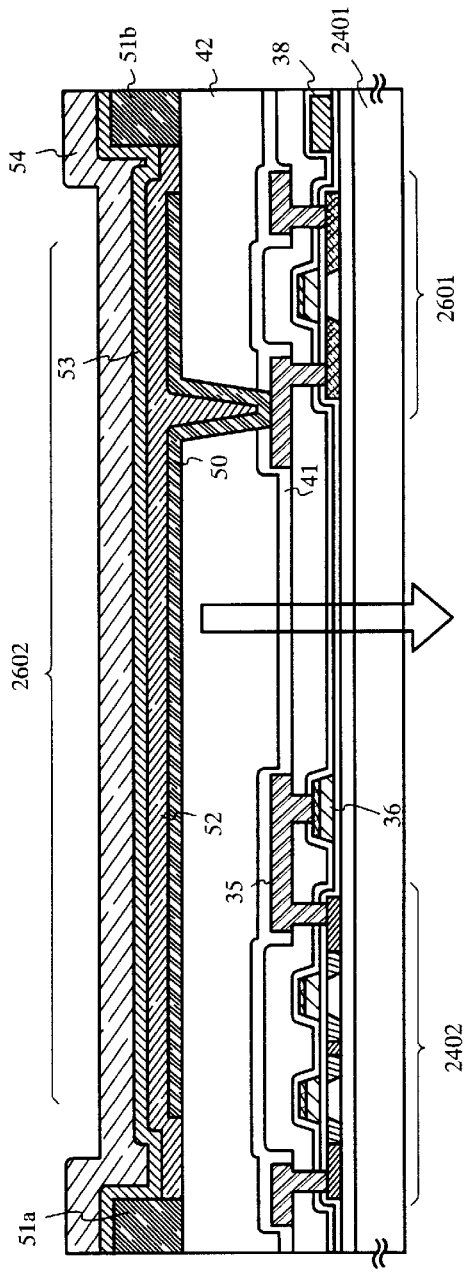

In this embodiment, a description will be made on a structure in which the structure of the EL device 2405 in the pixel portion shown in the embodiment 10 is inverted. FIG. 28B is used for the description. Incidentally, since different points from the structure of FIG. 28A are only a portion of an EL device and a current controlling TFT, the description of other portions is omitted.

In FIG. 28B, a current controlling TFT 2601 is formed by using a p-channel TFT of the present invention. Embodiments 3, 4 and 9 may be referred to for fabricating steps. In this embodiment, a transparent conductive film is used as a pixel electrode (anode) 50. Specifically, a conductive film made of a compound of indium oxide and zinc oxide is used. Of course, a conductive film made of a compound of indium oxide and tin oxide may be used.

After banks 51a and 51b made of an insulating film are formed, a light emitting layer 52 made of polyvinylcarbazole is formed by application of a solution. An electron injection layer 53 made of potassium acetylacetonate and a cathode 54 made of aluminum alloy are formed thereon. In this case, the cathode 54 functions also as a passivation film. In this way, an EL device 2602 is formed.

In the case of this embodiment, light generated in the light emitting layer 53 is emitted as indicated by an arrow toward the substrate on which TFTs are formed. In the case where the structure of this embodiment is adopted, it is preferable that the current controlling TFT 2601 is formed of a p-channel TFT. Incidentally, the structure of this embodiment can be freely combined with the structure of the embodiments 1 to 4 and 9. It is effective to use the EL display panel of this embodiment as the display portion of the electronic equipment of the embodiment 7.

Embodiment 12

In this embodiment, an example of a pixel having a structure different from the circuit diagram shown in FIG. 29B will be described with reference to FIGS. 30A to 30C. In this embodiment, reference numeral 2701 designates a source wiring of a switching TFT 2702; 2703, a gate wiring of the switching TFT 2702; 2704, a current controlling TFT; 2705, a capacitor; 2706, 2708, current supply lines; and 2707, an EL device.

Figure 30A:
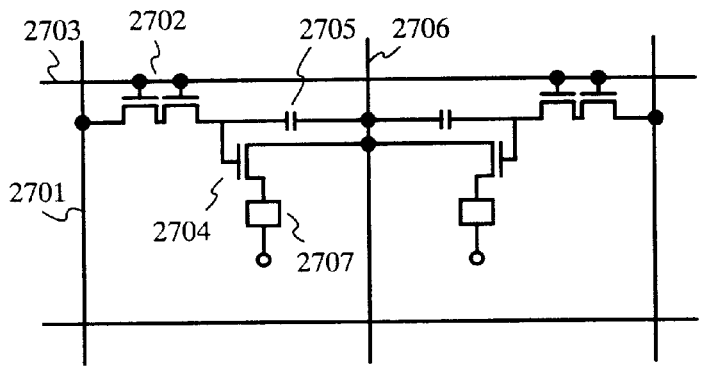
FIGS. 30A to 30C are circuit diagrams showing examples of pixel portions of EL display devices of Embodiment 12.

FIG. 30A shows an example of a case where a current supply line 2706 is common to two pixels. That is, this example is characterized in that two pixels are formed axisymmetrically with respect to the current supply line 2706. In this case, since the number of power supply lines can be reduced, the pixel portion can be further made fine.

Figure 30B:
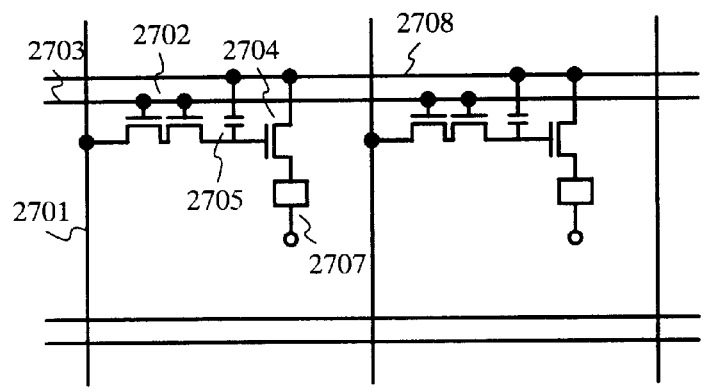

FIG. 30B shows an example of a case where a current supply line 2708 is provided in parallel with a gate wiring 2703. Although FIG. 30B shows a structure in which the current supply line 2708 and the gate wiring 2703 are provided so that they do not overlap with each other, if both are wirings formed in different layers, it is also possible to provide them so that they overlap with each other through an insulating film. In this case, since an occupied area can be made common to the power supply line 2708 and the gate wiring 2703, the pixel portion can be made further fine.

Figure 30C:
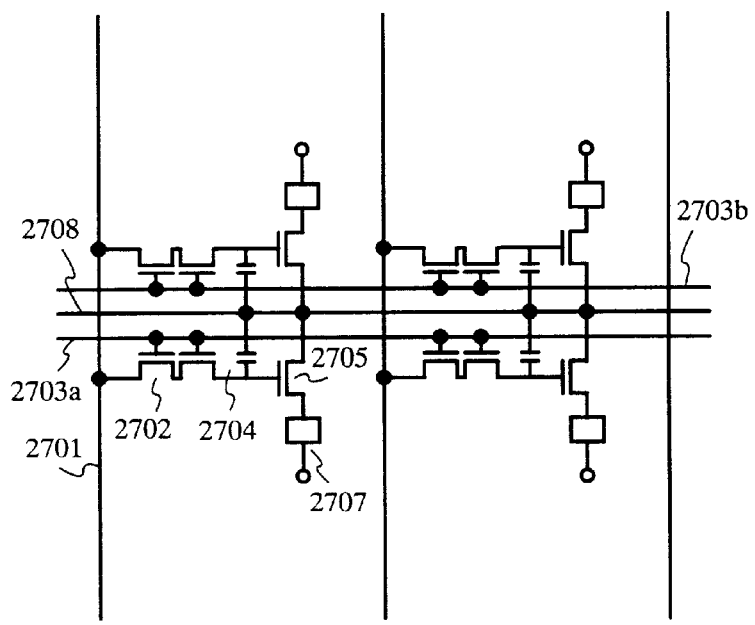

FIG. 30C shows an example characterized in that a current supply line 2708 is provided in parallel with gate wirings 2703a and 2703b similarly to the structure of FIG. 30B, and further, two pixels are formed to become axisymmetric with respect to the current supply line 2708. It is also effective to provide the current supply line 2708 in such a manner that it overlaps with either one of the gate wirings 2703a and 2703b. In this case, since the number of power supply lines can be reduced, the pixel portion can be made further fine. Incidentally, the structure of this embodiment can be freely combined with the structure of the embodiment 10 or 11. It is effective to use the EL display panel having the pixel structure of this embodiment as the display portion of the electronic equipment of the embodiment 7.

Embodiment 13

Although the embodiment 10 shown in FIGS. 29A and 29B has such a structure that the capacitor 2404 for holding a voltage applied to the gate of the current controlling TFT 2403 is provided, the capacitor 2404 can be omitted.

In the case of the embodiment 10, since the n-channel TFT of the present invention as shown in FIG. 28A is used for the current controlling TFT 2403, the TFT includes an LDD region provided to overlap with a gate electrode through a gate insulating film. Although parasitic capacitance generally called gate capacitance is formed in this overlapping region, this embodiment is characterized in that this parasitic capacitance is positively used as a substitution of the capacitor 2404.

Since the capacitance of this parasitic capacitance is changed by an area where the gate electrode overlaps with the LDD region, it is determined by the length of the LDD region contained in the overlapping region. Also in the structures of FIGS. 30A, 30B and 30C, the capacitor 2705 can be omitted similarly. Incidentally, the structure of this embodiment can be freely combined with the structure of the embodiments 1 to 4 and 9. It is effective to use the EL display panel having the pixel structure of this embodiment as the display portion of the electronic equipment of the embodiment 7.

As described above, in a semiconductor device including an active layer of a semiconductor film formed on a substrate, stress balance is considered among the semiconductor film, a first insulating layer provided at a substrate side with respect to the semiconductor film, and a second insulating layer provided at a side opposite to the substrate side, so that it is possible to decrease distortion in the active layer and at the interface between the active layer and the insulating layer, or generation of defects. As a result, a high field effect mobility can be obtained, and by improving resistance against stress due to heat or an electric field, a semiconductor device with high reliability can be realized.

What is claimed is:

1. A semiconductor device comprising:
    a semiconductor island being formed as an active layer over a substrate;
    a first insulating layer being formed between the substrate and the active layer,
    said first insulating layer including:
        a first silicon nitride oxide film having a first nitrogen concentration higher than a first oxygen concentration, and
        a second silicon nitride oxide film having a second nitrogen concentration lower than a second oxygen content; and
    a second insulating layer being formed in contact with a surface of the active layer at an opposite side to the substrate,
    said second insulating layer including:
        a plurality of third silicon nitride oxide films each having a third nitrogen concentration lower than a third oxygen concentration.

2. A device according to claim 1,
    wherein the active layer has a tensile stress,
    wherein the first silicon nitride oxide film of the first insulating film has a tensile stress, and
    wherein each of the plurality of third silicon nitride oxide films of the second insulating layer has a compressive stress.

3. A device according to claim 1,
    wherein the first nitrogen concentration of the first silicon nitride oxide film is not less than 25 atomic % and less than 50 atomic %, and
    wherein the third nitrogen concentration of each of the third silicon nitride oxide films is not less than 5 atomic % and less than 25 atomic %.

4. A device according to claim 1,
    wherein the semiconductor device is one selected from the group consisting of a liquid crystal display device, an EL display device, and an image sensor.

5. A device according to claim 1,
    wherein the semiconductor device is one selected from the group consisting of a portable telephone, a video camera, a portable information terminal, a head mount display, a projector, an electronic portable book, a personal computer, a DVD player, and a digital camera.

6. A semiconductor device comprising:
    a semiconductor island being formed as an active layer over a substrate;
    a first insulating layer being formed between the substrate and the active layer and including a first plurality of insulating films; and
    a second insulating layer being formed in contact with a surface of the active layer at an opposite side to the substrate and including a second plurality of insulating films;
    wherein the active layer has a tensile stress, and
    wherein at least one of the first plurality of insulating films of the first insulating layer has a tensile stress.

7. A device according to claim 6,
    wherein the first insulating layer comprises at least one selected from the group consisting of a silicon nitride film, a silicon oxide film, a silicon nitride oxide film, and a tantalum oxide film.

8. A device according to claim 6,
    wherein the second insulating layer comprises at least one selected from the group consisting of a silicon nitride film, a silicon oxide film, a silicon nitride oxide film, and a tantalum oxide film.

9. A device according to claim 6,
    wherein the semiconductor device is one selected from the group consisting of a liquid crystal display device, an EL display device, and an image sensor.

10. A device according to claim 6,
    wherein the semiconductor device is one selected from the group consisting of a portable telephone, a video camera, a portable information terminal, a head mount display, a projector, an electronic portable book, a personal computer, a DVD player, and a digital camera.

11. A semiconductor device comprising:
    a semiconductor island being formed as an active layer over a substrate;
    a first insulating layer being formed between the substrate and the active layer and including a first plurality of insulating films; and
    a second insulating layer being formed in contact with a surface of the active layer at an opposite side to the substrate side and including a second plurality of insulating films;
    wherein the active layer has a tensile stress, and
    wherein at least one of the second plurality of insulating films of the second insulating layer has a compressive stress.

12. A device according to claim 11,
    wherein the first insulating layer comprises at least one selected from the group consisting of a silicon nitride film, a silicon oxide film, a silicon nitride oxide film, and a tantalum oxide film.

13. A device according to claim 11,
    wherein the second insulating layer comprises at least one selected from the group consisting of a silicon nitride film, a silicon oxide film, a silicon nitride oxide film, and a tantalum oxide film.

14. A device according to claim 11,
    wherein the semiconductor device is one selected from the group consisting of a liquid crystal display device, an EL display device, and an image sensor.

15. A device according to claim 11,
    wherein the semiconductor device is one selected from the group consisting of a portable telephone, a video camera, a portable information terminal, a head mount display, a projector, an electronic portable book, a personal computer, a DVD player, and a digital camera.

16. A semiconductor device comprising:
    a semiconductor island being formed as an active layer over a substrate;

a first insulating layer being formed between the substrate and the active layer and including a first plurality of insulating films; and a second insulating layer being formed in contact with a surface of the active layer at an opposite side to the substrate and including a second plurality of insulating films;

wherein the active layer has a tensile stress, wherein at least one of the first plurality of insulating film of the first insulating layer has a tensile stress, and wherein at least one of the second plurality of insulating film of the second insulating layer has a compressive stress.

17. A device according to claim 16, wherein the first insulating layer comprises at least one selected from the group consisting of a silicon nitride film, a silicon oxide film, a silicon nitride oxide film, and a tantalum oxide film.

18. A device according to claim 16, wherein the second insulating layer comprises at least one selected from the group consisting of a silicon nitride film, a silicon oxide film, a silicon nitride oxide film, and a tantalum oxide film.

19. A device according to claim 16, wherein the semiconductor device is one selected from the group consisting of a liquid crystal display device, an EL display device, and an image sensor.

20. A device according to claim 16, wherein the semiconductor device is one selected from the group consisting of a portable telephone, a video camera, a portable information terminal, a head mount display, a projector, an electronic portable book, a personal computer, a DVD player, and a digital camera.

21. A semiconductor device comprising:

a semiconductor island being formed as an active layer over a substrate;

a first insulating layer being formed between the substrate and the active layer and including a first plurality of insulating films;

an electrode for applying a voltage to the active layer through the first insulating layer; and a second insulating layer being formed in contact with a surface of the active layer at an opposite side to the substrate and including a second plurality of insulating films;

wherein the active layer has a tensile stress, wherein at least one of the first plurality of insulating films of the first insulating layer has a tensile stress, and wherein at least one of the second plurality of insulating films of the second insulating layer has a compressive stress.

22. A device according to claim 21, wherein the first insulating layer comprises at least one selected from the group consisting of a silicon nitride film, a silicon oxide film, a silicon nitride oxide film, and a tantalum oxide film.

23. A device according to claim 21, wherein the second insulating layer comprises at least one selected from the group consisting of a silicon nitride film, a silicon oxide film, a silicon nitride oxide film, and a tantalum oxide film.

24. A device according to claim 21, wherein the semiconductor device is one selected from the group consisting of a liquid crystal display device, an EL display device, and an image sensor.

25. A device according to claim 21, wherein the semiconductor device is one selected from the group consisting of a portable telephone, a video camera, a portable information terminal, a head mount display, a projector, an electronic portable book, a personal computer, a DVD player, and a digital camera.

26. A semiconductor device comprising:

a semiconductor island being formed as an active layer over a substrate;

a first insulating layer being formed between the substrate and the active layer and including a first plurality of insulating films;

a second insulating layer being formed in contact with a surface of the active layer at an opposite side to the substrate including a second plurality of insulating films;

an insulating film of the second insulating layer being in contact with the active layer; and an electrode for applying a voltage to the active layer through the insulating film of the second insulating layer;

wherein the active layer has a tensile stress, wherein at least one of the first plurality of insulating films of the first insulating layer has a tensile stress, and wherein at least one of the second plurality of insulating films of the second insulating layer has a compressive stress.

27. A device according to claim 26, wherein the first insulating layer comprises at least one selected from the group consisting of a silicon nitride film, a silicon oxide film, a silicon nitride oxide film, and a tantalum oxide film.

28. A device according to claim 26, wherein the second insulating layer comprises at least one selected from the group consisting of a silicon nitride film, a silicon oxide film, a silicon nitride oxide film, and a tantalum oxide film.

29. A device according to claim 26, wherein the semiconductor device is one selected from the group consisting of a liquid crystal display device, an EL display device, and an image sensor.

30. A device according to claim 26, wherein the semiconductor device is one selected from the group consisting of a portable telephone, a video camera, a portable information terminal, a head mount display, a projector, an electronic portable book, a personal computer, a DVD player, and a digital camera.

31. A semiconductor device comprising at least a thin film transistor, said thin film transistor including:

a first silicon nitride oxide film including nitrogen at a first concentration and being formed on an insulating surface;

a second silicon nitride oxide film including nitrogen at a second concentration and being formed on the first silicon nitride oxide film;

a crystalline semiconductor island being formed on the second silicon nitride oxide film;

a gate insulating film comprising a third silicon nitride oxide film including nitrogen at a third concentration and being formed on the crystalline semiconductor island;

a gate electrode being formed over the crystalline semiconductor island with the gate insulating film therebetween;

an interlayer insulating film being formed on the gate electrode and the gate insulating film, wherein the first concentration is higher than each of the second and third concentrations, wherein the first silicon nitride oxide film has a tensile stress while each of the second silicon nitride oxide film and the interlayer insulating film has a compressive stress.

32. A device according to claim 31, wherein the semiconductor device is one selected from the group consisting of a liquid crystal display device, an EL display device, and an image sensor.

33. A device according to claim 31, wherein the semiconductor device is one selected from the group consisting of a portable telephone, a video camera, a portable information terminal, a head mount display, a projector, an electronic portable book, a personal computer, a DVD player, and a digital camera.

34. A device according to claim 31, wherein the first concentration is not less than 25 atomic % and less than 50 atomic %, while each of the second and third concentration is not less than 5 atomic % and less than 25 atomic %.

35. A device according to claim 31, wherein the semiconductor island includes a source region, a drain region, a channel region and a pair of LDD regions, wherein each of the LDD regions includes a first portion which is overlapped with the gate electrode with the gate insulating film therebetween and a second portion which is not overlapped with the gate electrode.

* * * * *